(12) United States Patent
Watanabe et al.

(10) Patent No.: US 9,087,982 B2
(45) Date of Patent: Jul. 21, 2015

(54) MANUFACTURING METHOD FOR PATTERN MULTILAYER BODY AND MASK SET

(71) Applicant: TDK Corporation, Tokyo (JP)

(72) Inventors: Hisayoshi Watanabe, Tokyo (JP); Ken Fujii, Tokyo (JP); Takayuki Nishizawa, Tokyo (JP); Masachika Hashino, Tokyo (JP)

(73) Assignee: TDK Corporation, Tokyo (JP)

( * ) Notice: Subject to any disclaimer, the term of this patent is extended or adjusted under 35 U.S.C. 154(b) by 72 days.

(21) Appl. No.: 14/082,249

(22) Filed: Nov. 18, 2013

(65) Prior Publication Data

US 2015/0140685 A1    May 21, 2015

(51) Int. Cl.
| | |
|---|---|
| *H01L 21/312* | (2006.01) |
| *H01L 43/12* | (2006.01) |
| *H01L 43/08* | (2006.01) |
| *G03F 1/00* | (2012.01) |
| *H01L 21/027* | (2006.01) |

(52) U.S. Cl.
CPC ........ *H01L 43/12* (2013.01); *G03F 1/00* (2013.01); *H01L 21/0274* (2013.01); *H01L 21/312* (2013.01); *H01L 43/08* (2013.01)

(58) Field of Classification Search
CPC .................................................. H01L 21/02225
See application file for complete search history.

(56) References Cited

U.S. PATENT DOCUMENTS

| | | |
|---|---|---|
| 2003/0002043 A1 | 1/2003 | Abdulhalim et al. |
| 2011/0216432 A1 | 9/2011 | Yanagisawa |

FOREIGN PATENT DOCUMENTS

| | | |
|---|---|---|
| JP | 2000-021754 A | 1/2000 |
| JP | 2002-157710 A | 5/2002 |
| JP | 2008-085007 A | 4/2008 |

*Primary Examiner* — Cheung Lee
(74) *Attorney, Agent, or Firm* — Posz Law Group, PLC

(57) ABSTRACT

A method for manufacturing a pattern multilayer body that has a plurality of pattern layers, and where a pattern is formed in each pattern layer, includes a step of forming an overlay pattern within an overlay pattern formation region, and in the step of forming the overlay pattern, a photoresist film is formed, and after a photoresist film is exposed via a main mask, a resist pattern is formed by exposing a sub mask(s). The main mask has a pattern light-shielding part that is commonly used for forming a pattern in each pattern layer, and each main light-shielding part for forming each overlay pattern; and a sub mask has an opening part that is exposable to an unexposed region(s) within an overlay pattern formation region other than an unexposed region(s) on the photoresist film, which has been light-shielded by the main light-shielding part for forming a corresponding overlay pattern.

10 Claims, 34 Drawing Sheets

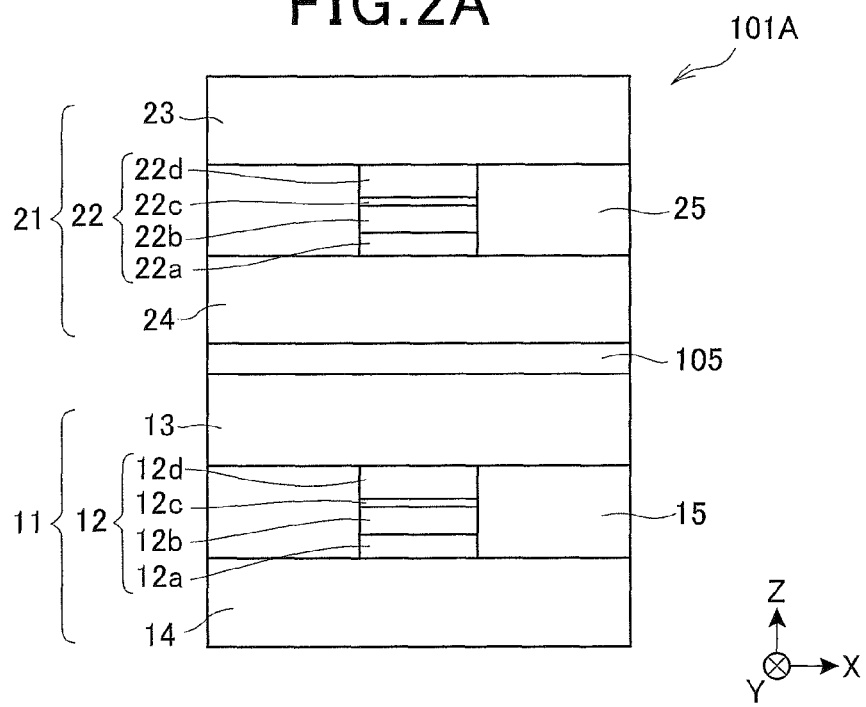
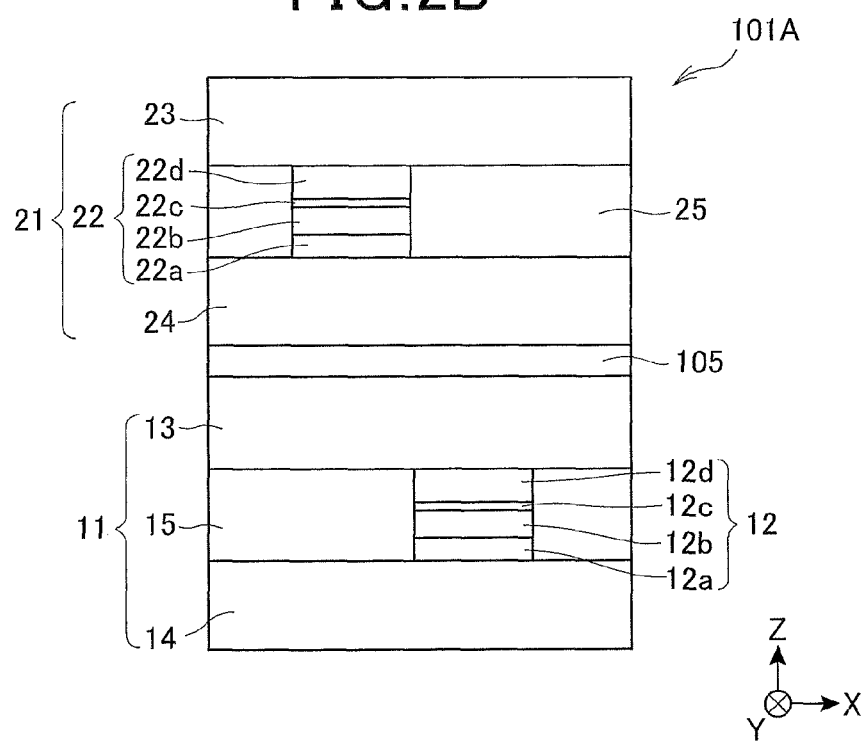

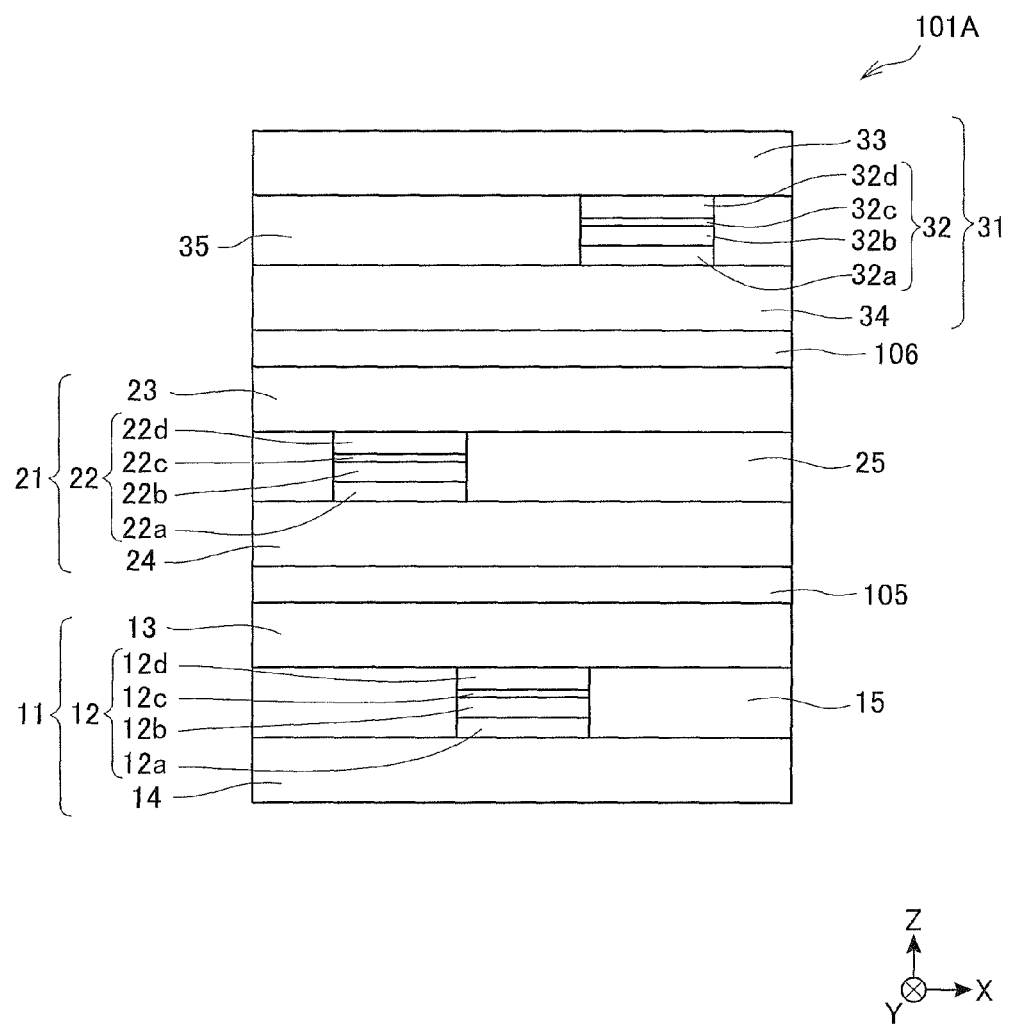

MANUFACTURING METHOD FOR PATTERN MULTILAYER BODY AND MASK SET

BACKGROUND OF THE INVENTION

1. Field of the Invention

The present invention relates to a method for manufacturing a pattern multilayer body in which a plurality of pattern layers are laminated, and a mask set for forming a pattern in each pattern layer in the pattern multilayer body.

2. Description of the Related Art

Recently, in conjunction with the high recording density of hard disk drives (HDD), there is a demand for improvement in the performance of thin film magnetic heads. As the thin film magnetic head, composite type thin film magnetic heads having a configuration in which a reproducing head having a read-only magnetoresistive effect element (MR element) and a recording head having a write-only induction-type magnetic transduction element are laminated are widely used. In particular, in conjunction with higher recording densities of hard disk drives, a thin film magnetic head having a reproducing head where a plurality of MR elements with the same configuration are arranged along a lamination direction has been proposed. Conventionally, a reproducing head for a magnetic tape in which a plurality of MR elements are arranged along a lamination direction is known (JP Patent Application No. 2002-157710).

In such a pattern multilayer body where a plurality of pattern layers, such as thin film magnetic heads, are laminated, a position gap in a direction that is orthogonal to the lamination direction between the element patterns of each pattern layer respectively affects its quality. Consequently, when the pattern multilayer body above is manufactured, an overlay pattern and the element pattern are formed at the same time, and the position gap between the element patterns of each pattern layer is measured by measuring a position gap in a direction orthogonal to the lamination direction using the overlay pattern.

Conventionally, the pattern multilayer body having the element pattern in each pattern layer is manufactured as discussed below. Furthermore, a method for manufacturing a thin film magnetic head having a reproducing head where a plurality of MR elements are arranged in the lamination direction is explained below as an example. FIGS. 19A to 19C are cross-sectional views schematically showing each step of a conventional method for manufacturing a reproducing head. Furthermore, in FIGS. 19A to 19C, fabrication steps of a reproducing head are shown on the left side, and fabrication steps of an overlay pattern are shown on the right side.

First, an insulation layer 1030, such as $Al_2O_3$ or $SiO_2$, and a first lower part shield layer 140 are formed within an MR element formation region on a substrate 1100, and the insulation layer 1030 is laminated onto an overlay pattern formation region. Then, a first MR element layer 1210, such as metal, and a positive-type photoresist film 400 are lamination-formed on the first lower part shield layer 140 and the insulation layer 1030 in respective order and the positive-type photoresist film 400 is exposed using a first mask 301 (see FIG. 19A).

The first mask 301 has a light shielding part 3011 corresponding to a resist pattern for forming a magnetoresistive effect part (MR part) 120 of the first MR element and a light shielding part 3012 corresponding to a resist pattern for forming a first overlay pattern 1211.

After the exposure via the first mask 301, a resist pattern is formed on the first MR element layer 1210 by development using a predetermined developing solution and the like, and the MR part 120 of the first MR element and the first overlay pattern 1211 are formed by applying a milling treatment using the resist pattern as a mask (see FIG. 19B). Furthermore, a nearly-rectangular frame-state pattern is shown as the first overlay pattern 1211.

Next, side shield layers 150 are formed on both sides of the MR part 120, and a first upper part shield layer 130, an intermediate layer 1050 and a second lower part shield layer 240 are formed on them in respective order, and an insulation layer 1070, such as $Al_2O_3$ or $SiO_2$, to coat the first overlay pattern 1211 is formed at the same time. Then, a second MR element layer 2210, such as metal, is formed on the second lower part shield layer 240, and a positive-type photoresist film 500 is formed on the upper layer of the second MR element layer 2210 and the insulation layer 1050. Furthermore, since light does not penetrate the metal and the like forming the second MR element layer 2210, the second MR element layer 2210 is not formed on the insulation layer 1050. Then, the positive-type photoresist film 500 is exposed using a second mask 302 (see FIG. 19C).

The second mask 302 has a light shielding part 3021 corresponding to a resist pattern for forming a magnetoresistive effect part (MR part) 220 of the second MR element, and a light shielding part 3022 corresponding to a resist pattern as a second overlay pattern.

Then, after the exposure via the second mask 302, development using a predetermined developing solution and the like is conducted, a resist pattern is formed on the second element layer 2210, and a second overlay pattern (a resist pattern) is formed on the insulation layer 1070. Furthermore, as the second overlay pattern, a nearly-rectangular pattern positioned within the first overlay pattern 1211, which is in a nearly-rectangular state in a planar view, is shown. The first overlay pattern 1211 and the second overlay pattern are overlay patterns referred to as a so-called box-in-box type, respectively.

A position gap between the two overlay patterns can be measured by detecting the first overlay pattern 1211 and the second overlay pattern formed as mentioned above from the upper side in the lamination direction. The position gap distance between the overlay patterns is evaluated as the position gap distance between the MR part 120 of the first MR element and the MR part 220 of the second MR element.

In the manufacturing method above, in order to form the first overlay pattern 1211 and the second overlay pattern, two different masks (the first mask 301 and the second mask 302) are used. In each of the masks 301 and 302, a manufacturing error regarding the positions of the light shielding parts 3012 and 3022 may be caused. Consequently, the position gap measurement accuracy between the first overlay pattern 1211 and the second overlay pattern is affected not only by alignment accuracy upon exposure using these two different masks (the first mask 301 and the second mask 302), respectively, but also by a manufacturing error between the two masks 301 and 302. In other words, even if the alignment upon the exposure of the two masks 301 and 302 above is performed with high accuracy, the position gap measurement accuracy between the first overlay pattern 1211 and the second overlay pattern is decreased due to the manufacturing error above. In association with this, the position gap measurement accuracy between the MR parts 120 and 220 of the first and second MR elements is decreased.

In response to the high recording densitys of hard disk drives, at present, positional accuracy between element patterns of each pattern layer in the pattern multilayer body, such as a thin film magnetic head, is now more strictly in demand than before. In the meantime, a decrease in position gap measurement accuracy based upon a manufacturing error between/among a plurality of masks that are used for forming the overlay patterns has been becoming a problem.

Also, in a manufacturing process of a nonvolatile semiconductor memory element and the like having a floating gate, even in the pattern multilayer body that is manufactured by conducting patterning steps a plurality of times using a plurality of masks having the same light shielding pattern, the reduction in the position gap measurement accuracy based upon a manufacturing error between/among a plurality of masks is a problem.

SUMMARY OF THE INVENTION

The objective of the present invention is to provide a manufacturing method for a pattern multilayer body where an overlay pattern having high position gap measurement accuracy in a direction that is orthogonal to the lamination direction is capable of being formed, and a mask set that can form an overlay pattern having high position gap measurement accuracy in a direction orthogonal to the lamination direction.

In order to accomplish the objective above, the present invention provides a method for manufacturing a pattern multilayer body A method for manufacturing a pattern multilayer body where first to $N^{th}$ pattern layers (N is an integer of two or greater) are laminated within a pattern formation region on a substrate in respective order, and where a pattern is formed in the pattern layers, respectively, comprising:

a step of forming a pattern in the first to $N^{th}$ pattern layers (N is an integer of two or greater) on the substrate, respectively, and of forming first to $N^{th}$ overlay patterns that are used for measuring a position gap in a direction orthogonal to a lamination direction between/among patterns of each pattern layer, within the overlay pattern formation region on the substrate;

a step of forming a pattern in an $M^{th}$ pattern layer (M is an integer between 1 and N), and of forming an $M^{th}$ overlay pattern within the overlay pattern formation region comprising:

a resist film formation step of forming an $M^{th}$ photoresist film on the $M^{th}$ pattern layer and within the overlay pattern formation region, a first exposure step of exposing the $M^{th}$ photoresist film via a main mask, a second exposure step of exposing the exposed $M^{th}$ photoresist film via an $M^{th}$ sub mask, and a resist pattern formation step of developing the $M^{th}$ photoresist film, and of forming an $M^{th}$ resist pattern on the $M^{th}$ pattern layer and within the overlay pattern formation region, respectively, wherein the main mask comprises:

a pattern light-shielding part that is commonly used for forming a pattern in the first to $N^{th}$ pattern layers, respectively, and first to $N^{th}$ main light-shielding parts for forming the first to $N^{th}$ overlay patterns, respectively; and the $M^{th}$ sub mask comprises:

a light-shielding part to shield an exposure light reaching to an unexposed region(s) on the $M^{th}$ photoresist film, which has been light-shielded by the pattern light-shielding part, an opening part where an exposure light reaching to an unexposed region(s) on the $M^{th}$ photoresist film within the overlay pattern formation region other than the unexposed region(s) on the $M^{th}$ photoresist film, which has been light-shielded by the $M^{th}$ main light-shielding part out of the first to $N^{th}$ main light-shielding parts, is permeable and a sub light-shielding part that light-shields an exposure light reaching to an unexposed region(s) on the $M^{th}$ photoresist film, which has been light-shielded by the $M^{th}$ main light-shielding part (Invention 1).

Furthermore, "to form an $M^{th}$ overlay pattern" in the present invention is an intended meaning, other than the formation of a resist pattern corresponding to the $M^{th}$ overlay pattern on a predetermined layer and the formation of the $M^{th}$ overlay pattern by processing the layer using the resist pattern as a mask, to include the formation of a resist pattern as the $M^{th}$ overlay patter on the layer, as well.

In the invention above (Invention 1), it is preferable to form the first overlay pattern by processing a layer under the first photoresist film within the overlay pattern formation region using the first resist pattern that is formed in the resist pattern formation step as a mask, and to measure a position gap between patterns of each pattern layer in a direction that is orthogonal to the lamination direction between the second to $N^{th}$ resist patterns and the first overlay pattern, respectively, using the second to the $N^{th}$ resist patterns as the second to the $N^{th}$ overlay patterns, respectively (Invention 2).

In the invention above (Invention 1), it is preferable to measure a position gap in a direction that is orthogonal to the lamination direction between a $K^{th}$ overlay pattern (K is an integer between 1 and N−1) and a $(K+1)^{th}$ overlay pattern (Invention 3).

In the invention above (Invention 1), it is preferable that the pattern multilayer body comprises the first pattern layer and the second pattern layer;

a step of forming a pattern in the first pattern layer, and of forming the first overlay pattern within the overlay pattern formation region comprises:

a resist film formation step of forming the first photoresist film on the first pattern layer and within the overlay pattern formation region, a first exposure step of exposing the first photoresist film via the main mask, a second exposure step of exposing the exposed first photoresist film via the first sub mask, and a resist pattern formation step of developing the first photoresist film, and of forming the first resist pattern on the first pattern layer and within the overlay pattern formation region;

a step of forming a pattern in the second pattern layer, and of forming the second overlay pattern within the overlay pattern formation region comprises:

a resist film formation step of forming the second photoresist film on the second pattern layer and within the overlay pattern formation region, a first exposure step of exposing the second photoresist film via the main mask, a second exposure step of exposing the exposed second photoresist film via the second sub mask, and a resist pattern formation step of developing the second photoresist film, and of forming the second resist pattern on the second pattern layer and within the overlay pattern formation region, respectively;

the main mask comprises:

the pattern light-shielding part that is commonly used for forming a pattern in the first pattern layer and the second pattern layer, respectively, and the first and second main light-shielding parts for forming the first and second overlay patterns, respectively;

the first sub mask comprises:

a light-shielding part that shields an exposure light reaching to an unexposed region(s) on the first photoresist film, which has been light-shielded by the pattern light-shielding part, an opening part where an exposure light reaching to an unexposed region(s) on the first photoresist film, which has been light-shielded by the second main light-shielding part, is permeable, and a sub light-shielding part that shields an exposure light reaching to an unexposed region(s) on the first photoresist film, which has been light-shielded by the first main light-shielding part; and the second sub mask comprises:
a light-shielding part that shields an exposure light reaching to an unexposed region(s) on the second photoresist film, which has been light-shielded by the pattern light-shielding part,
an opening part where an exposure light reaching to an unexposed region(s) on the second photoresist film, which has been light-shielded by the first main light-shielding part, is permeable, and
a sub light-shielding part that shields an exposure light reaching to an unexposed region(s) on the second photoresist film, which has been light-shielded by the second main light-shielding part (Invention 4).

In the invention above (Invention 1), it is preferable that the pattern multilayer body comprises the first to third pattern layers;

a step of forming a pattern in the first pattern layer, and of forming the first overlay pattern within the overlay pattern formation region comprises:
a resist formation step of forming the first photoresist film on the first pattern layer and within the overlay pattern formation region,
a first exposure step of exposing the first photoresist film via the main mask,
a second exposure step of exposing the exposed first photoresist film via the first sub mask, and
a resist pattern formation step of developing the first photoresist film, and of forming the first resist pattern on the first pattern layer and within the overlay pattern formation region, respectively;

a step of forming a pattern in the second pattern layer, and of forming the second overlay pattern within the overlay pattern formation region comprises:
a resist film formation step of forming the second photoresist film on the second pattern layer and within the overlay pattern formation region,
a first exposure step of exposing the second photoresist film via the main mask,
a second exposure step of exposing the exposed second photoresist film via the second sub mask, and
a resist pattern formation step of developing the second photoresist film, and of forming the second resist pattern on the second pattern layer and within the overlay pattern formation region;

a step of forming a pattern in the third pattern layer, and of forming the third overlay pattern within the overlay pattern formation region comprises:
a resist film formation step of forming the third photoresist film on the third pattern layer and within the overlay pattern formation region,
a first exposure step of exposing the third photoresist film via the main mask,
a second exposure step of exposing the exposed third photoresist film via the third sub mask, and
a resist pattern formation step of developing the third photoresist film, and of forming the third resist pattern on the third pattern layer and within the overlay pattern formation region;

the main mask comprises:
the pattern light-shielding part that is commonly used for foiniing a pattern in the first to third pattern layers, respectively,
the first main light-shielding part for forming the first overlay pattern,
the second main light-shielding part for forming the second overlay pattern,
the third main light-shielding part for forming the third overlay pattern; the first sub mask comprises:
a light-shielding part that shields an exposure light reaching to an unexposed region(s) on the first photoresist film, which has been light-shielded by the pattern light-shielding part,
an opening part where an exposure light reaching to an unexposed region(s) on the first photoresist film, which has been light-shielded by the second and third main light-shielding parts, is permeable, and
a sub light-shielding part that shields an exposure light reaching to an unexposed region(s) on the first photoresist film, which has been light-shielded by the first main light-shielding part;

the second sub mask comprises:
a light-shielding part that shields an exposure light reaching to an unexposed region(s) on the second photoresist film, which has been light-shielded by the pattern light-shielding part,
an opening part where an exposure light reaching to an unexposed region(s) on the second photoresist film, which has been light-shielded by the first main light-shielding part, is permeable, and
a sub light-shielding part that shields an exposure light reaching to an unexposed region(s) on the second photoresist film, which has been light-shielded by the second main light-shielding part;

the third sub mask comprises:
a light-shielding part that shields an exposure light reaching to an unexposed region(s) on the third photoresist film, which has been light-shielded by the pattern light-shielding part,
an opening part where an exposure light reaching to an unexposed region(s) on the third photoresist film, which has been light-shielded by the first main light-shielding part, is permeable, and
a sub light-shielding part that shields an exposure light reaching to an unexposed region(s) on the third photoresist film, which has been light-shielded by the third main light-shielding part; and
the second main light-shielding part and the third main light-shielding part of the main mask are the same light-shielding part (Invention 5).

In the invention (Invention 5), in the second exposure step to form a pattern in the third pattern layer, and to form the third overlay pattern in the overlay pattern formation region, it is preferable to use the second sub mask as the third sub mask (Invention 6).

In the invention above (Invention 1), it is preferable that
a. the pattern multilayer body comprises the first to third pattern layers;
the overlay pattern formation region includes a first region and a second region;
a step of forming a pattern in the first pattern layer, and of forming the first overlay pattern within the overlay pattern formation region comprises:
a resist film formation step of forming the first photoresist film on the first pattern layer and within the first and second regions, respectively, a first exposure step of exposing the first photoresist film via the main mask, a second exposure step of exposing the exposed first photoresist film via the first sub mask, and a resist pattern formation step of developing the first photoresist film, and of forming the first resist pattern on the first pattern layer and within the first and second regions, respectively;

a step of forming a pattern in the second pattern layer, and of forming the second overlay pattern within the overlay pattern formation region comprises:

a resist film formation step of forming the second photoresist film on the second pattern layer and within the first and second regions, respectively, a first exposure step of exposing the second photoresist film via the main mask, a second exposure step of exposing the exposed second photoresist film via the second sub mask, and a resist pattern formation step of developing the second photoresist film, and of forming the second resist pattern on the second pattern layer and within the first region, respectively;

a step of forming a pattern in the third pattern layer, and of forming the third overlay pattern within the overlay pattern formation region comprises:

a resist film formation step of forming the third photoresist film on the third pattern layer and the first and second regions, a first exposure step of exposing the third photoresist film via the main mask, a second exposure step of exposing the third photoresist film via the third sub mask, and a resist pattern formation step of developing the third photoresist film, and of forming the third resist pattern on the third pattern layer and within the second region;

the main mask comprises:

the pattern light-shielding part that is commonly used for forming a pattern in the first to third pattern layers, respectively, the first main light-shielding part for forming the first overlay pattern within the first and second regions, the second main light-shielding part for forming the second overlay pattern within the first region; and the third main light-shielding part for forming the third overlay pattern within the second region;

the first sub mask comprises:

a light-shielding part that shields an exposure light reaching to an unexposed region(s) on the first photoresist film, which has been light-shielded by the pattern light-shielding part, an opening part where an exposure light reaching to an unexposed region(s) on the first photoresist film, which has been light-shielded by the second and third main light-shielding parts, is permeable, and a sub light-shielding part that shields an exposure light reaching to an unexposed region(s) on the first photoresist film, which has been light-shielded by the first main light-shielding part;

the second sub mask comprises:

a light-shielding part that shields an exposure light reaching to an unexposed region(s) on the second photoresist film, which has been light-shielded by the pattern light-shielding part, an opening part where an exposure light reaching to an unexposed region(s) on the second photoresist film, which has been light-shielded by the first main light-shielding part, is permeable, and a sub light-shielding part that shields an exposure light reaching to an unexposed region(s) on the second photoresist film, which has been light-shielded by the second main light-shielding part; and the third sub mask comprises:

a light-shielding part that shields an exposure light reaching to an unexposed region(s) on the third photoresist film, which has been light-shielded by the pattern light-shielding part, an opening part where an exposure light reaching to an unexposed region(s) on the third photoresist film, which has been light-shielded by the first main light-shielding part, is permeable, and a sub light-shielding part that shields an exposure light reaching to an unexposed region(s) on the third photoresist film, which has been light-shielded by the third main light-shielding part (Invention 7).

In the invention above (Invention 1), it is preferable that the pattern multilayer body comprises the first to third pattern layers;

the overlay pattern formation region includes a first region and a second region;

a step of forming a pattern in the first pattern layer, and of forming the first overlay pattern within the overlay pattern formation region comprises:

a resist film formation step of forming the first photoresist film on the first pattern layer and within the first and second regions, a first exposure step of exposing the first photoresist film via the main mask, a second exposure step of exposing the exposed first photoresist film via the first sub mask, and a resist pattern formation step of developing the first photoresist film, and of forming the first resist pattern on the first pattern layer and within the first region, respectively, a step of forming a pattern in the second pattern layer, and of forming the second overlay pattern within the overlay pattern formation region comprises:

a resist film formation step of forming the second photoresist film on the second pattern layer and within the first and second regions, a first exposure step of exposing the second photoresist via the main mask, a second exposure step of exposing the exposed second photoresist film via the second sub mask, and a resist pattern formation step of developing the second photoresist film, and of forming the second resist pattern on the second pattern layer and within the first and second regions, respectively;

a step of forming a pattern in the third pattern layer, and of forming the third overlay pattern within the overlay pattern formation region comprises:

a resist film formation step of forming the third photoresist film on the third pattern layer and within the first and second regions, a first exposure step of exposing the third photoresist film via the main mask, a second exposure step of exposing the exposed third photoresist film via the third sub mask, and a resist pattern formation step of developing the third photoresist film, and of forming the third resist pattern on the third pattern layer and within the second region;

the main mask comprises:

the pattern light-shielding part that is commonly used for forming a pattern in the first to third pattern layers, respectively, the first main light-shielding part for forming the first overlay pattern within the first region, the second main light-shielding part for forming the second overlay pattern within the first and second regions, and the third main light-shielding part for forming the third overlay pattern within the second region;

the first sub mask comprises:

a light-shielding part that shields an exposure light reaching to an unexposed region(s) on the first photoresist film, which has been light-shielded by the pattern light-shielding part, an opening part where an exposure light reaching to an unexposed region(s) on the first photoresist film, which has been light-shielded by the second and third main light-shielding parts, is permeable, and a sub light-shielding part that shields an exposure light reaching to an unexposed region(s) on the first photoresist film, which has been light-shielded by the first main light-shielding part;

the second sub mask comprises:

a light-shielding part that shields an exposure light reaching to an unexposed region(s) on the second photoresist film, which has been light-shielded by the pattern light-shielding part, an opening part where an exposure light reaching to an unexposed region(s) on the second photoresist film, which has been light-shielded by the first and third main light-shielding parts, is permeable, and a sub light-shielding part that shields an exposure light reaching to an unexposed region(s) on the second photoresist film, which has been light-shielded by the second main light-shielding part; and the third sub mask comprises:

a light-shielding part that shields an exposure light reaching to an unexposed region(s) on the third photoresist film, which has been light-shielded by the pattern light-shielding part, an opening part where an exposure light reaching to an unexposed region(s) on the third photoresist film, which has been light-shielded by the second main light-shielding part, is permeable, and a sub light-shielding part that shields an exposure light reaching to an unexposed region(s) on the third photoresist film, which has been light-shielded by the third main light-shielding part (Invention 8).

In the invention above (Invention 1), it is preferable that the pattern multilayer body is a thin film magnetic head where the first to $N^{th}$ MR elements are formed in the first to $N^{th}$ pattern layers, respectively, and each of the MR elements is arranged along the lamination direction (Invention 9).

Also, the present invention provides a mask set where first to $N^{th}$ patterns (N is an integer of two or greater) are laminated in respective order, and that is used for manufacturing a pattern multilayer body having a pattern in each of the pattern layers, comprising:

a main mask that comprises a pattern light-shielding part that is commonly used for forming the pattern in each of the pattern layers, and first to $N^{th}$ main light-shielding parts that are used for forming first to $N^{th}$ overlay patterns for position gap measurement in a direction orthogonal to the lamination direction between/among patterns of the pattern layers, and first to $N^{th}$ sub masks, wherein an $M^{th}$ sub mask (M is an integer between 1 and N) out of the first to $N^{th}$ sub masks comprises:

a light-shielding part corresponding to the pattern light-shielding part of the main mask, an opening part corresponding to a light-shielding part other than the $M^{th}$ main light-shielding part of the main mask, and an $M^{th}$ sub light-shielding part corresponding to the $M^{th}$ main light-shielding part (Invention 10).

According to the present invention, the manufacturing method for a pattern multilayer body having overlay patterns with high position gap measurement accuracy in a direction that is orthogonal to the lamination direction, and a mask set that can form an overlay pattern with high position gap measurement accuracy in a direction that is orthogonal to the lamination direction can be provided.

BRIEF DESCRIPTION OF THE DRAWINGS

FIGS. 2A and 2B are plan views showing one configuration example of a reproducing head part of the thin film magnetic head in one embodiment of the present invention in a pattern manner, viewed from an air bearing surface (ABS) side.

FIGS. 3A and 3B are plan views showing another configuration example of a reproducing head part of the thin film magnetic head in one embodiment of the present invention in a pattern manner, viewed from an air bearing surface (ABS) side.

DESCRIPTION OF THE PREFERRED EMBODIMENTS

Prior to explanation of the embodiments of the present invention, terms that are used in the present specification are defined. In the present specification, when the X-axis, the Y-axis and the Z-axis are indicated in each diagram, a dimension in the X-axis direction, a dimension in the Y-axis direction and a dimension in the Z-axis direction are noted as "width," "length" and "thickness," respectively. Also, a side that is closer to an air bearing surface (ABS: a surface of a thin film magnetic head facing toward a recording medium) out of the Y-axis direction is noted as "forward" and its opposite side (back side) is noted as "backward." In addition, in the lamination structure of an element or an element structure, viewed from a reference layer or an element, a substrate direction is referred to as "downward" or "down side," and its opposite direction is referred to as "upward" or "upper side."

[Thin Film Magnetic Head]

First, a configuration example of the thin film magnetic head as one example of the pattern multilayer body that is manufactured according to the embodiment of the present invention is explained with reference to the drawings.

Figure 1:
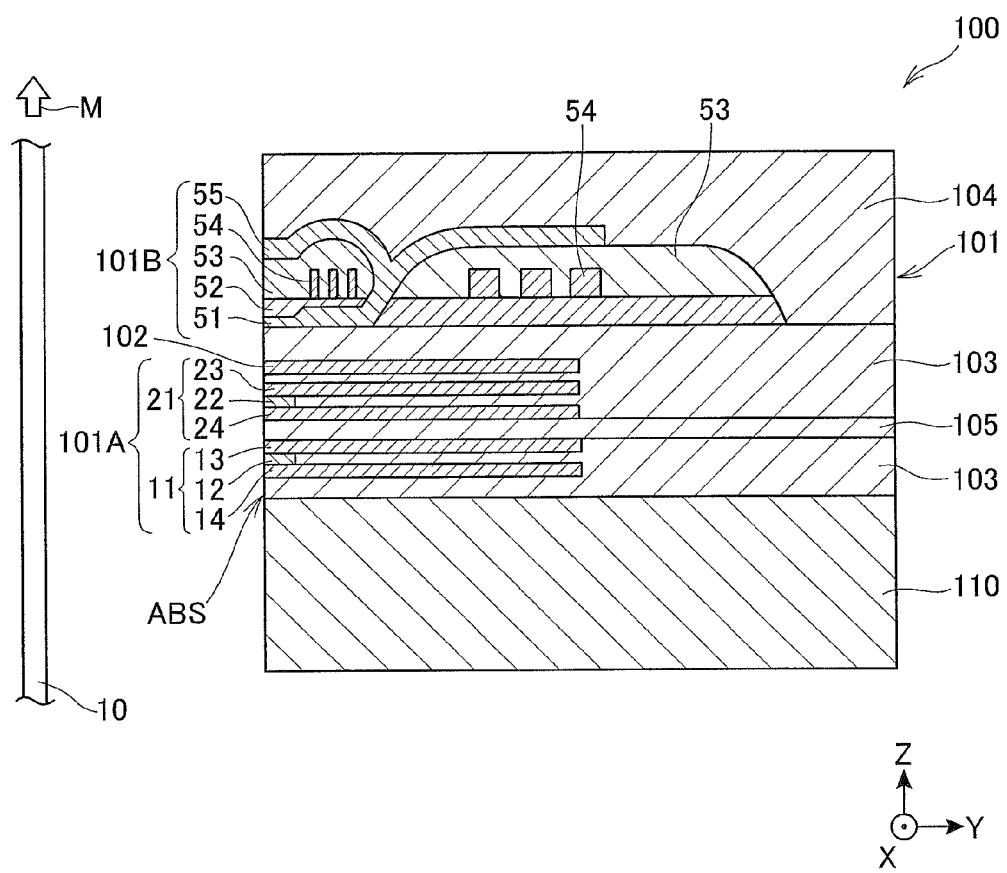
FIG. 1 is a cross-sectional view on a plane that is orthogonal to ABS schematically showing the configuration of a thin film magnetic head in one embodiment of the present invention.

FIG. 1 is a cross-sectional view that is orthogonal to the ABS (a cross-sectional view in the YZ plane) showing a schematic configuration of the thin film magnetic head in the present embodiment.

A thin film magnetic head 100 in the present embodiment is mounted in a magnetic recording device, such as a hard disk drive, for applying a magnetic process to a recording medium 10, such as a hard disk, that moves in a medium travel direction M.

The thin film magnetic head 100 shown in FIG. 1 is a so-called composite type head where both a recording process and reproducing process are executable as the magnetic process. The thin film magnetic head 100 is configured such that a magnetic head part 101 is formed on a slider substrate 110 made of a ceramic material, such as AlTiC ($Al_2O_3 \cdot TiC$).

A magnetic head part 101 has a configuration where a reproducing head part 101A that performs reproducing process of recorded magnetic information by utilizing a magneto-resistive (MR) effect and a shield-type recording head part 101B that executes a perpendicular recording system of the recording process are laminated in respective order.

The reproducing head part 101A has a configuration where a first MR element 11 and a second MR element 21 having a lamination structure, where lower part shield layers 14 and 24, magnetoresistive effect parts (MR parts) 12 and 22 and upper part shield layers 13 and 23 are laminated in respective order, respectively, and are arranged in a lamination direction so as to interpose an insulation layer 105, and side shield layers (not shown) are placed at both sides of the MR parts 12 and 22 in the track width direction (X direction), respectively. Furthermore, the first MR element 11 and the second MR element 21 form a portion of the ABS. Then, height of the MR parts 12 and 22 in the direction that is perpendicular to ABS (Y direction) is the MR height.

An interelement shield layer 102 made of a similar material to the upper part shield layer 24 is formed between the upper part shield layer 23 of the second MR element 21 and the recording head part 101B.

The interelement shield layer 102 fulfills a role to cut off the MR parts 12 and 22 of the first MR element 11 and the second MR element 21 functioning as a sensor from a magnetic field generated by the magnetic head part 101B, and to prevent exogenous noise during reading.

Insulation layers 103 and 105 made of $Al_2O_3$, $SiO_2$ or the like are formed in a space between the upper part shield layers 13 and 23 and the lower part shield layers 14 and 24, which are at the opposite side of ABS of the MR part 12 and 22, in the first MR element 11 and the second MR element 21, respectively; in a back side part opposite side from ABS in the upper part shield layers 13 and 23, the lower part shield layers 14 and 24 and the interelement shield layer 102; in a space between the lower part shield layer 14 and a slider substrate 110; in a space between the interelement shield layer 102 and the recording head part 101B; and in a space between the first MR element 11 and the second element 21.

The recording head part 101B is preferably configured for perpendicular magnetic recording, and as shown in FIG. 1, it has a main magnetic pole layer 51, a gap layer 52, a coil insulation layer 53, a coil layer 54 and an auxiliary magnetic pole layer 55.

The main magnetic pole layer 51 is configured as a magnetic guide path for guiding a magnetic flux induced by the coil layer 54 to a recording layer of the recording medium 10 to be written into while it is focused.

An end portion of the auxiliary magnetic pole layer 55 that is magnetically coupled with the main magnetic pole layer 51 at the ABS side forms a trailing shield part where its layer cross section is wider than other portions of the auxiliary magnetic pole layer 55. As shown in FIG. 1, the auxiliary magnetic pole layer 55 is arranged opposite from the end portion of the main magnetic pole layer 51 at the ABS side by intervening the gap layer 52 made of an insulation material, such as alumina, and the coil insulation layer 53.

The gap layer 52 is formed so as to separate the coil layer 54 and the main magnetic pole layer 51.

An insulation layer 104 made of alumina and the like is formed so as to cover the periphery of the recording head part 101B.

[Reproducing Head Part]

Next, a reproducing head part of the thin film magnetic head in the present embodiment is explained. FIGS. 2A and 2B are plan views showing a reproducing head part of the thin film magnetic head in the present embodiment in a pattern manner, viewed from the air bearing surface (ABS) side.

As shown in FIGS. 2A and 2B, the reproducing head part 101A in the present invention has a configuration where the first MR element 11 and the second MR element 21 are arranged along the lamination direction. The first MR element 11, the insulation layer 105 and the second MR element 21 are lamination-formed on the insulation layer 103 on the slider substrate 110 (see FIG. 1) in respective order. Furthermore, the first MR element 11 and the second MR element 21 have identical layer configurations. Also, in the present embodiment, the phrase: "the first MR element 11 and the second MR element 21 are arranged along the lamination direction" is an intended meaning including not only a mode where positions in a direction that is orthogonal to the lamination direction of the first MR element 11 and the second MR element 21 (a track width direction) are substantially the same as those shown in FIG. 2A, but also another mode where positions in a direction that is orthogonal to the lamination direction of the first MR element 11 and the second MR element 21 (a track width direction) are shifted as shown in FIG. 2B.

The first MR element 11 and the second MR element 21 have a configuration where the lower part shield layer 14 or 24 and the MR part 12 or 22 and the upper part shield layer 13 or 23 are laminated in respective order. Furthermore, side shield layers 15 and 25 are placed at both sides of the MR parts 12 and 22 in the track width direction (X direction), respectively.

The MR parts 12 and 22 have a configuration where an antiferromagnetic layer 12a or 22a, a first ferromagnetic layer 12b or 22b, a nonmagnetic intermediate layer 12c or 22c and a second ferromagnetic layer 12d or 22d are laminated in respective order.

The first ferromagnetic layers 12b and 22b function as a so-called pinned layer where magnetization is pinned to a direction that is orthogonal to the ABS. The second ferromagnetic layers 12d and 22d function as a so-called free layer that is affected by an externally-applied magnetic field (an external magnetic field), and where a direction of its magnetization is changed in response to the external magnetic field. The antiferromagnetic layers 12a and 22a function to pin the direction of the magnetization of the first ferromagnetic layers 12b and 22b by exchange coupling with the first ferromagnetic layers 12b and 22b.

Figure 3A:
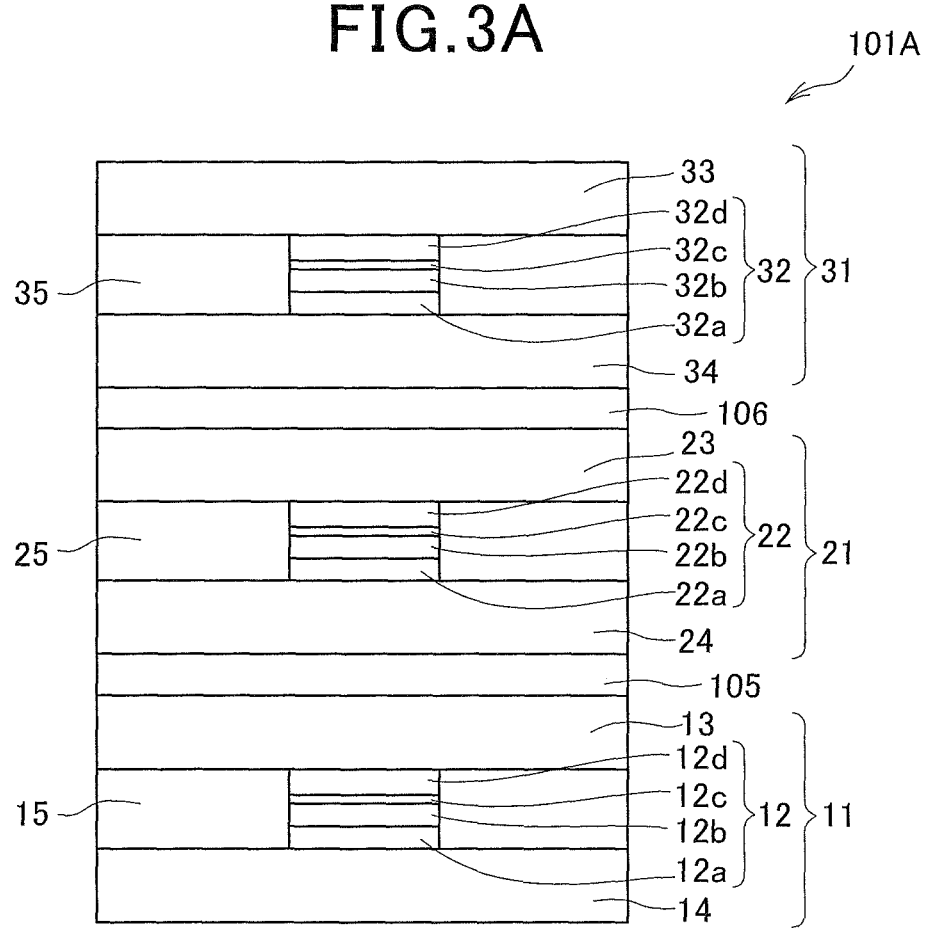

The reproducing head part 101A of the thin film magnetic head in the present embodiment is not limited to the mode above, but as shown in FIGS. 3A and 3B, a mode where three MR elements (the first to third elements 12 to 32) are arranged along the lamination direction is also acceptable. Furthermore, in the modes shown in FIGS. 3A and 3B, the configuration of each MR element (the first to third elements 12 to 32) is similar to each MR element (the first MR element 12, the second MR element 22) in the mode shown in FIGS. 2A and 2B.

[Manufacturing Method for Reproducing Head Part]

Subsequently, as an embodiment of the manufacturing method for a pattern multilayer body of the present invention, a manufacturing method for a reproducing head part is explained.

First Embodiment

As a first embodiment, a method for manufacturing a reproducing head part (the reproducing head part 101A having the configuration shown in FIG. 2B) where the first MR element 11 and the second MR element 21 are arranged along the lamination direction is explained as an example. FIGS. 4A to 4I are cross-sectional views schematically showing each step of the manufacturing method for a reproducing head part relating to first embodiment. Furthermore, in FIGS. 4A to 4I, manufacturing steps of a reproducing head part are shown on the left side, and manufacturing steps of an overlay pattern are shown on the right side.

Figure 4A:
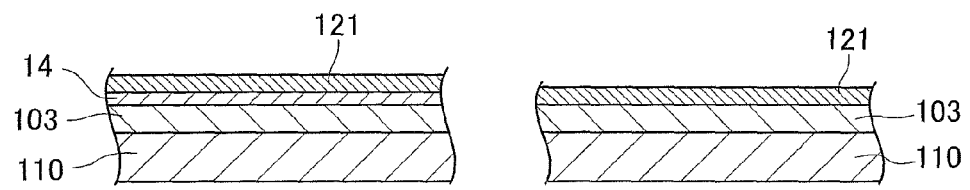
FIGS. 4A to 4I are cross-sectional views showing each step of a manufacturing method for a reproducing head relating to first embodiment of the present invention.

In the manufacturing method for a reproducing head part relating to first embodiment, as shown in FIG. 4A, first, a region where a reproducing head part is formed on the substrate 110 (the slider substrate 110 in the thin film magnetic head 100 (see FIG. 1)) made of a ceramic material, such as AlTiC ($Al_2O_3$.TiC) (a pattern formation region; hereafter, also referred to as an element region) and a region where an overlay pattern is formed (an overlay pattern formation region; hereafter, also referred to as an OVL region) are set. Then, a lower part shield layer 14 with approximately 20 nm to 3 μm of thickness made of NiFe (permalloy), CoZrTa, sendust, NiFeCo, CoZrNb or the like is formed, and a first MR element layer 121 (the first pattern layer) is formed on the lower part shield layer 14 through the intervention of the insulation layer 103 on the element region. In the meantime, the first element layer 121 is formed on the OVL region through the intervention of the insulation layer 103. The first MR element layer 121 has a configuration where an antiferromagnetic material layer, a first ferromagnetic material layer, a nonmagnetic material layer and a first ferromagnetic material layer are laminated in respective order.

The antiferromagnetic material layer is a layer configuring the antiferromagnetic layer 12a (see FIG. 2) in the MR part 12 of the first MR element 11. As a material configuring the antiferromagnetic material layer, for example, an antiferromagnetic material containing at least one type of element to be selected from a group of Pt, Ru, Rh, Pd, Ni, Cu, Ir, Cr and Fe and Mn is usable. The content of Mn in this antiferromagnetic material is preferably 35% to 95% by atom. The thickness of the antiferromagnetic material layer can be set within the range of 100 Å to 150 Å.

The nonmagnetic material layer is a layer configuring the nonmagnetic intermediate layer 12c (see FIG. 2) in the MR part 12 of the first MR element 11. As a material composing the nonmagnetic material layer, Cu, Au, Ag, Zn, Ga, $TiO_x$, ZnO, InO, SnO, GaN, ITO (Indium Tin Oxide), $Al_2O_3$, MgO and the like can be exemplified. The thickness of the nonmagnetic material layer can be approximately 0.5 nm to 5 nm.

The first ferromagnetic material layer and the second ferromagnetic material layer are layers composing the first ferromagnetic layer 12b (see FIG. 2) and the second ferromagnetic layer 12d (see FIG. 2) in the MR part 12 of the first MR element 11, respectively. As the material composing the first ferromagnetic material layer and the second ferromagnetic layer, NiFe, CoFe, CoFeB, CoFeNi, $Co_2MnSi$, $Co_2MnGe$, $FeO_x$ (Fe oxide) and the like can be exemplified. The thickness of the first ferromagnetic layer 21 and the second ferromagnetic layer 22 can be approximately 0.5 nm to 8 nm, respectively.

Figure 4B:
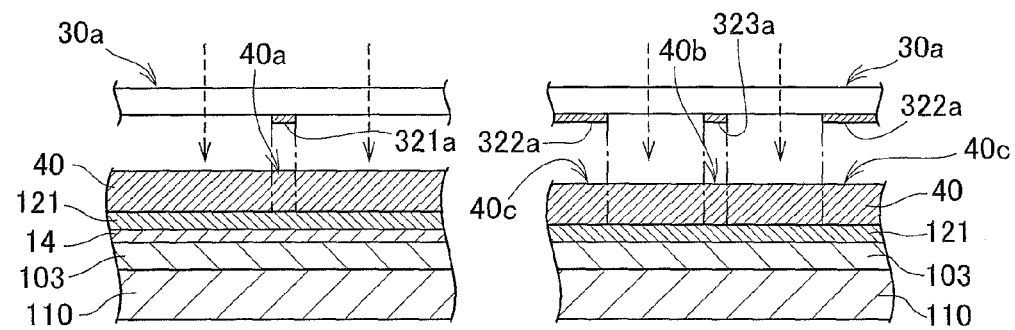

Next, as shown in FIG. 4B, a positive type photoresist film 40 (a first photoresist film) is formed on the first MR element layer 121, and the positive type photoresist film 40 is exposed via a main mask 30a having a predetermined light-shielding part.

Figure 5A:
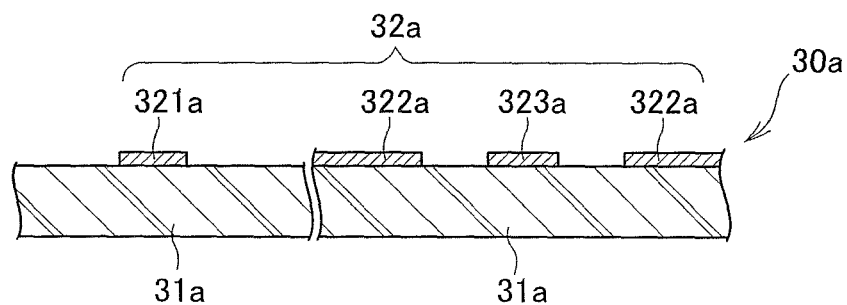
FIGS. 5A to 5C are cross-sectional views showing a configuration of each mask in a mask set used in the manufacturing method for a reproducing head part shown in FIGS. 4A to 4I.

The main mask 30a, as shown in FIG. 5A, has a clear substrate 31a where an exposure light is permeable, and a light-shielding part 32a that is formed on one surface of the clear substrate 31a, and where an exposure light is shieldable. The light-shielding part 32a includes an element light-shielding part 321a (a pattern light-shielding part) that is commonly used for forming the MR parts 12 and 22 of the MR elements 11 and 21, respectively; a first main light-shielding part 322a for forming a first overlay pattern OVL1; and a second main light-shielding part 323a for forming a second overlay pattern OVL2.

The element light-shielding part 321a, the first main light-shielding part 322a and the second main light-shielding part 323a of the main mask 30a have configurations, dimensions and the like corresponding to those of the MR parts 12 and 22 of the MR elements 11 and 21, the first overlay pattern OVL1 and the second overlay pattern OVL2, respectively. Furthermore, in the first embodiment, viewed from the upper side in the lamination direction, the inner peripheral configuration of the first overlay pattern OVL1 is nearly rectangular; the configuration of the second overlay pattern OVL2 is nearly rectangular positioned deeper inside than the inner peripheral portion of the first overlay pattern OVL1, and the first main light-shielding part 322a and the second main light-shielding part 323a have configurations corresponding to those.

Figure 4C:
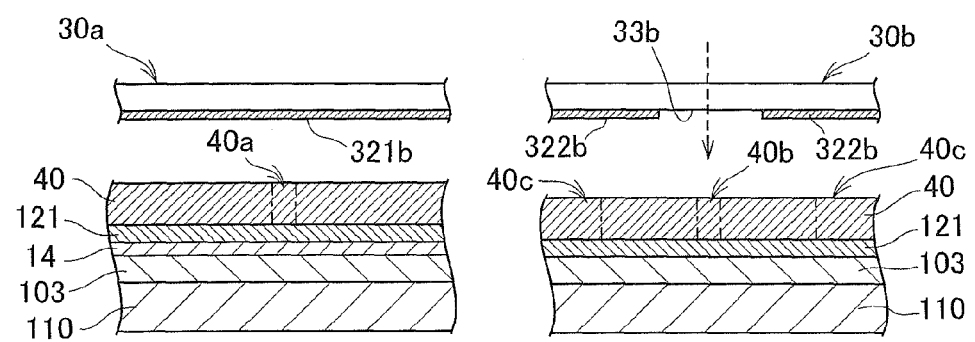

Subsequently, as shown in FIG. 4C, the positive type photoresist film 40 exposed via the main mask 30a is further exposed via a first sub mask 30b.

Figure 5B:
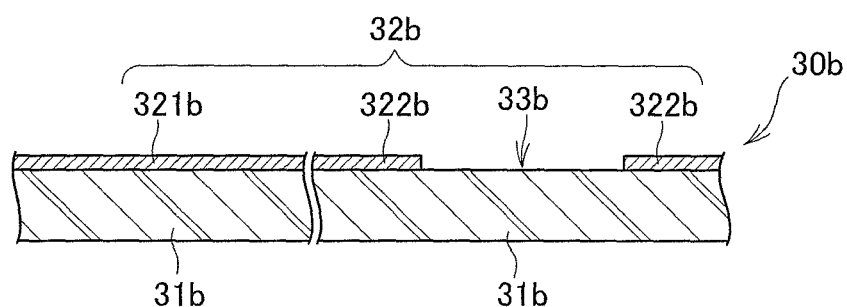

The first sub mask 30b, as shown in FIG. 5B, has a clear substrate 31b where an exposure light is permeable; a light-shielding part 32b where an exposure light is shieldable; and an opening part 33b where an exposure light reaching to an unexposed region 40b (see FIG. 4B) on the positive type photoresist film 40 (the first photoresist film) within the overlay pattern formation region other than an unexposed region 40c on the positive type photoresist film 40 (the first photoresist film), which has been light-shielded by the first main light-shielding part 322a (the first main light-shielding part 322a out of the first and second main light-shielding parts 322a and 323a) of the main mask 30a but not been exposed, is permeable. The light-shielding part 32b includes a light-shielding part 321b (a light-shielding part) where an exposure light reaching to the unexposed region 40a (see FIG. 4B) on the not-exposed positive type photoresist film 40 (the first photoresist film), which has been light-shielded by the element light-shielding part 321a of the main mask 30a, so has not been exposed, is shieldable; and a light-shielding part 322b (a sub light-shielding part) where an exposure light reaching to the unexposed region 40c (see FIG. 4B) on the not-exposed positive type photoresist film 40 (the first photoresist film), which has been light-shielded by the element light-shielding part 322a of the main mask 30a, so has not been exposed, is shieldable.

Figure 6A:
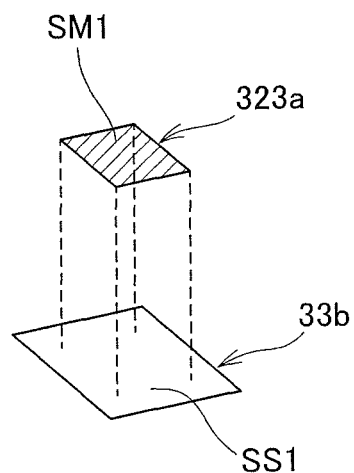
FIGS. 6A and 6B are perspective views showing a relationship between the light-shielding part and the opening part of each mask in the mask sets shown in FIGS. 5A to 5C.

As shown in FIG. 6A, when an opening area SS1 that is regulated with an external form of the opening part 33b of the first sub mask 30b and a light-shielded area SM1 that is regulated with an external form of the second main light-shielding part 323a of the main mask 30a in the planar view of the main mask 30a and the first sub mask 30b are compared, respectively, it is preferable that they are in a relationship where the opening area SS1 includes the light-shielded area SM. In other words, when the main mask 30a and the first sub mask 30b are overlapped, it is preferable that the opening area SS1 and the light-shielded area SM1 are in a relationship where the light-shielded area SM1 is completely covered with (included in) the opening area SS1, and an area of the opening area SS1 (an area in a planar view) is greater than an area of the light-shielded area SM1 (an area in a planar view).

In the meantime, the light-shielding part 32b of the first sub mask 30b has size that is sufficient to enable to shield an exposure light reaching to the unexposed regions 40a and 40c (see FIG. 4B) by the element light-shielding part 321a and the first main light-shielding part 322a of the main mask 30a, respectively.

Figure 4D:
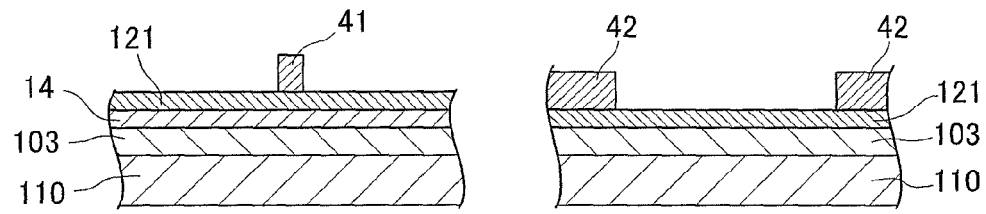

The unexposed regions 40a and 40c due to the element light-shielding part 321a and the first main light-shielding part 322a of the main mask 30a will not be exposed, but the unexposed region 40b due to the second main light-shielding part 323a is exposed by exposure treatment to the positive type photoresist film 40 twice via the main mask 30a and the first sub mask 30b having such a configuration, respectively. After that, a resist pattern 41 corresponding to the MR part 12 of the first MR element 11 and a resist pattern 42 corresponding to the first overlay pattern OVL1 are formed as shown in FIG. 4D by a development treatment using a predetermined developing solution and the like.

Figure 4E:
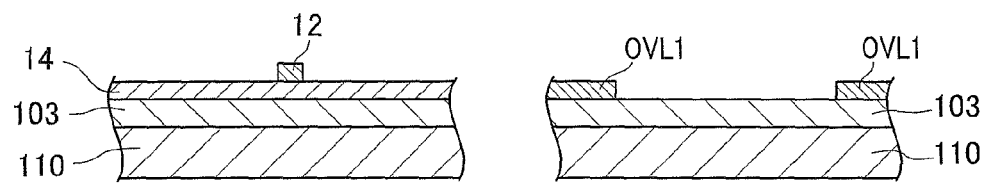

Next, as shown in FIG. 4E, processing with a milling treatment is performed to the first MR element layer 121, which is a layer under the positive type photoresist film 40 (first photoresist film), using the resist patterns 41 and 42 as masks. With this, the MR part 12 and the first overlay pattern OVL1 are formed.

Subsequently, a side shield layer 15 is formed at both sides of the MR part 12 in the track width direction after a protective film, such as a resist film, is formed within the OVL region, and the upper part shield layer 13 and the insulation layer 105 are lamination-formed on the MR part 12 and the side shield layer 15 in respective order. Then, a lower part shield layer 24 with approximately 20 nm to 3 μm of thickness made of NiFe (permalloy), CoZrTa, sendust, NiFeCo, CoZrNb or the like is formed on the insulation layer 105, and a second MR element layer 221 (second pattern layer) having the similar layer configuration to the first MR element layer 121 is formed on the lower part shield layer 24 (see FIG. 4F).

Figure 4F:
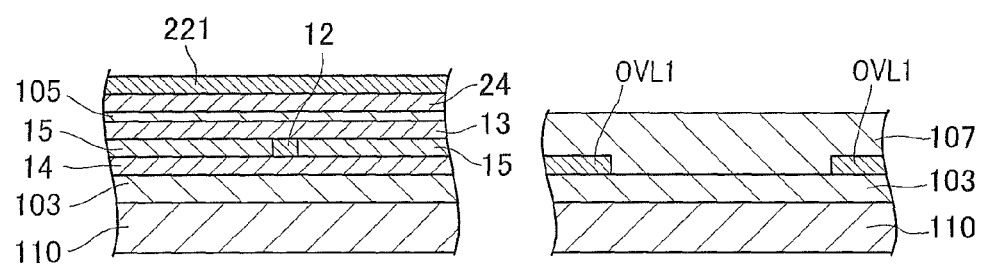

In the meantime, an insulation layer 107, such as $Al_2O_3$ or $SiO_2$, is formed on the first overlay pattern OVL1 (see FIG. 4F). The insulation layer 107, in the overlay measurement using the first overlay pattern OVL1 and the second overlay pattern OVL2, is required being clear so as to enable detection of the first overlay pattern OVL1, in other word, so as to enable the permeation of a detection light in the overlay measuring instrument.

Figure 4G:
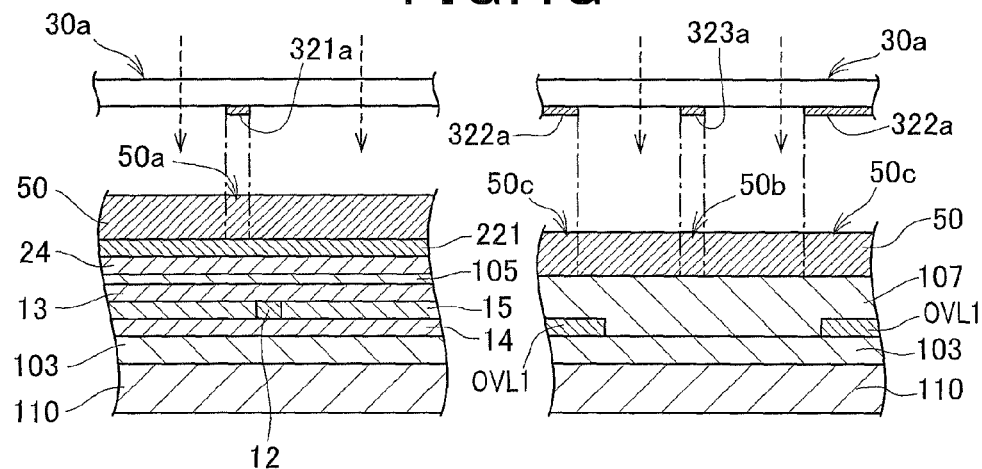

Next, as shown in FIG. 4G, a positive type photoresist film 50 (a second photoresist film) is formed on the second MR element layer 221 and on the insulation layer 107 on the OVL region, and the positive type photoresist film 50 is exposed via the main mask 30a above.

Figure 4H:
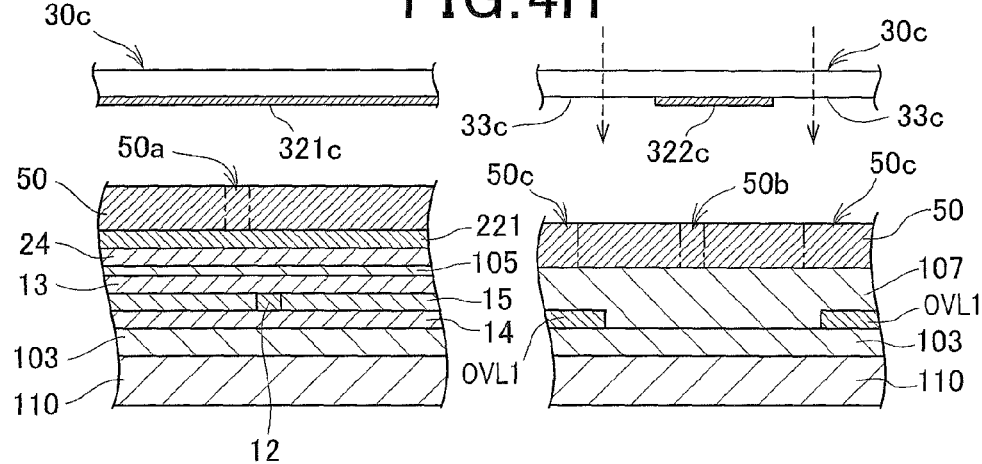

Subsequently, as shown in FIG. 4H, the positive type photoresist film 50, which has been exposed using the main mask 30a, is further exposed via the second sub mask 30c.

Figure 5C:
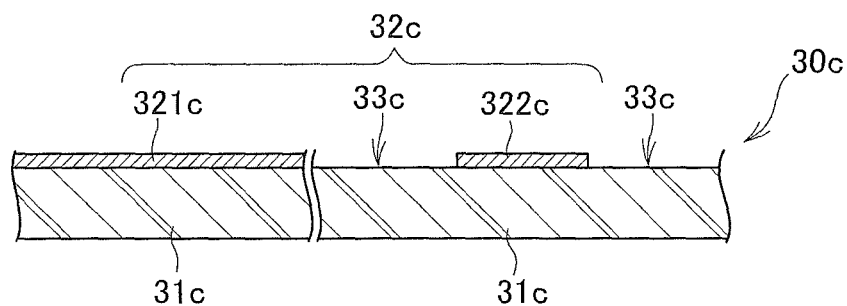

The second sub mask 30c, as shown in FIG. 5C, has a clear substrate 31c where an exposure light is permeable; a light-shielding part 32c where an exposure light is shieldable; and an opening part 33c where an exposure light reaching to an unexposed region 50c (see FIG. 4G) on the positive type photoresist film 50 (the second photoresist film) within the overlay pattern formation region other than an unexposed region 50b on the positive type photoresist film 50 (the second photoresist film), which has been light-shielded by the second main light-shielding part 323a (the second main light-shielding 323a out of the first to second main light-shielding parts 322a and 323a) of the main mask 30a, so has not been exposed, is permeable. The light shielding part 32c includes a light-shielding part 321c (a light-shielding part) where an exposure light reaching to an unexposed region 50a (see FIG. 4G) on the positive type photoresist film 50 (the second photoresist film), which has been light-shielded by the element light-shielding part 321a of the main mask 30a, so has not been exposed, is shieldable; and a light-shielding part 322c (a sub light-shielding part) where an exposure light reaching to the unexposed region 50b (see FIG. 4G) on the positive type photoresist film 50 (the second photoresist film), which has been light-shielded by the second main light-shielding part 323a, so has not been exposed, is shieldable.

Figure 6B:
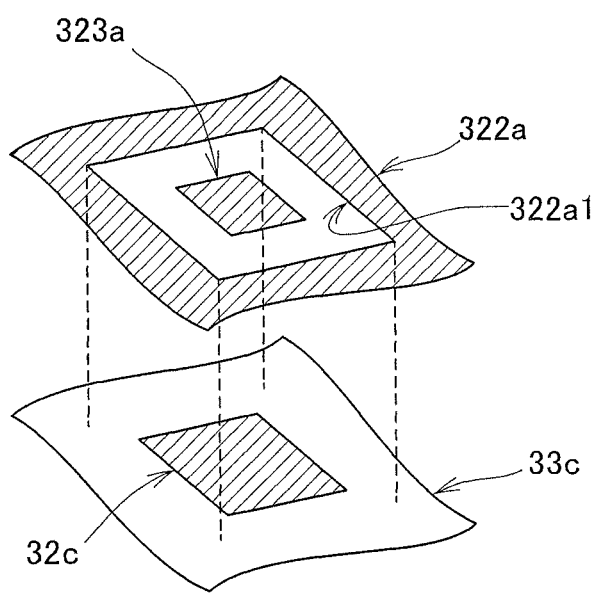
Figure 7A:
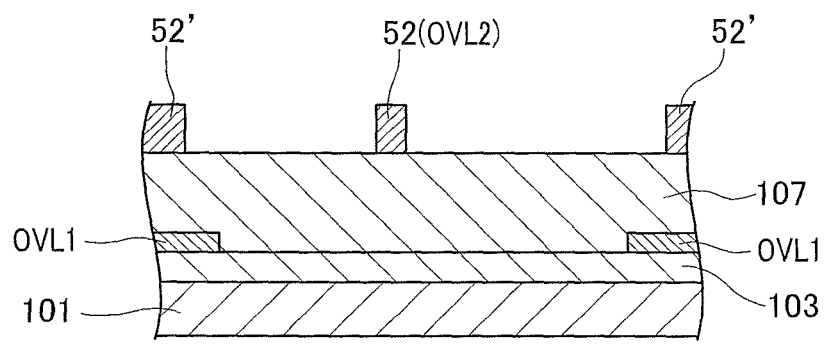
FIG. 7A is a cross-sectional view showing another example of a step to form a second overlay pattern in the manufacturing method for a reproducing head part relating to first embodiment of the present invention.
Figure 7B:
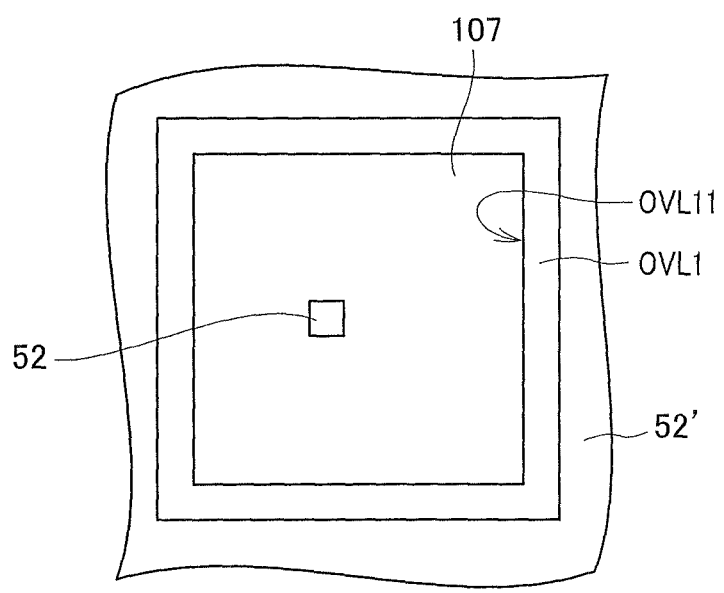
FIG. 7B is a plan view of the overlay pattern formation region shown in FIG. 7A viewed from the upper side in the lamination direction.

As shown in FIG. 6B, in the planar view of the main mask 30a and the second sub mask 30c, respectively, the light-shielding part 32c of the second sub mask 30c has size that is sufficient to enable to shield exposure lights reaching to the unexposed regions 50a and 50b due to the element light-shielding part 321a and the second main light-shielding part 323a of the main mask 30a. Then, when the second sub mask 30c and the main mask 30a are overlapped, the opening part 33c of the second sub mask 30c overlaps, at least, a region, which includes an entire inner periphery portion 322a1 out of the first main light-shielding part 322a, and which is a partial region of the first main light-shielding part 322a. When the overlay measurement is conducted in the first embodiment, it becomes necessary that an inner periphery portion OVL11 of the first overlay pattern OVL1, which is formed by corresponding to the first main light-shielding part 322a of the main mask 30a, is detectable (see FIG. 7B). In a step(s) to be described later, when the second overlay pattern OVL2 (a resist pattern 52) is formed using the second sub mask 30c with the configuration above, a resist pattern 52' may be formed, as shown in FIG. 7A, according to a positional relationship between the first main light-shielding part 322a of the main mask 30a and the opening part 33c of the second sub mask 30c (a positional relationship upon exposure (see FIG. 4G and FIG. 4H) using the main mask 30a and the second sub mask 30c, respectively). However, when the second sub mask 30c and the main mask 30a are overlapped, because the opening part 33c of the second sub mask 30c overlaps, at least, a region, which includes the entire inner peripheral portion 322a1 out of the first main light-shielding part 322a, and which is a partial region of the first main light-shielding part 322a, a portion positioned at the upper side in the lamination direction of the inner periphery portion OVL11 of the first overlay pattern OVL1 out of the unexposed region 50c will be at least exposed upon exposure using the second sub mask 30c (see FIG. 4H). Therefore, even if the resist pattern 52' is formed, the inner periphery portion OVL11 of the first overlay pattern OVL1 can be detected from the upper side in the lamination direction, and the overlay measurement can be conducted (see FIG. 7B).

Needless to say, in the first embodiment, when the main mask 30a and the second sub mask 30c are overlapped, the opening part 33c of the second sub mask 30c may be configured so as to cover the entire first main light-shielding part 322a of the main mask 30a.

Figure 4I:
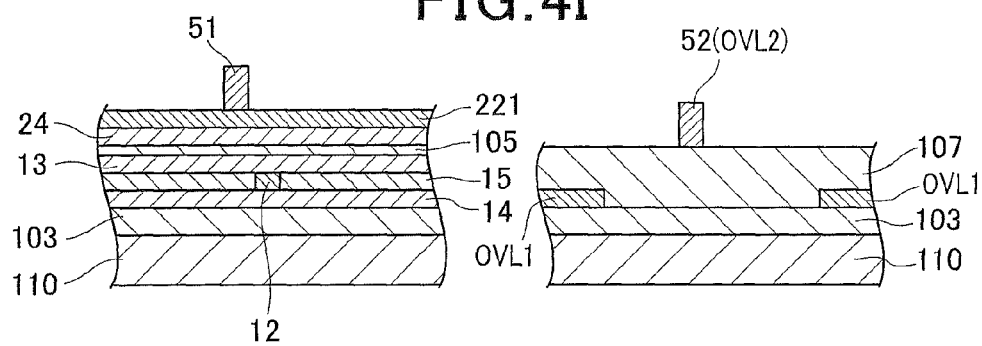

Because the exposure treatment is applied to the positive type photoresist film 50 twice via the main mask 30a and the second sub mask 30c having such a configuration, respectively, the unexposed regions 50a and 50b due to the element light-shielding part 321a and the second main light-shielding part 323a of the main mask 30a will not be exposed, but the unexposed region 50c due to the first main light-shielding part 322a is exposed. After that, as shown in FIG. 4I, the resist pattern 51 corresponding to the MR part 22 of the second MR element 21 and the resist pattern 52 as the second overlay pattern OVL2 are formed by a development treatment using a predetermined developing solution and the like.

In this stage (a stage to form the resist patterns 51 and 52), the overlay measurement is conducted using the first overlay pattern OVL1 and the second overlay pattern OVL2 (the resist pattern 52). This enables a position gap in a direction that is orthogonal to the lamination direction to be measured. Furthermore, the overlay measurement is conducted using a standard overlay measurement instrument.

Due to the overlay measurement above, when the positional accuracy in the direction that is orthogonal to the lamination direction between the first overlay pattern OVL1 and the second overlay pattern OVL2 is within a tolerance range, processing with a milling treatment to the second MR element layer 221 is conducted using the resist pattern 51 as a mask, and the MR part 22 is formed. After that, the reproducing head part 101A where the first MR element 11 and the second MR element 21 are arranged along the lamination direction can be manufactured by forming the side shield layer 25 and the upper shield layer 23.

As described above, in the manufacturing method for a reproducing head part relating to the first embodiment, since the first overlay pattern OVL1 and the second overlay pattern OVL2 can be formed using one main mask, a reduction in the positional accuracy resulting from a manufacturing error between masks will not occur compared to the case of forming the first overlay pattern OVL1 and the second overlay pattern OVL2 using two different masks. Consequently, according to the first embodiment, a thin film magnetic head having a reproducing head part having high positional accuracy in the direction that is orthogonal to the lamination direction of the first MR element 11 and the second MR element 21 can be manufactured.

Furthermore, even in the manufacturing method for a reproducing head part relating to the first embodiment, it can be stated that the first overlay pattern OVL1 and the second overlay pattern OVL2 are formed using two sub masks (the first sub mask 30b and the second sub mask 30c) along with one main mask 30a, in other words, using a plurality of different masks. However, the first sub mask 30b and the second sub mask 30c should have opening parts 33b and 33c where the unexposed regions 40b and 50b due to the first main light-shielding part 322a and the second main light shielding part 323a in the main mask 30a, and a positional relationship between the opening parts 33b and 33c and the first main light-shielding part 322a and the second main light-shielding part 323a; in other words, a manufacturing error between the different masks (the main mask 30a, and, the sub masks 30b and 30c) will not affect the formation of the overlay patterns. Because the first main light-shielding part 322a for forming the first overlay pattern OVL1 and the second main light-shielding part 323a for forming the second overlay pattern OVL2 are formed in one main mask 30a, the positional accuracy between the first main light shielding part 322a and the second main light-shielding part 323a; in other words, the positional accuracy between the first overlay pattern OVL1 and the second overlay pattern OVL2, will never be reduced due to manufacturing error.

Therefore, each overlay pattern with excellent positional accuracy in the direction that is orthogonal to the lamination direction can be formed by manufacturing a pattern multilayer body using a mask set including the main mask 30a having the element light-shielding part 321a, the first main light-shielding part 322a and the second light-shielding part 323a, the first sub mask 30b having a predetermined opening part 33b and the second sub mask 30c having a predetermined opening part 33c.

Second Embodiment

As a manufacturing method for a reproducing head part relating to a second embodiment, a method for manufacturing a reproducing head part (a reproducing head part having the configuration shown in FIG. 3B) where the first MR element 11, the second MR element 21 and the third MR element 31 are arranged along the lamination direction, is explained as an example. FIGS. 8A to 8E are cross-sectional views schematically showing each step of the manufacturing method for a reproducing head part relating to the second embodiment. Furthermore, in FIGS. 8A to 8E, manufacturing steps of a reproducing head part are shown on the left side, and manufacturing steps of the overlay patterns are shown on the right side. Also, in the second embodiment, the configuration that is nearly similar to that in the first embodiment is marked with the same symbols, and the detailed explanations will be omitted.

In the manufacturing method for a reproducing head part relating to the second embodiment, the steps up to the formation of the second overlay pattern OVL2 (the resist pattern 52 as the second overlay pattern OVL2) are similar to those in the first embodiment, and the overlay measurement is conducted using the first overlay pattern OVL1 and the second overlay pattern OVL2 (see FIGS. 4A to 4I). With this measurement, a position gap in the direction that is orthogonal to the lamination direction of the first MR element 11 (the MR part 12) and the second MR element 21 (the MR part 22) can be measured. Furthermore, the second main light-shielding part 323a of the main mask 30a in the second embodiment is used in common for forming the second overlay pattern OVL2 and the third overlay pattern OVL3. The second main light-shielding part 323a of the main mask 30a has configurations, dimensions and the like corresponding to those of the overlay pattern OVL2 and the third overlay pattern OVL3. In other words, the second main light-shielding part 323a also fulfills a role as the third main light-shielding part for forming the third overlay pattern OVL3. In this sense, it can be stated that the main mask 30a has the third main light-shielding part for forming the third overlay pattern OVL3.

Subsequently, processing with a milling treatment is conducted to the second MR element layer 221 and the insulation layer 107 using the resist pattern 51 corresponding to the MR part 22 of the second MR element 21 and the resist pattern 52 (the second overlay pattern OVL2) as masks. With this processing, the MR part 22 is formed within the element region (see FIG. 8A).

Next, after a protective film, such as a resist film, is formed within the OVL region, the side shield layer 25 is formed on both sides of the MR part 22 in the track width direction, and the upper part shield layer 23 and the insulation layer 106 are lamination-formed on the MR part 22 and the side shield layer 25 in respective order. Then, a lower part shield layer 34 with approximately 20 nm to 3 μm of thickness made of NiFe (permalloy), CoZrTa, sendust, NiFeCo, CoZrNb or the like is formed on the insulation layer 106, and a third MR element layer 321 (a third pattern layer) having the similar layer configuration to the first and second MR element layers 121 and 221 are formed on the lower part shield layer 34 (see FIG. 8B).

Figure 8A:
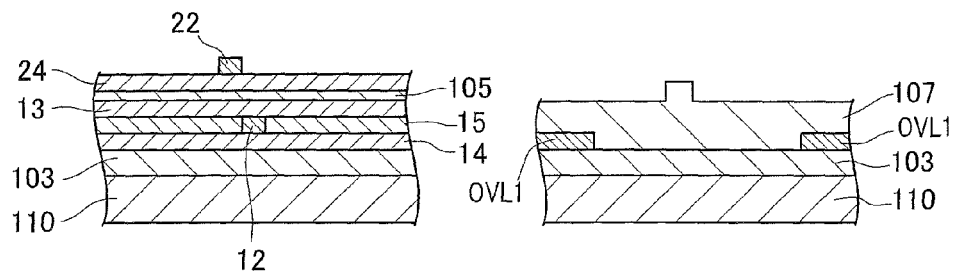
FIGS. 8A to 8E are cross-sectional views showing each step of the manufacturing method for a reproducing head part relating to second embodiment of the present invention.
Figure 8B:
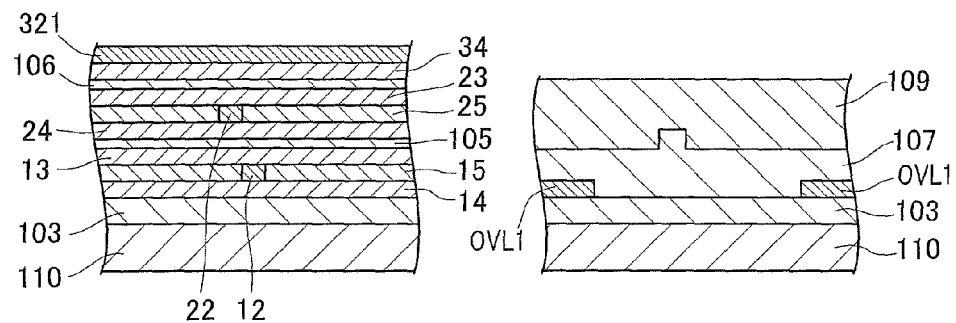

In the meantime, an insulation layer 109, such as $Al_2O_3$ or $SiO_2$, is formed on the insulation layer 107 within the OVL region (see FIG. 8B). The insulation layer 109, in the overlay measurement using the first overlay pattern OVL1 and the overlay pattern OVL3, is required being clear so as to enable to detect the first overlay pattern OVL1; in other words, so as to enable the permeation of a detection light in the overlay measurement instrument.

Figure 8C:
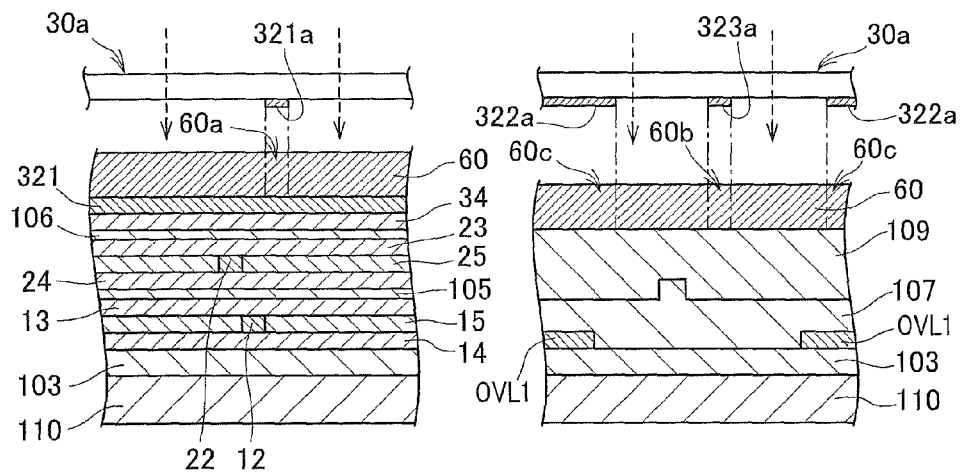

Next, as shown in FIG. 8C, a positive type photoresist film 60 (a third photoresist film) is formed on the third MR element layer 321 and the insulation layer 109, and the positive type photoresist film 60 is exposed using the main mask 30a above.

Subsequently, the positive type photoresist film 60 that has been exposed using the main mask 30a is further exposed using the third sub mask. The third sub mask has a clear substrate where an exposure light is permeable; a light-shielding part where an exposure light is shieldable; and the opening part 33c where an exposure light reaching to an unexposed region 60c (see FIG. 8C) on the positive type photoresist film 60 (the third photoresist film) within the overlay pattern formation region other than an unexposed region 60b on the positive type photoresist film 60 (the third photoresist film), which has been light-shielded by a third main light-shielding part 323a of the main mask 30a (the third main light-shielding part 323a out of the first to third main light-shielding parts) but has not been exposed, is permeable. The light-shielding part includes the light-shielding part 321c (a light-shielding part) where an exposure light reaching to the unexposed region 60a (see FIG. 8C) on the positive type photoresist film 60 (the third photoresist film), which has been light-shielded by the element light-shielding part 321a of the main mask 30a, so has not been exposed, is shieldable, and the light-shielding part 322c (a sub light-shielding part) where an exposure light reaching to the unexposed region 60b (see FIG. 8C) on the positive type photoresist film 60 (the third photoresist film), which has been light-shielded by the element light-shielding part 323a, so has not been exposed, is shieldable.

Figure 8D:
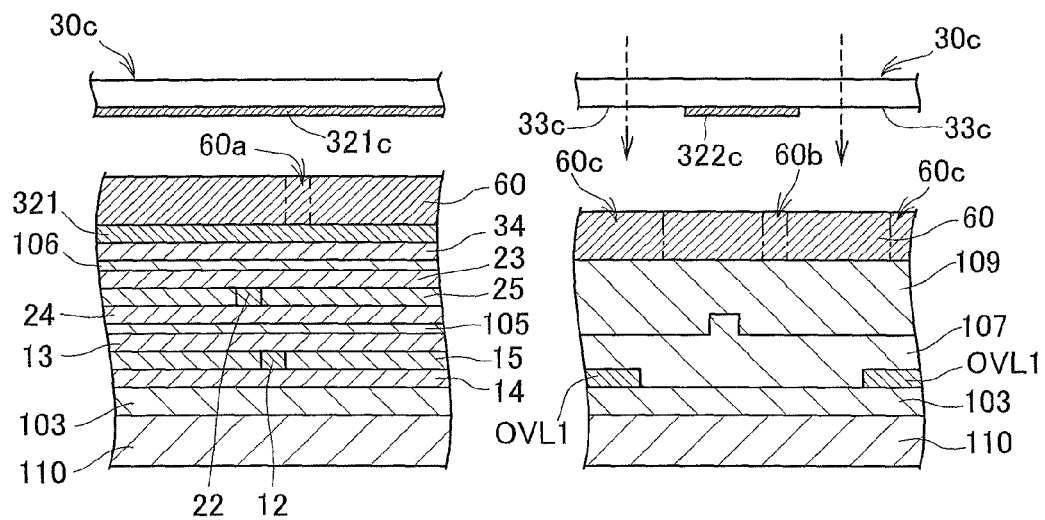
Figure 8E:
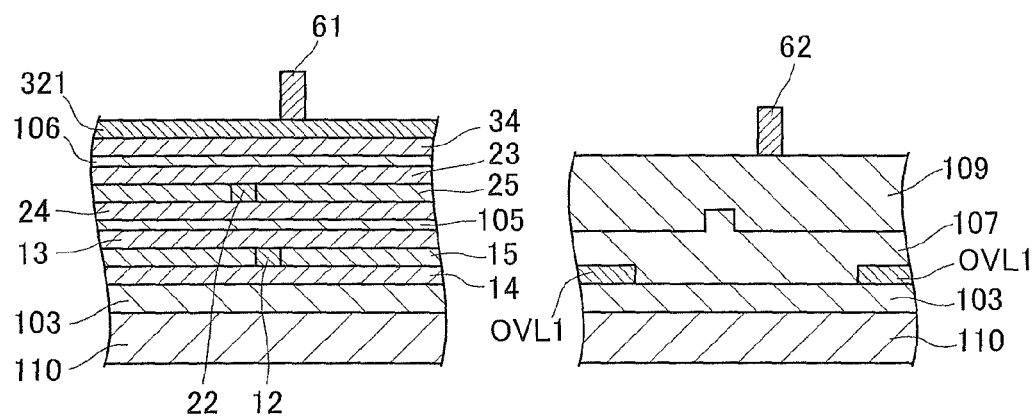

In the second embodiment, as shown in FIG. 8D, exposure is further performed using the second sub mask 30c as a third sub mask. After that, a resist pattern 61 corresponding to the MR part 32 of the third MR element 31 and a resist pattern 62 as a third overlay pattern OVL3 are formed as shown in 8E, by a development process using a predetermined developing solution and the like. Thus, the second sub mask 30c also fulfills a role as the third sub mask for forming the third overlay pattern OVL3. Furthermore, in the steps above (see FIG. 8D), exposure can be further performed using a third sub mask (a sub mask with the same configuration as the second sub mask 30c) separately from the second sub mask 30c.

In this stage (a stage to form the resist patterns 61 and 62), the overlay measurement is performed using the overlay pattern OVL1 and the third overlay pattern OVL3 (resist pattern 62).

Due to the overlay measurement above, when a positional accuracy in a direction that is orthogonal to the lamination direction between the first overlay pattern OVL1 and the third overlay pattern OVL3 is within the tolerance range, processing with a milling treatment to the third element layer 321 is conducted using the resist pattern 61 as a mask, and the MR part 32 is formed. After that, the reproducing head part 101A where the first MR element 11, the second MR element 21 and the third MR element 31 are arranged along the lamination direction can be manufactured by forming the side shield layer 35 and the upper part shield layer 33.

As described above, in the manufacturing method for an MR element relating to the second embodiment, since the overlay pattern OVL1, the second overlay pattern OVL2 and the third overlay pattern OVL3 can be formed using one main mask, respectively, a decrease in a positional accuracy based upon a manufacturing error among masks will never occur compared to the case of using three different masks in order to form the first to third overlay patterns OVL1 to OVL3. Consequently, according to the second embodiment, a thin film magnetic head having a reproducing head part that has high positional accuracy in a direction that is orthogonal to the lamination direction of the first MR element 11, the second MR element 21 and the third MR element 31 can be manufactured.

Also, each overlay pattern having high positional accuracy in a direction that is orthogonal to the lamination direction can be formed on the occasion of manufacturing a pattern multilayer body having three layers of pattern layers by using the mask set including the main mask 30a above, the first sub mask 30b and the second sub mask 30c or the mask set further including the third sub mask (a sub mask with the same configuration as the second sub mask 30c).

Third Embodiment

Figure 9A:
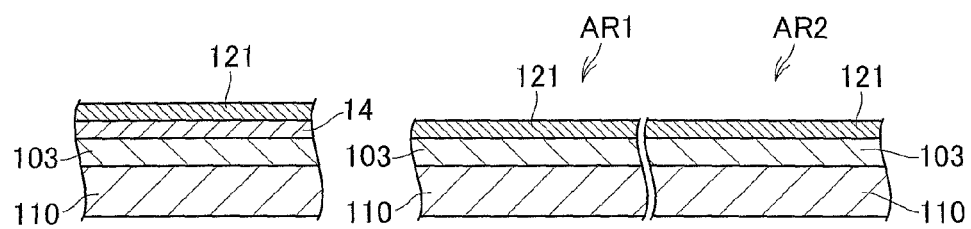
FIG. 9A is a cross-sectional view showing one step of the manufacturing method for a reproducing head part relating to third and fourth embodiments of the present invention.

As a manufacturing method for a reproducing head part relating to a third embodiment, a method for manufacturing a reproducing head part (a reproducing head part having the configuration shown in FIG. 3B) where the first MR element 11, the second MR element 21 and the third MR element 31 are arranged along the lamination direction is explained as an example. FIGS. 9A to 9N are cross-sectional views schematically showing each step of the manufacturing method for a reproducing head part relating to the third embodiment. Furthermore, in FIGS. 9A to 9N, manufacturing steps of a reproducing head part are shown on the left side, and manufacturing steps of an overlay pattern are shown on the right side. Also, in the third embodiment, a configuration that is nearly similar to those in the first embodiment and the second embodiment are marked with the same symbols, and their detailed explanations will be omitted.

In the third embodiment, two regions (a first region and a second region) are set within the overlay pattern formation region, and the first overlay pattern OVL1 and the second overlay pattern OVL2 are formed in the first region, and the first overlay pattern OVL1' and the third overlay pattern OVL3 are formed within the second region. In this point, the manufacturing method for a reproducing head part relating to the third embodiment is different from that relating to the second embodiment.

In the third embodiment, as shown in FIG. 9A, first, an element region, a first region AR1 and a second region AR2 are set on the substrate 110. Then, the lower part shield layer 14 is fainted on the element region through the intervention of the insulation layer 103, and the first MR element layer 121 (the first pattern layer) is formed on the lower part shield layer 14. In the meantime, the first MR element layer 121 is formed on the first region AR1 and the second region AR2 through the intervention of the insulation layer 103.

Figure 9B:
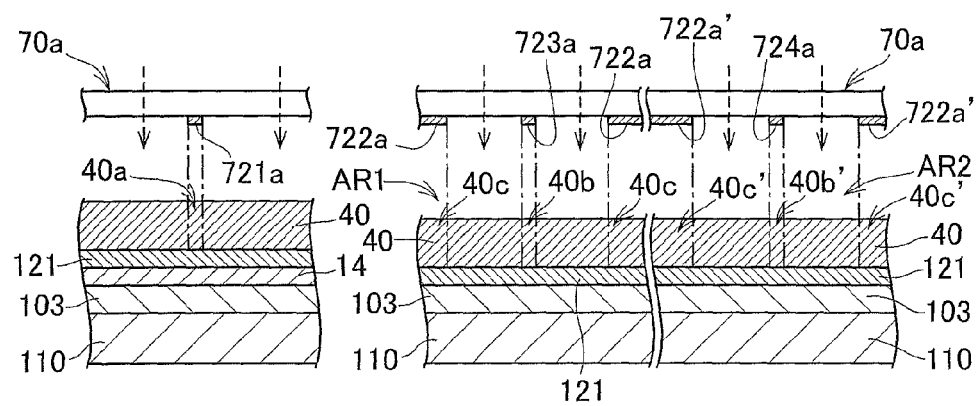
FIGS. 9B to 9N are cross-sectional views showing each step of the manufacturing method for a reproducing head part relating to the third embodiment of the present invention, following FIG. 9A.

Next, as shown in FIG. 9B, the positive photoresist film 40 (the first photoresist film) is formed on the first MR element layer 121, and the positive type photoresist film 40 is exposed via a main mask 70a having a predetermined light-shielding part.

Figure 10A:
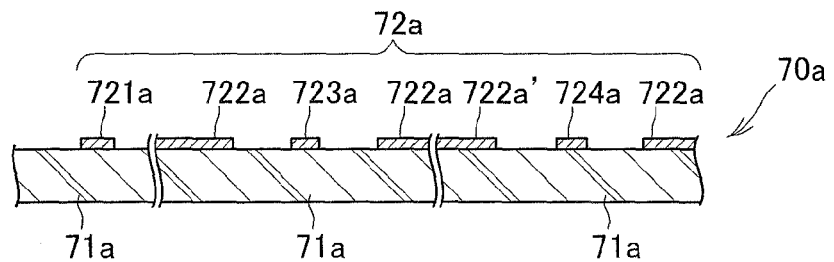
FIGS. 10A to 10D are cross-sectional views showing a configuration of each mask in a mask set that is used in the manufacturing method for a reproducing head part showing FIGS. 9A to 9N.
Figure 10B:
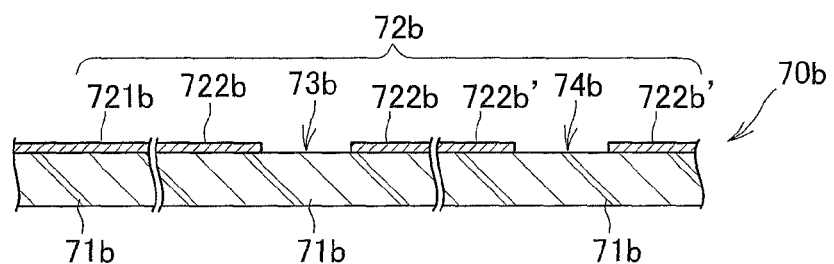

The main mask 70a, as shown in FIG. 10A, has a clear substrate 71a where an exposure light is permeable, and a light-shielding part 72a that is formed on one surface of the clear substrate 71a, and where an exposure light is shieldable. The light-shield part 72a includes an element light-shielding part 721a (a pattern light-shielding part) that is commonly used for forming the MR parts 12 to 32 of the MR elements 11 to 31, first main light-shielding parts 722a and 722a' for forming the overlay pattern OVL1 and OVL1' within the first region AR1 and the second region AR2, respectively, a second main light-shielding part 723a for forming the overlay pattern OVL2 within the first region AR1, and a third main light-shielding part 724a for forming the third overlay pattern OVL3 within the second region AR2. The element light-shielding part 721a of the main mask 70a, the first main light-shielding parts 722a and 722a', the second main light-shielding parts 723a and the third main light-shielding part 724a have configurations, dimensions and the like corresponding to those of the MR parts 12 to 32 of the MR elements 11 to 31, the first overlay patterns OVL1 and OVL1', the second overlay pattern OVL2 and the third overlay pattern OVL3, respectively.

Figure 9C:
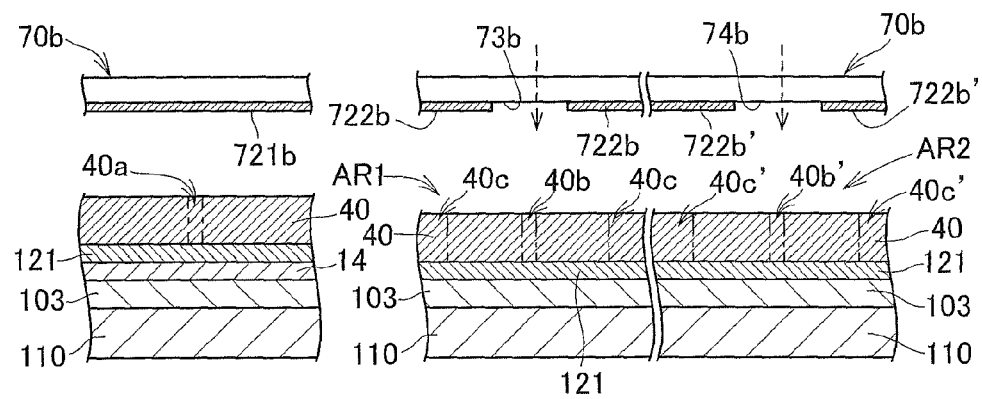

Subsequently, as shown in FIG. 9C, the positive type photoresist film 40 that has been exposed via the main mask 70a is further exposed via the first sub mask 70b.

The first sub mask 70b, as shown in 10B, has a clear substrate 71b where an exposure light is permeable; a light-shielding part 72b where an exposure light is shieldable; and opening parts 73b and 74b where an exposure light reaching to unexposed regions 40b and 40b' (see FIG. 9B) on the positive type photoresist film 40 (the first photoresist film) within the overlay pattern formation region other than the unexposed regions 40c and 40c' on the positive photoresist film 40 (the first photoresist film), which has been light-shielded by first main light shielding parts 722a and 722a' (first main light-shielding parts 722a and 722a' out of the first to third main light-shielding parts 722a to 724a), so has not been exposed, is permeable. The light-shielding part 72b includes a light-shielding part 721b (a light-shielding part) where an exposure light reaching to unexposed region 40a (see FIG. 9B) on the positive photoresist film 40 (the first photoresist film), which has been light-shielded by the element light-shielding part 721a of the main mask 70a, so has not been exposed, is shieldable; and light-shielding parts 722b and 722b' (sub light-shielding parts) where an exposure light reaching to the unexposed regions 40c and 40c' (see FIG. 9B) on the positive photoresist film 40 (the first photoresist film), which has been light-shielded by the first main light-shielding part 722a, so has not been exposed, is shieldable.

Figure 11A:
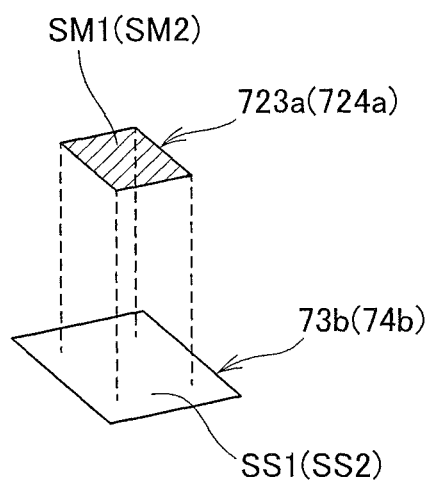
FIGS. 11A and 11B are perspective views showing a relationship between a light-shielding part and an opening part of each mask in the mask set shown in FIGS. 10A to 10D.

As shown in FIG. 11A, when an opening area SS1 (SS2) regulated with an external form of the opening 73b (74b) of the first sub mask 70b and a light-shielded area SM1 (SM2) regulated with an external form of the second main light-shielding part 723a (the third main light-shielding part 724a) of the main mask 70a in the planar views of the main mask 70a and the first sub mask 70b are compared, it is preferable to be in a relationship where the opening area SS1 (SS2) includes the light-shielded area SM1 (SM2). In other words, when the main mask 70a and the first sub mask 70b are overlapped, it is preferable that the opening area SS1 (SS2) and the light-shielded area SM1 (SM2) have a relationship where the light-shielded area SM1 (SM2) is completely covered with (included in) the opening area SS1 (SS2), and, an area of the opening area SS1 (SS2) (an area in the planar view) is greater than that of the light-shielded area SM1 (SM2) (an area in the planar view).

In the meantime, the light-shielding part 72*b* of the first sub mask 70*b* has sufficient size so as to enable to shield an exposure light reaching to the unexposed regions 40*a*, 40*c* and 40*c*' (see FIG. 9B) due to the element light-shielding part 721*a* and the first light-shielding parts 722*a* and 722*a*' of the main mask 70*a*.

Figure 9D:
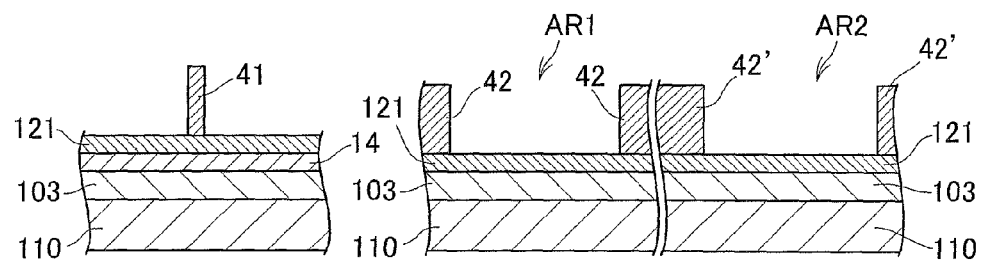

The unexposed regions 40*a* and 40*c* due to the element light-shielding part 721*a* and the first main light-shielding part 722*a* of the main mask 70*a* will not be exposed, but the unexposed regions 40*b* and 40*b*' due to the second main light-shielding part 723*a* and the third main light-shielding part 724*a* are exposed, by an exposure treatment to the positive photoresist film 40 twice via the main mask 70*a* and the first sub mask 70*b* having such a configuration. After that, the resist pattern 41 corresponding to the MR part 12 of the first MR element 11 and the resist pattern 42 corresponding to the first overlay patterns OVL1 and OVL1' are formed by the development treatment using a predetermined developing solution and the like, as shown in FIG. 9D.

Figure 9E:
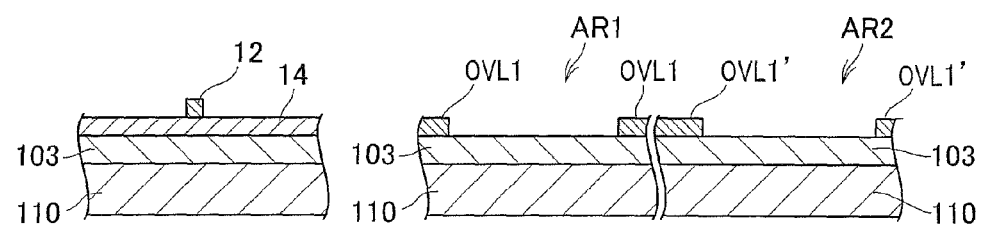

Next, as shown in FIG. 9E, processing with a milling treatment is performed to the first MR element layer 121, which is a layer under the positive type photoresist film 40 (the first photoresist film), using the resist patterns 41 and 42 as masks. With this processing, the MR part 12 and the first overlay patterns OVL1 and OVL1' are formed.

Subsequently, after a protective film, such as a resist film, is formed within the first region AR1 and the second region AR2, the side shield layer 15 is formed at both sides of the MR part 12 in the track width direction, and the upper part shield layer 13 and the insulation part 105 are lamination-formed on the MR part 12 and the side shield layer 15 in respective order. Then, the lower part shield layer 24 is formed on the insulation layer 105, and the second MR element layer 221 (the second pattern layer) is formed on the lower part shield layer 24 (see FIG. 9F).

Figure 9F:
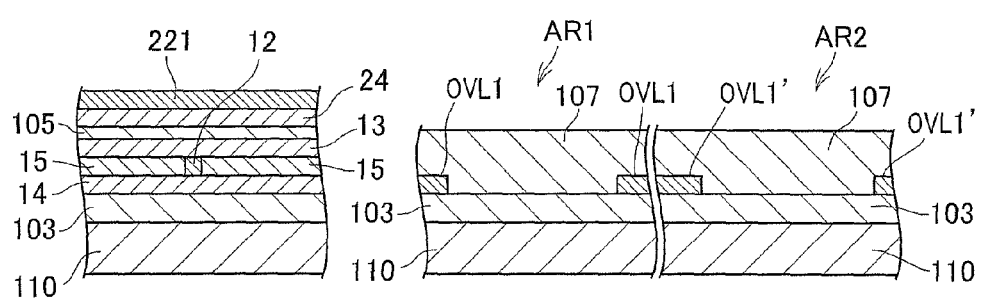

In the meantime, the insulation layer 107, such as Al$_2$O$_3$ or SiO$_2$, is formed on the first overlay patterns OVL1 and OVL1' (see FIG. 9F). The insulation layer 107 is required to be clear so as to enable to detect the overlay pattern OVL1 and OVL1', in other words, so as to enable the permeation of a detection light in the overlay measurement instrument, in the overlay measurement using the first overlay pattern OVL1 and the second overlay pattern OVL2, and, in the overlay measurement using the first overlay pattern OVL1' and the third overlay pattern OVL3.

Figure 9G:
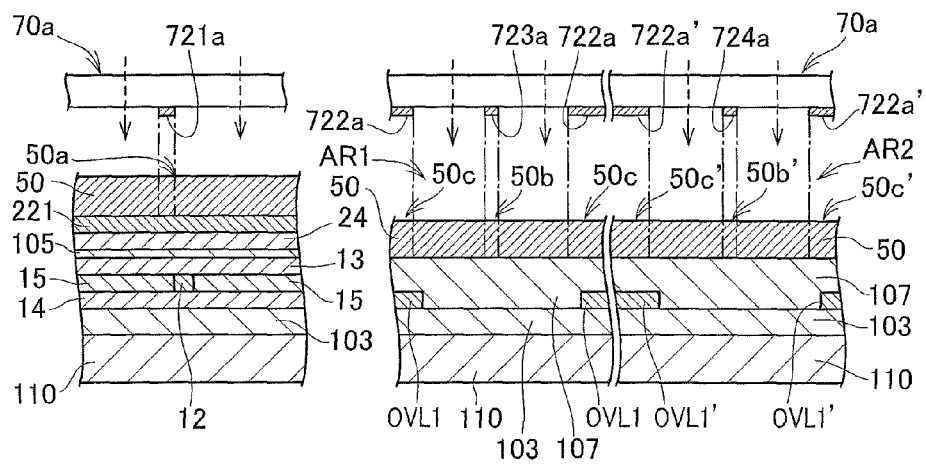

Next, as shown in FIG. 9G, the positive type photoresist film 50 (the second photoresist film) is formed on the second MR element layer 221 and the insulation layer 107 within the first region AR1 and the second region AR2, and the positive type photoresist film 50 is exposed via the main mask 70*a* above.

Figure 9H:
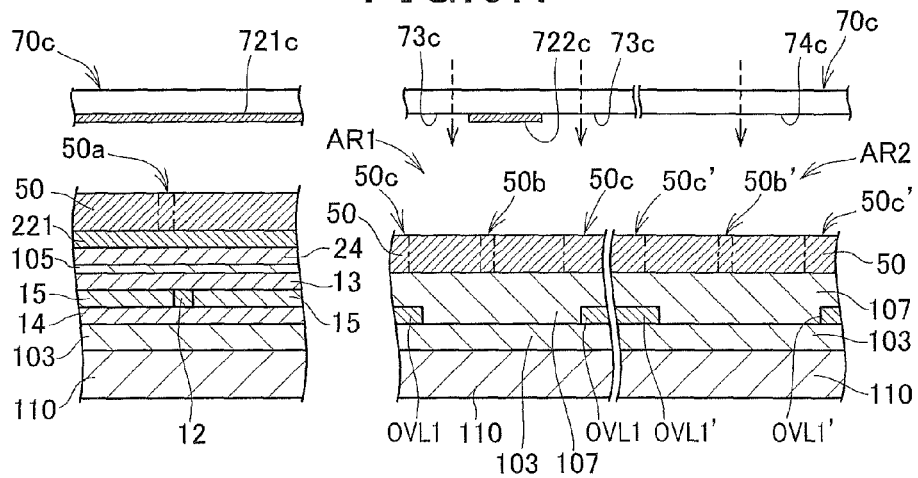

Subsequently, as shown in FIG. 9H, the positive type photoresist film 50 that has been exposed via the main mask 70*a* is further exposed via the second sub mask 70*c*.

Figure 10C:
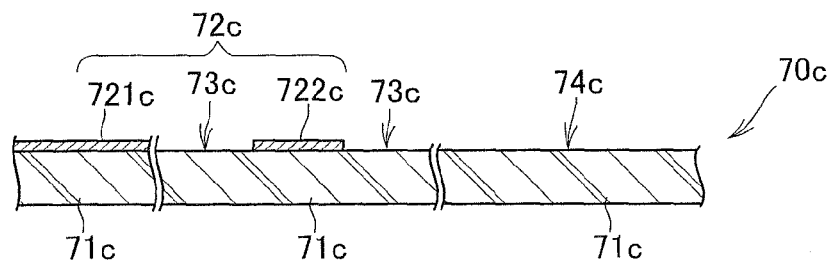

The second sub mask 70*c*, as shown in FIG. 10C, has a clear substrate 71*c* where an exposure light is permeable; a light-shielding part 72*c* where an exposure light is shieldable; and opening parts 73*c* and 74*c* where an exposure light reaching to unexposed regions 50*c*, 50*c*' and 50*b*' (see FIG. 9G) on the positive type photoresist film 50 (the second photoresist film) within the overlay pattern formation region other than an unexposed region 50*b* on the positive photoresist film 50 (the second photoresist film), which has been light-shielded by the second main light-shielding part 723*a* (the second main light-shielding part 723*a* out of the first to third main light-shielding parts 722*a* to 724*a*) of the main mask 70*a*, and so has not been exposed, is permeable. The light-shielding part 72*c* includes a light-shielding part 721*c* (a light-shielding part) where an exposure light reaching to the unexposed region 50*a* (see FIG. 9G) on the positive type photoresist film 50 (the second photoresist film), which has been light-shielded by the element light-shielding part 721*a* of the main mask 70*a*, and so has not been exposed, is shieldable, and a light-sidling part 722*c* (a sub light-shielding part) where an exposure light reaching to the unexposed region 50*b* (see FIG. 9G) on the positive type photoresist film 50 (the second photoresist film), which has been light-shielded by the second main light-shielding part 723*a*, and so has not been exposed, is shieldable.

Furthermore, the second sub mask 70*c* shown in FIG. 10C has an opening part 74*c* where an exposure light reaching to the unexposed regions 50*b*' and 50*c*' (see FIG. 9G) on the positive type resist film 50 (the second photoresist film) within the overlay formation region is permeable, but is not limited to such mode, and may have a light-shielding part where an exposure light reaching to the unexposed regions 50*b*' and 50*c*' (see FIG. 9G) is shieldable. In this case, a resist pattern is formed within the unexposed regions 50*b*' and 50*c*' above along with the resist patterns 51 and 52 (see FIG. 9I) to be described later by the development processing to be described later, and after the overlay measurement using the first overlay pattern OVL1 and the second overlay pattern OVL2 in the steps (see FIGS. 9I to 9J) to be described later, when the resist patterns 51 and 52 are removed, the resist patterns within the unexposed regions 50*b*' and 50*c*' above are also removed.

Figure 11B:
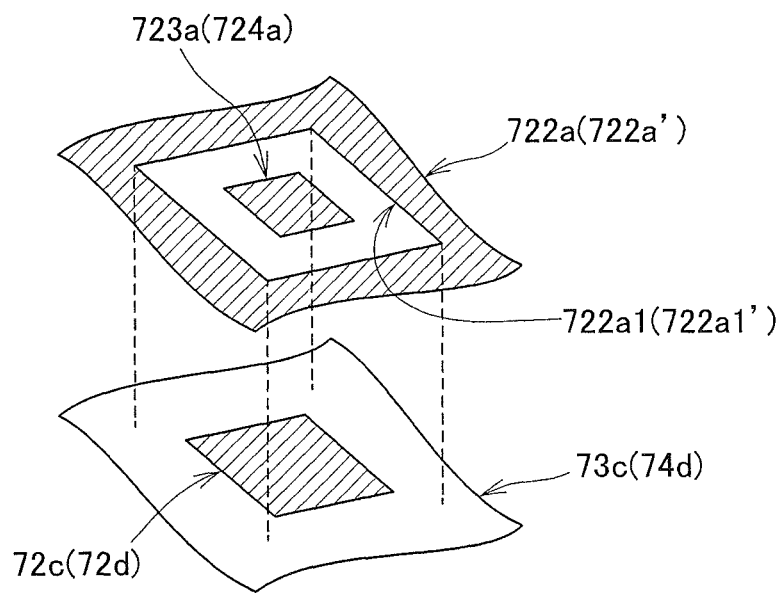
Figure 12A:
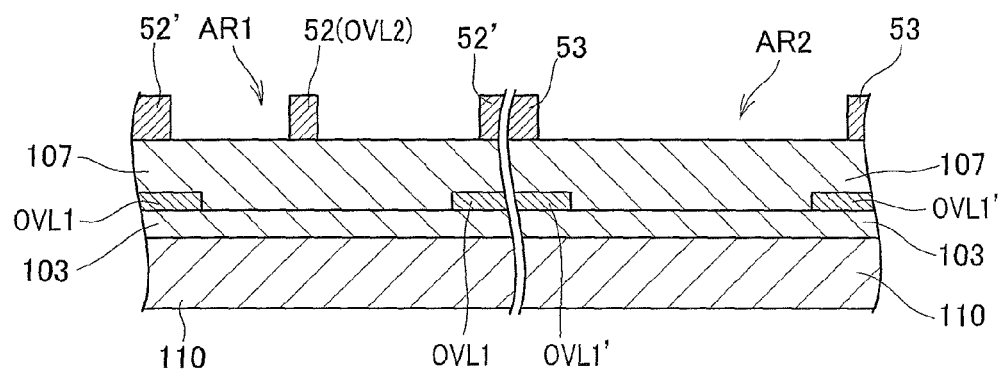
FIG. 12A is a cross-sectional view showing another example of a step to form the second overlay pattern in the manufacturing method for a reproducing head part relating to third embodiment of the present invention.
Figure 12B:
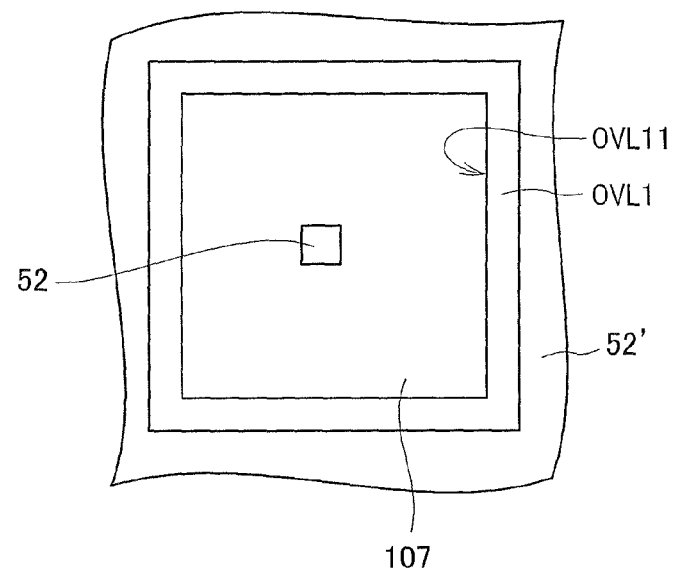
FIG. 12B is a plan view of the overlay pattern formation region shown in FIG. 12A viewed from the upper side in the lamination direction.

As shown in FIG. 11B, in the planar view of the main mask 70*a* and the second sub mask 70*c*, respectively, the light-shielding part 72*c* of the second sub mask 70*c* has sufficient size so as to enable to shield an exposure light reaching to the unexposed regions 50*a* and 50*b* due to the element light-shielding part 721*a* and the second main light-shielding part 723*a* of the main mask 70*a*, respectively. Then, when the second sub mask 70*c* and the main mask 70*a* are overlapped, the opening part 73*c* of the second sub mask 70*c* overlaps at least a region, which includes an entire inner peripheral portion 722*a*1 out of the first main light-shielding part 722*a*, and which is a partial region of the first main light-shielding part 722*a*. When the overlay measurement is conducted using the first and second overlay patterns OVL1 and OVL2 in the third embodiment, it becomes necessary to enable detection of an inner peripheral portion OVL11 of the first overlay pattern OVL1 to be formed by corresponding to the first main light-shielding part 722*a* of the main mask 70*a* (see FIG. 12B). When the second overlay pattern OVL2 (the resist pattern 52) is formed in a step(s) to be described later using the second sub mask 70*c* with the configuration above, a resist pattern 52' may be formed as shown in FIG. 12A, according to a positional relationship between the first main light-shielding part 722*a* of the main mask 70*a* and the opening part 73*c* of the second sub mask 70*c* (a positional relationship upon exposure using the main mask 70*a* and the second sub mask 70*c* (see FIGS. 9G and 9H)). However, when the second sub mask 70*c* and the main mask 70*a* are overlapped, because the opening part 73*c* overlaps at least a region, which includes the entire inner peripheral portion 722*a*1 out of the first main light-shielding part 722*a*, and which is a partial region of the first main light-shielding part 722*a*, a portion positioned at the upper side of the inner peripheral portion OVL11 of the first overlay pattern OVL1 in the lamination direction out of the unexposed region 50*c* upon the exposure using the second sub mask 70c (see FIG. 9H) is at least exposed. Therefore, even if the resist pattern 52' is formed, the inner peripheral portion OVL11 of the first overlay pattern OVL1 can be detected from the upper side in the lamination direction, and the overlay measurement can be conducted (see FIG. 12B).

Needless to say, in the third embodiment, when the main mask 70a and the second sub mask 70c are overlapped, the opening part 73c of the second mask 70c may be configured so as to cover the entire first main light-shielding part 722a of the main mask 70a.

Also, similar to that described above, when the second overlay pattern OVL2 (the resist pattern 52) is formed, the resist pattern 53 may be formed within the second region AR2 according to a positional relationship between the first main light-shielding part 722a' of the main mask 70a and the opening part 74c of the second sub mask 70c (see FIG. 12A). If the insulation layer 109 is laminated in a step(s) described later without removing this resist pattern 53, when the second sub mask 70c and the main mask 70a are overlapped, it is desirable that the opening part 74c of the second sub mask 70c overlaps at least a region, which includes the entire inner peripheral portion out of the first main light-shielding part 722a, and which is partial region of the first main light-shielding part 722a'. Because of this, in the step(s) described later, an inner peripheral portion of the first overlay pattern OVL1' can be detected upon the overlay measurement using the first overlay pattern OVL1' and the third overlay pattern OVL3 (a resist pattern 63).

Figure 9I:
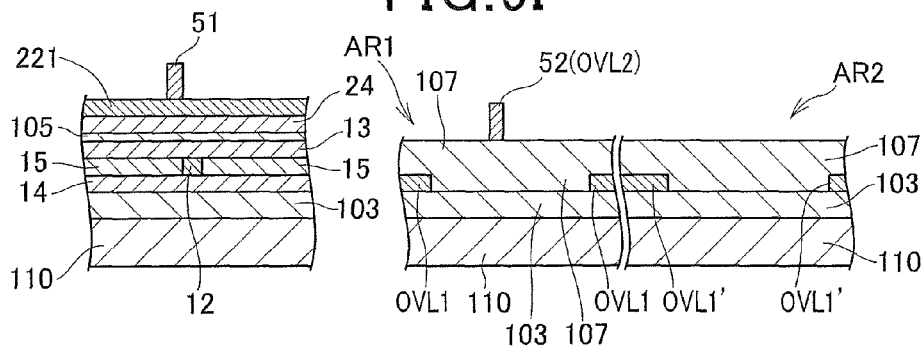

Because the positive type photoresist film 50 is exposed twice via the main mask 70a and the second sub mask 70c with the configuration above, respectively, the unexposed regions 50a and 50b due to the element light-shielding part 721a and the second main light-shielding part 323a of the main mask 70a will not be exposed, but the unexposed regions 50c, 50c' and 50b' due to the first main light-shielding parts 722a and 722a' and the third main light-shielding part 724a are exposed. After that, the resist pattern 51 corresponding to the MR part 22 of the second MR element 21 and the resist pattern 52 as the second overlay pattern OVL2 are formed as shown in FIG. 9I by the development processing using a predetermined developing solution and the like.

In this stage (a stage to form the resist patterns 51 and 52), within the first region AR1, the overlay measurement using the first overlay pattern OVL1 and the second overlay pattern OVL2 (the resist pattern 52) is conducted. With this, a position gap in the direction that is orthogonal to the lamination direction can be measured.

Figure 9J:
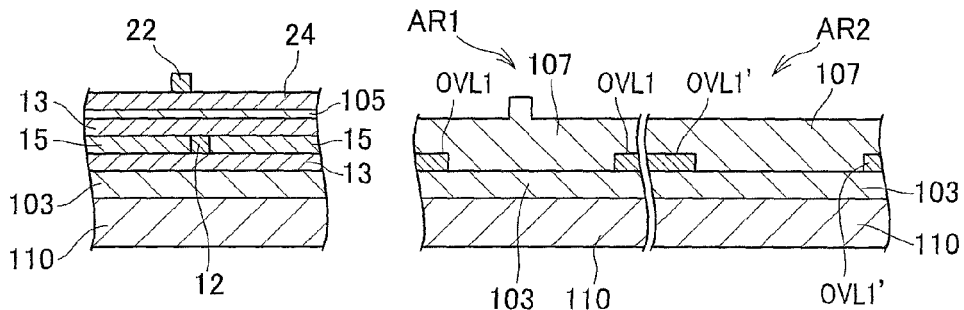

According to the overlay measurement above, when the positional accuracy in the direction that is orthogonal to the lamination direction between the first overlay pattern OVL1 and the second overlay pattern OVL2 is within a tolerance range, as shown in FIG. 9J, processing with a milling treatment is conducted using the resist pattern 51 corresponding to the MR part 22 of the second MR element 21 and the resist pattern 52 (the second overlay pattern OVL2) as masks. With this processing, the MR part 22 is formed within the element region. After that, the resist patterns 51 and 52 (the positive type photoresist film 50) are removed.

Next, after a protective film, such as a resist film, is formed within the first region AR1 and the second region AR2, the side shield layer 25 is formed at both sides of the MR part 22 in the track width direction, and the upper part shield layer 23 and the insulation layer 106 are lamination-formed on the MR part 22 and the side shield layer 25 in respective order. Then, the lower part shield layer 34 is formed on the insulation layer 106, and the third MR element layer 321 (the third pattern layer) is formed on the lower part shield layer 34 (see FIG. 9K).

Figure 9K:
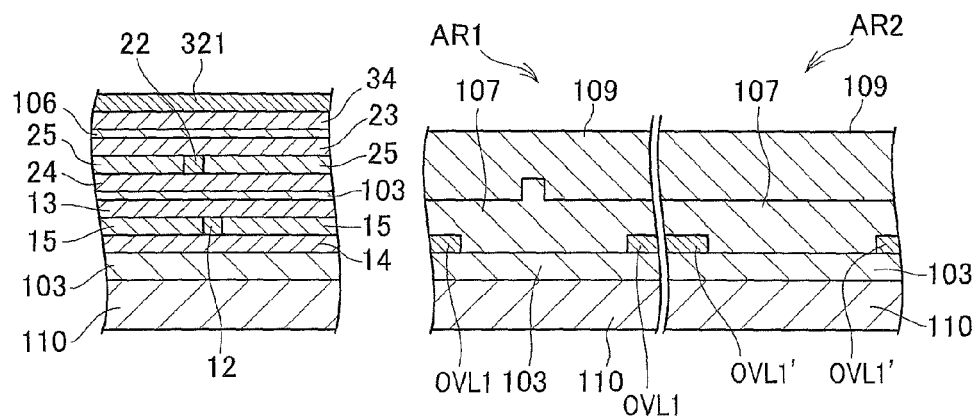

In the meantime, the insulation layer 109, such as $Al_2O_3$ or $SiO_2$, is formed on the insulation layer 107 within the first region AR1 and the second region AR2 after a protective film, such as the resist film above, is removed (see FIG. 9K). In the overlay measurement using the first overlay pattern OVL1' and the third overlay pattern OVL3, the insulation layer 109 is required to be clear so as to enable to detect the first overlay pattern OVL1'; in other words, so as to enable the permeation of a detection light in the overlay measurement instrument.

Figure 9L:
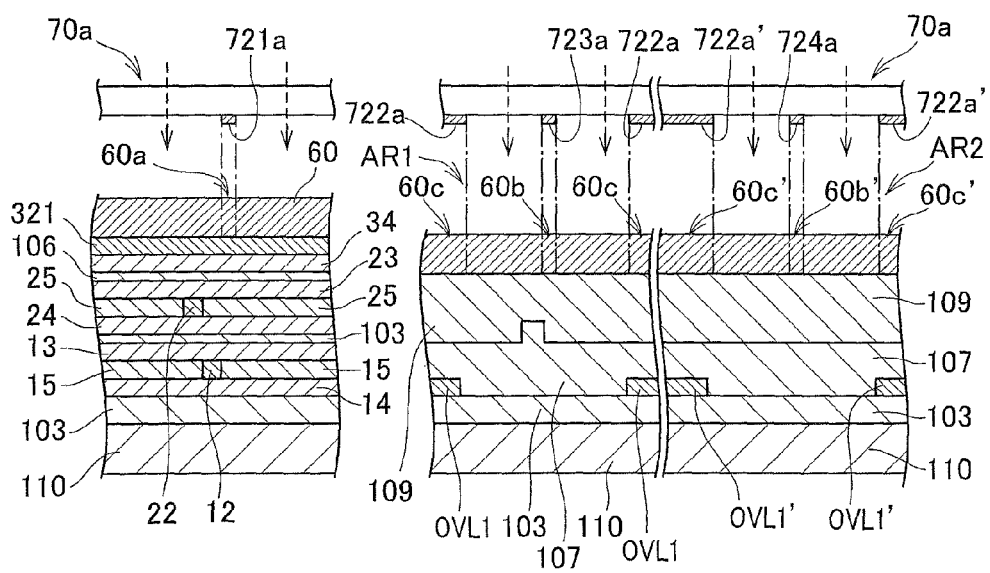

Next, as shown in FIG. 9L, a positive type photoresist film 60 (the third photoresist film) is formed on the third MR element layer 321 and the insulation layer 109, and the positive type photoresist film 60 is exposed using the main mask 70a above.

Figure 9M:
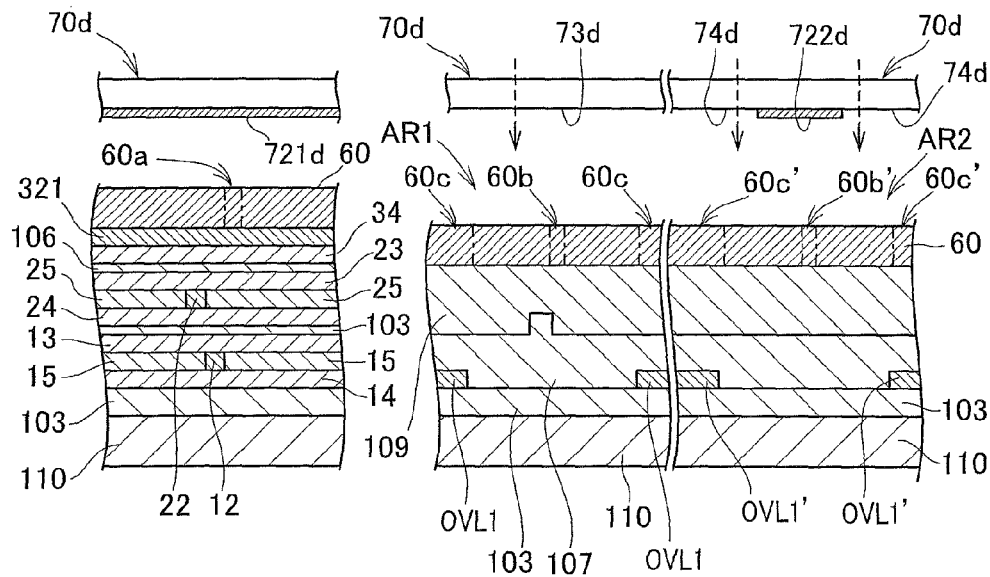
Figure 9N:
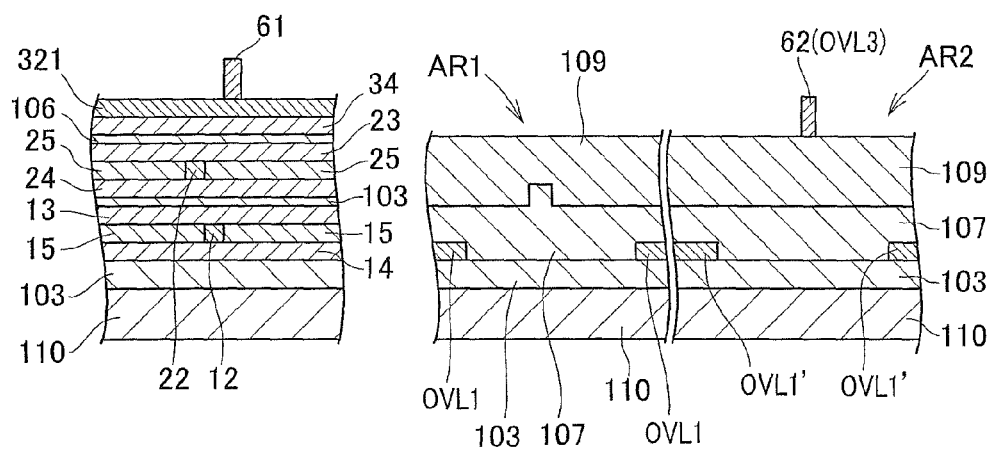

Subsequently, as shown in FIG. 9M, the positive type photoresist film 60 that has been exposed using the main mask 70a is further exposed using a third sub mask 70d.

Figure 10D:
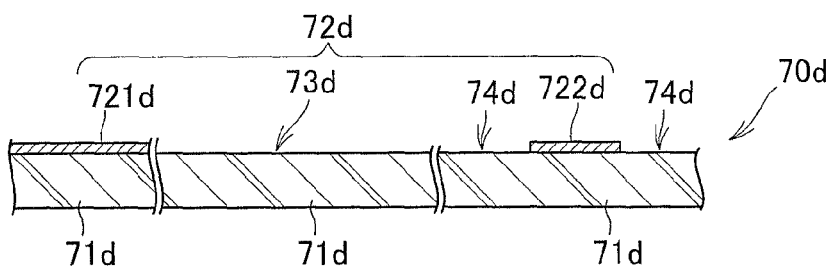

The third sub mask 70d, as shown in FIG. 10D, has a clear substrate 71d where an exposure light is permeable, a light-shielding part 72d where an exposure light is shieldable, and opening parts 73d and 74d where an exposure light reaching to unexposed regions 60b, 60c and 60c' (see FIG. 9L) on the positive type photoresist film 60 (the third photoresist film) within the overlay pattern formation region other than an unexposed region 60b' on the positive type photoresist film 60 (the third photoresist film), which has been light-shielded by the third main light-shielding part 723a (the third main light-shielding part 824a out of the first to third main light-shielding parts 722a to 742a) of the main mask 70a, so has not been exposed, is permeable. The light-shielding part 72d includes a light-shielding part 721d (a light-shielding part) where an exposure light reaching to an unexposed region 60a (see FIG. 9L) on the positive type photoresist film 60 (the third photoresist film), which has been light-shielded by the element light-shielding part 721a of the main mask 70a, and has not been exposed, is shieldable; and a light-shielding part 722d (a sub light-shielding part) where an exposure light reaching to an unexposed region 60b' (see FIG. 9L) on the positive type photoresist film 60 (the third photoresist film), which has been light-shielded by the main light-shielding part 724a, and has not been exposed, is shieldable.

Figure 12C:
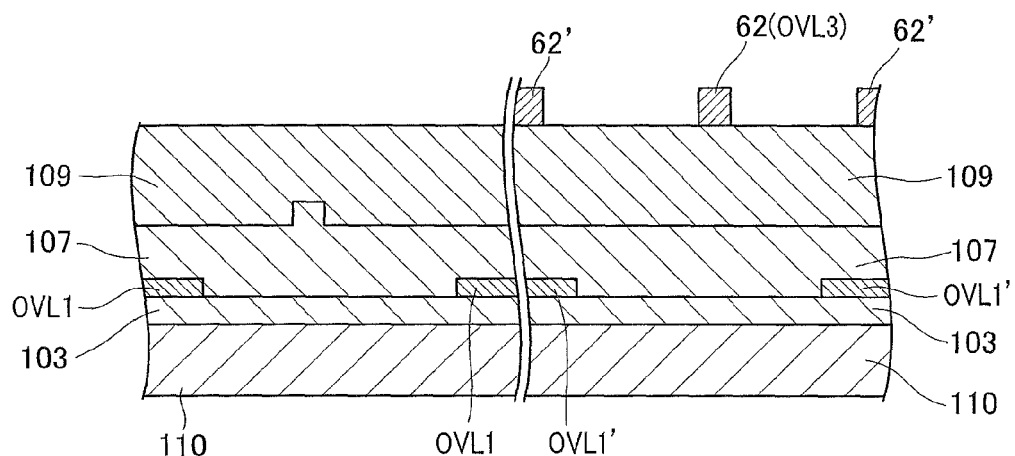
FIG. 12C is a cross-sectional view showing another example of a step to form a third overlay pattern in the manufacturing method for a reproducing head part relating to third embodiment of the present invention.
Figure 12D:
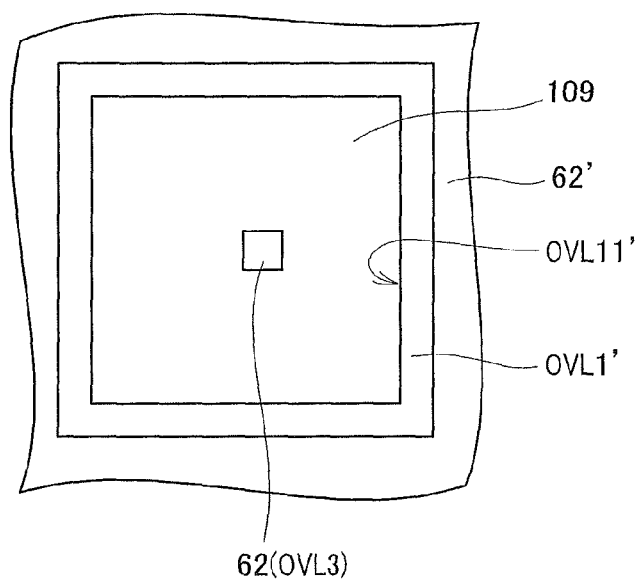
FIG. 12D is a plan view of the overlay pattern formation region shown in FIG. 12C viewed from the upper side in the lamination direction.

As shown in FIG. 11B, in the planar views of the main mask 70a and the third sub mask 70d, the light-shielding part 72d of the third sub mask 70d has sufficient size so as to enable to shield an exposure light reaching to the unexposed regions 60a and 60b' due to the element light-shielding part 721a and the third main light-shielding part 724a of the main mask 70a. Then, when the third sub mask 70d and the main mask 70a are overlapped, the opening part 74d of the third sub mask 70d overlaps at least a region, which includes the entire inner peripheral portion 722a1' out of the first main light-shielding part 722a', and which is a partial region of the first main light-shielding part 722a'. When the overlay measurement is conducted using the first and third overlay patterns OVL1' and OVL3 in the third embodiment, it becomes necessary that an inner peripheral portion OVL11' of the first overlay pattern OVL1' that is formed corresponding to the first main light-shielding part 722a' of the main mask 70a is detectable (see FIG. 12D). When the third overlay pattern OVL 3 (the resist pattern 62) in step(s) to be described later using the third sub mask 70d with the configuration above, a resist pattern 62' may be formed according to a positional relationship between the first main light-shielding part 722a' of the main mask 70a and the opening part 74d of the third sub mask 70d (a positional relationship upon exposure (see FIG. 9L and FIG. 9M) using the main mask 70a and the third sub mask 70d, respectively), as shown in FIG. 12C. However, when the third sub mask 70d and the main mask 70a are overlapped, because the opening part 74d of the third sub mask 70d overlaps at least a region, which includes the entire inner peripheral portion 722a1' out of the first main light-shielding part 722a', and which is a partial region of the first main light-shielding part 722a', upon exposure using the third sub mask 70d (see FIG. 9M), a portion that is positioned at the upper side of the inner peripheral portion OVL11' of the first overlay pattern OVL1' in the lamination direction out of the unexposed region 60c' is at least exposed. Therefore, even if the resist pattern 62' is formed, the inner peripheral portion OVL11' of the first overlay pattern OVL1' can be detected from the upper side of the lamination direction and the overlay measurement can be conducted. (see FIG. 12D).

Needless to say, in the third embodiment, when the main mask 70a and the third sub mask 70d are overlapped, the opening part 74d of the third sub mask 70d may be configured so as to cover the entire first main light-shielding part 722a' of the main mask 70a.

Because the positive photoresist film 60 is exposed twice via the main mask 70a with the configuration above and the third sub mask 70d, respectively, the unexposed regions 60a and 60b' due to the element light-shielding part 721a and the third main light-shielding 724a of the main mask 70a will not be exposed, but the unexposed regions 60c, 60c' and 60b due to the first main light-shielding parts 722a and 722a' and the second main light-shielding part 723a are exposed. After that, because of the development process using a predetermined developing solution and the like, as shown in FIG. 9N, the resist pattern 61 corresponding to the MR part 32 of the third MR element 31 and the resist pattern 62 as the third overlay pattern OVL3 are formed.

In this stage (a stage to form the resist patterns 61 and 62), in the second region AR2, the overlay measurement is conducted using the first overlay pattern OVL1' and the third overlay pattern OVL3 (the resist pattern 62).

When a positional accuracy in a direction that is orthogonal to the lamination direction between the first overlay pattern OVL1' and the third overlay pattern OVL3 is within a tolerance range due to the overlay measurement above, processing with a milling treatment to the third MR element layer 321 is performed using the resist pattern 61 as a mask, and the MR part 32 is formed. After that, the reproducing head part 101A where the first MR element 11, the second MR element 21 and the third MR element 31 are arranged along the lamination direction can be manufactured by forming the side shield layer 35 and the upper part shield layer 33.

Furthermore, in the third embodiment above, when the positive photoresist film 60 (the third photoresist film) is exposed using the third sub mask, the unexposed region 60c due to the first main light-shielding part 722a and the unexposed region 60b due to the second main light-shielding part 723a are exposed via the opening part 73c of the third sub mask 70d, but the present invention shall not be limited to such a mode. For example, the unexposed regions 60b and 60c above do not have to be exposed upon the exposure using the third sub mask. In other words, resist patterns corresponding to the unexposed regions 60b and 60c above may be formed.

As described above, in the manufacturing method for a reproducing head part relative to the third embodiment, since the first overlay patterns OVL1 and OVL1', the second overlay pattern OVL2 and the third overlay pattern OVL3 can be formed using one main mask, respectively, compared to the case of using three different masks in order to form the first to third overlay patterns OVL1 to OVL3, a decrease in the positional accuracy based upon a manufacturing error among the masks will not occur. Consequently, according to the third embodiment, a thin film magnetic head having a reproducing head having high positional accuracy in the direction that is orthogonal to the lamination direction of the first MR element 11, the second MR element 21 and the third MR element 31 can be manufactured.

Therefore, each overlay pattern that has high positional accuracy in the direction that is orthogonal to the lamination direction can be formed by manufacturing a pattern multilayer body using the mask set including the main mask 70a having the element light-shielding part 721a, the first main light-shielding part 722a, the second main light-shielding part 723a and the third main light-shielding part 724a, the first sub mask 70b having the predetermined opening parts 73b and 74b, the second sub mask 70c having the predetermined opening 73c and 74c, and the third sub mask 70d having the predetermined opening parts 73d and 74d.

Fourth Embodiment

As the manufacturing method for a reproducing head part relating to a fourth embodiment, a method for manufacturing a reproducing head part (a reproducing head part having the configuration shown in FIG. 3B) where the first MR element 11, the second MR element 21 and the third MR element 31 are arranged along a lamination direction is explained as an example. FIGS. 13A to 13M are cross-sectional views schematically showing each step of the manufacturing method for a reproducing head part relating to the fourth embodiment. Furthermore, in FIGS. 13A to 13M, manufacturing steps of the reproducing head part are shown on the left side, and manufacturing steps of the overlay pattern are shown on the right side. Also, in the fourth embodiment, the configuration, which is nearly similar to those of the first to third embodiments, is marked with the same symbols, and their detailed explanations will be omitted.

In the fourth embodiment, two regions (a first region and a second region) are set within an overlay pattern formation region, and the first overlay pattern OVL1 and the second overlay pattern OVL2 are formed within the first region, and the second overlay pattern OVL2' and the third overlay pattern OVL3 are formed within the second region. In this point, the manufacturing method for a reproducing head part relating to the fourth embodiment is different from that relating to the third embodiment.

In the fourth embodiment, similar to the third embodiment, at first, an element region and the first region AR1 and the second region AR2 are set on the substrate 110. Then, the lower part shield layer 14 is formed on the element region through the intervention of the insulation layer 103, and the first MR element layer 121 (the first pattern layer) is formed on the lower part shield layer 14. In the meantime, the first MR element layer 121 is formed on the first region AR1 and the second region AR2 through the intervention of the insulation layer 103, respectively (see FIG. 9A).

Figure 13A:
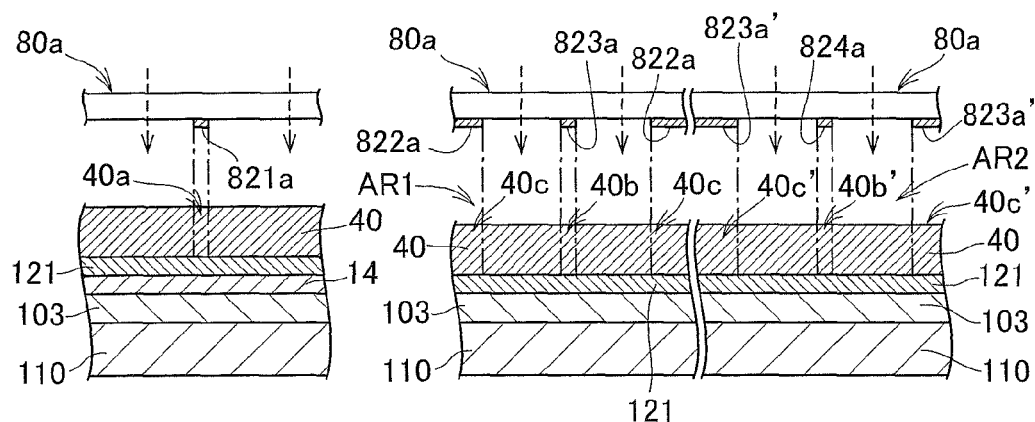
FIGS. 13A to 13M are cross-sectional views showing each step of the manufacturing method for a reproducing head part relating to fourth embodiment of the present invention, following FIG. 9A.

Next, as shown in FIG. 13A, the positive type photoresist film 40 (the first photoresist film) is formed on the first MR element layer 121, and the positive type photoresist film 40 is exposed via a main mask having a predetermined light-shielding part.

Figure 14A:
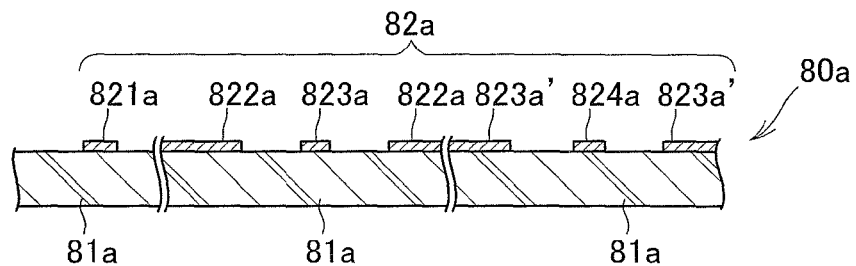
FIGS. 14A to 14D are cross-sectional views showing a configuration of each mask in the mask set that is used in the manufacturing method for a reproducing head part shown in FIGS. 13A to 13M.

The main mask 80a, as shown in FIG. 14A, has a clear substrate 81a where an exposure light is permeable and a light-shielding part 82a that is formed on one surface of the clear substrate 81a, and where an exposure light is shieldable.

The light-shielding part 82a includes an element light-shielding part 821a (a pattern light-shielding part) that is commonly used for forming the MR parts 12 to 32 of the first to third MR elements 11 to 31, a first main light-shielding part 822a for forming the first overlay pattern OVL1 within the first region AR1, second main light-shielding parts 823a and 823a' for forming the second overlay patterns OVL2 and OVL2' within the first region AR1 and the second region AR2, respectively, and a third main light-shielding part 824a for forming the third overlay pattern OVL3 within the second region AR2. The element light-shielding part 821a, the first main light-shielding part 822a, the second main light-shielding parts 823a and 823a' and the third main light-shielding part 824a of the main mask 80a have configurations, dimensions and the like corresponding to those of the MR parts 12 to 32 of the MR elements 11 to 31, the first overlay pattern OVL1, the second overlay patterns OVL2 and OVL2' and the third overlay pattern OVL3, respectively.

Figure 13B:
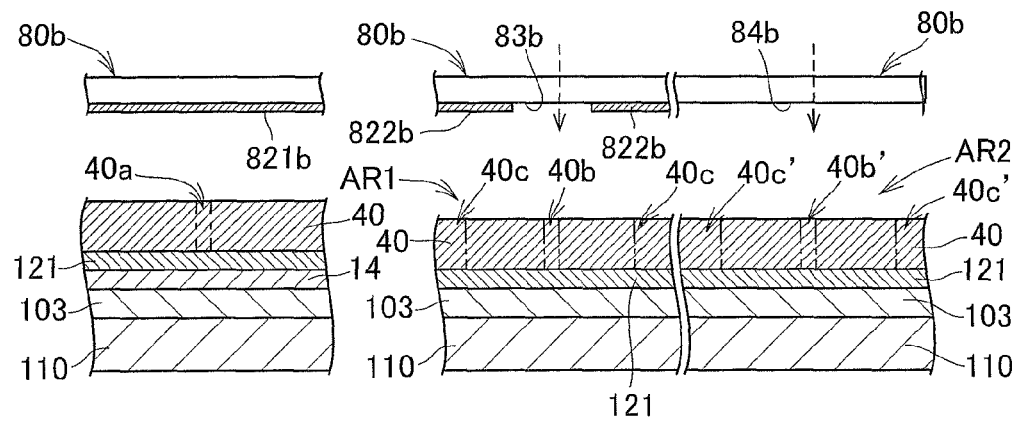

Subsequently, as shown in FIG. 13B, the positive photoresist film 40 that has been exposed via the main mask 80a is further exposed via a first sub mask 80b.

Figure 14B:
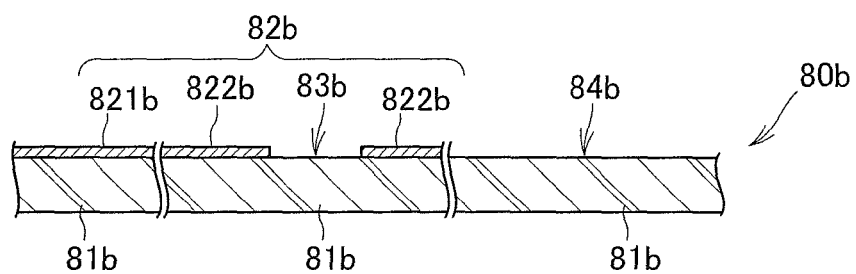

The first sub mask 80b, as shown in FIG. 14B, has a clear substrate 81b where an exposure light is permeable, a light-shielding part 82b where an exposure light is shieldable, and opening parts 83b and 84b where an exposure light reaching to the unexposed regions 40b, 40b' and 40c' (see FIG. 13A) on the positive type photoresist film 40 (the first photoresist film) within the overlay pattern formation region other than the unexposed region 40c on the positive type photoresist film 40 (the first photoresist film), which has been light-shielded by the first main light-shielding part 822a (the first main light-shielding part 822a out of the first to third main light-shielding parts 822a to 824a) of the main mask 80a, and has not been exposed, is permeable. The light-shielding part 82b includes a light-shielding part 821b (a light-shielding part) where an exposure light reaching to the unexposed region 40a (see FIG. 13A) on the positive type photoresist film 40 (the first photoresist film), which has been light-shielded by the element light-shielding part 821a of the main mask 80a, and has not been exposed, is shieldable, and a light-shielding part 822b (a sub light-shielding part) where an exposure light reaching to the unexposed region 40c (see FIG. 13A) on the positive type photoresist film 40 (the first photoresist film), which has been light-shielded by the first main light-shielding part 822a, so has not been exposed, is shieldable.

Figure 15A:
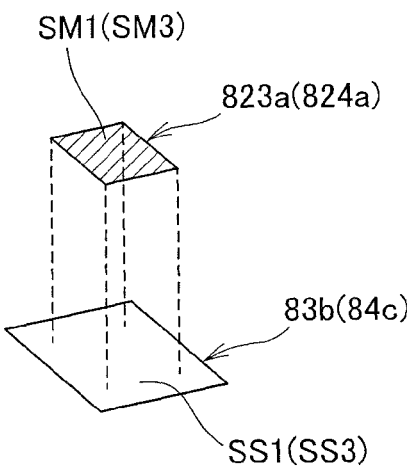
FIGS. 15A and 15B are plan views showing a relationship between a light-shielding part and an opening part of each mask in the mask set shown in FIGS. 14A to 14D.

As shown in FIG. 15A, in the planar view of a region that is equivalent to the first region AR1 in the main mask 80a and the first sub mask 80b, respectively, when the opening area SS1 that is regulated with an external form of the opening part 83b of the first sub mask 80b and the light-shielded area SM1 that is regulated with an external form of the second main light-shielding part 823a of the main mask 80a are compared, it is preferable to be in a relationship where the opening area SS 1 includes the light-shielded area SM1. In other words, when the main mask 80a and the first sub mask 80b are overlapped, for the opening area SS1 and the light-shielded area SM1, the light-shielded area SM1 is completely covered with (included in) the opening area SS1, and, they have a relationship where an area of the opening area SS1 (an area in the planar view) is greater than an area of the light-shielded area SM1 (an area in the planar view).

In the meantime, the light-shielding part 82b of the first sub mask 80b has sufficient size so as to enable to shield an exposure light reaching to the unexposed regions 40a and 40c (see FIG. 13A) due to the element light-shielding part 821a and the first main light-shielding part 822a of the main mask 80a.

Figure 13C:
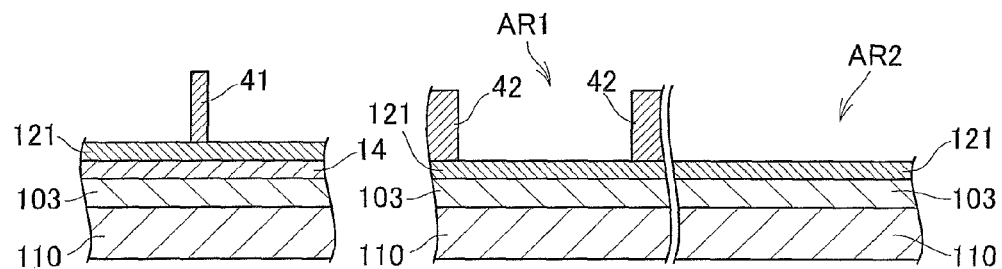

Because the positive type photoresist film 40 is exposed twice via the main mask 80a and the first sub mask 80b having such a configuration, respectively, the unexposed regions 40a and 40c due to the element light-shielding part 821a and the first main light-shielding part 822a of the main mask 80a will not be exposed, but the unexposed regions 40b, 40b' and 40c' due to the second main light-shielding part 823a and 823a' and the third main light-shielding part 824a are exposed. After that, because of the development process using a predetermined developing solution and the like, as shown in FIG. 13C, the resist pattern 41 corresponding to the MR part 12 of the first MR element 11 and the resist pattern 42 corresponding to the first overlay pattern OVL1 are formed.

Furthermore, when the resist pattern 42 is formed, a resist pattern may be formed within the second region AR2 according to a positional relationship between the second main light-shielding part 823a' of the main mask 80a and the opening part 84b of the first sub mask 80b. Then, a pattern is formed within the second region AR2 corresponding to this resist pattern upon processing with a milling treatment to be described later. In such a case, when the first sub mask 80b and the main mask 80a are overlapped, it is desirable that the opening part 84b of the sub mask 80b overlaps at least a region which includes the entire inner peripheral portion out of the second main light-shielding part 823a', and which is a partial region of the second main light-shielding part 823a'. With this design, in a step(s) to be described later, the inner peripheral portion of the second overlay pattern OVL2' can be detected with a high accuracy upon the overlay measurement using the second overlay pattern OVL2' and the third overlay pattern OVL3 (the resist pattern 62).

Figure 13D:
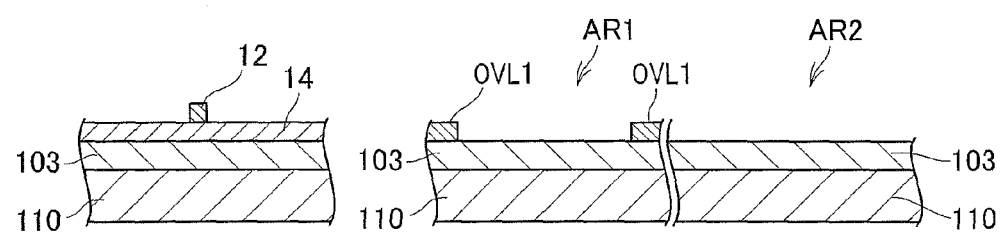

Next, as shown in FIG. 13D, processing with a milling treatment is performed to the first MR element layer 121 using the resist patterns 41 and 42 as masks. With this processing, the MR part 12 and the first overlay pattern OVL1 are formed.

Subsequently, after a protective film, such as a resist film, is formed within the first region AR1 and the second region AR2, the side shield layer 15 is formed at both sides of the MR part 12 in the track width direction, and the upper part shield layer 13 and the insulation layer 105 are lamination-formed on the MR part 12 and the side shield layer 15 in respective order. Then, the lower part shield layer 24 is formed on the insulation layer 105 (see FIG. 13E).

Figure 13E:
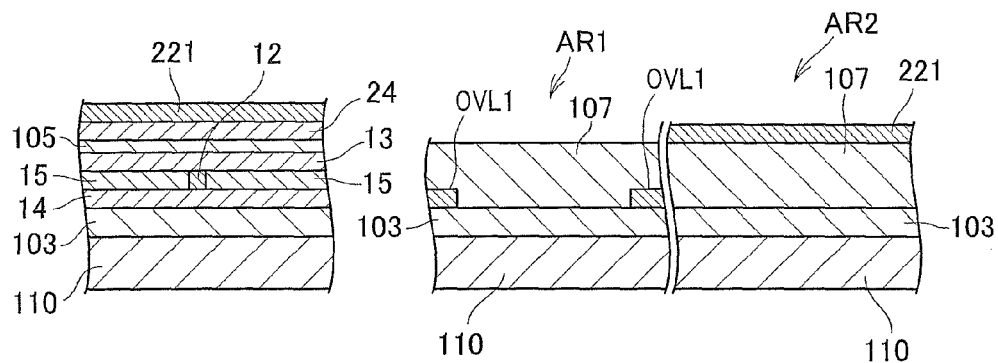

In the meantime, the insulation layer 107, $Al_2O_3$, $SiO_2$ or the like, is formed on the first overlay pattern OVL1 and the insulating layer 103 of the second region (see FIG. 13E). The insulation layer 107, in the overlay measurement using the first overlay pattern OVL1 and the second overlay pattern OVL2, is required to be clear so as to enable the first overlay pattern OVL1 to be detected; in other words, so as to enable the permeation of a detection light in the overlay measurement instrument.

Figure 13F:
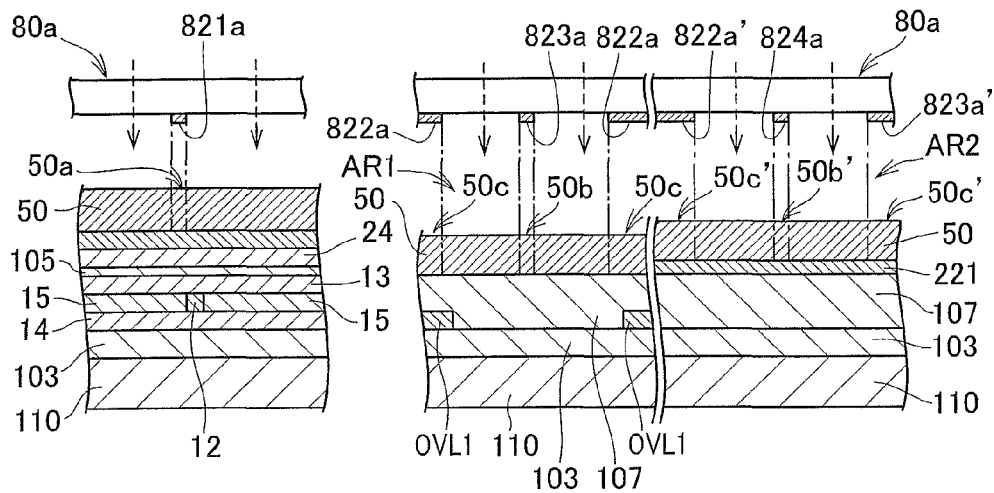

Next, as shown in FIG. 13E, the second MR element layer 221 (the second pattern layer) is formed on the lower part shield layer 24, and, the second MR element layer 221 is formed on the insulation layer 107 within the second region AR2. Then, as shown in FIG. 13F, the positive type photoresist film 50 (the second photoresist film) is formed on the second MR element layer 221 and the insulation layer 107 within the first region AR1, and the positive type photoresist film 50 is exposed via the main mask 80a above.

Figure 13G:
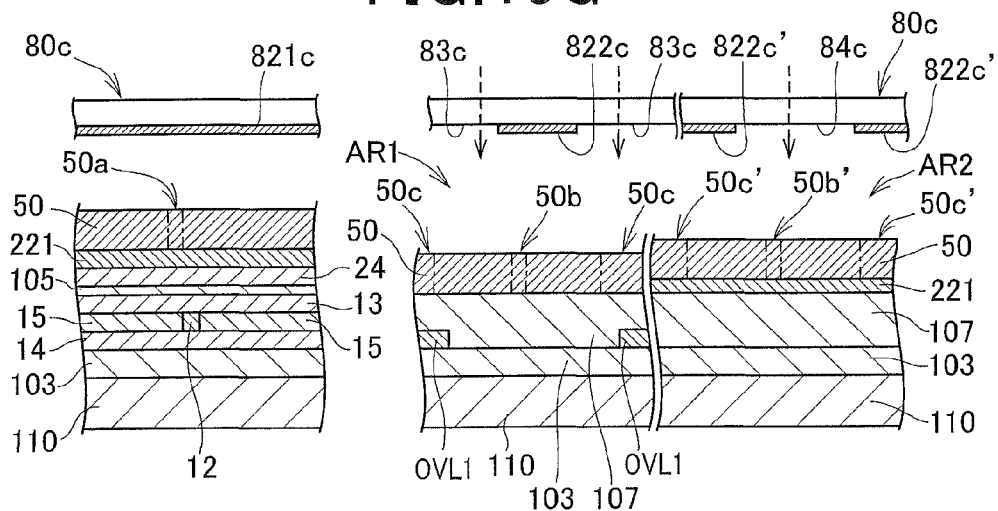

Subsequently, as shown in FIG. 13G, the positive type photoresist film 50 that has been exposed via the main mask 80a is further exposed via a second sub mask 80c.

Figure 14C:
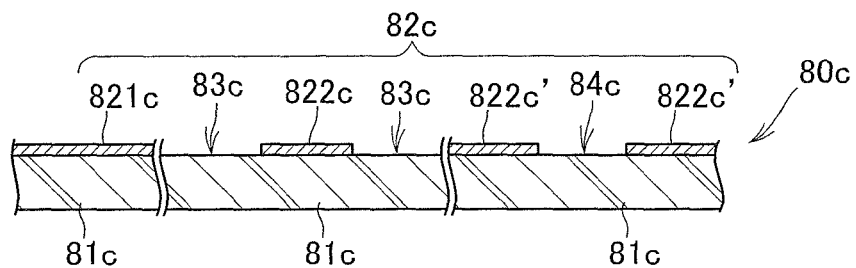

The second sub mask 80c, as shown in FIG. 14C, has a clear substrate 81c where an exposure light is permeable; a light-shielding part 82*c* where an exposure light is shieldable; and opening parts 83*c* and 84*c* where an exposure light reaching to the unexposed regions 50*b* and 50*c'* on the positive type photoresist film 50 (the second photoresist film) within the overlay pattern formation region other than the unexposed regions 50*b* and 50*c'* on the positive type photoresist film 50 (the second photoresist film), which has been light-shielded due to the second main light shielding parts 823*a* and 823*a'* (the second main light-shielding parts 823*a* and 823*a'* out of the first to third main light-shielding parts 822*a* to 824*a*) of the main mask 80*a*, so has not been exposed, is permeable. The light-shielding part 82*c* includes a light-shielding part 821*c* (a light-shielding part) where an exposure light reaching to the unexposed region 50*a* (see FIG. 13F) on the positive type photoresist film 50 (the second photoresist film), which has been light-shielded due to the element light-shielding part 821*a* of the main mask 80*a*, and has not been exposed, is shieldable, and light-shielding parts 822*c* and 822*c'* (sub light-shielding parts) where an exposure light reaching to the unexposed regions 50*b* and 50*c'* (see FIG. 13F) on the positive type photoresist film 50 (the second photoresist film), which has been light-shielded by the second main light-shielding parts 823*a* and 823*a'*, and has not been exposed, is shieldable.

Figure 15B:
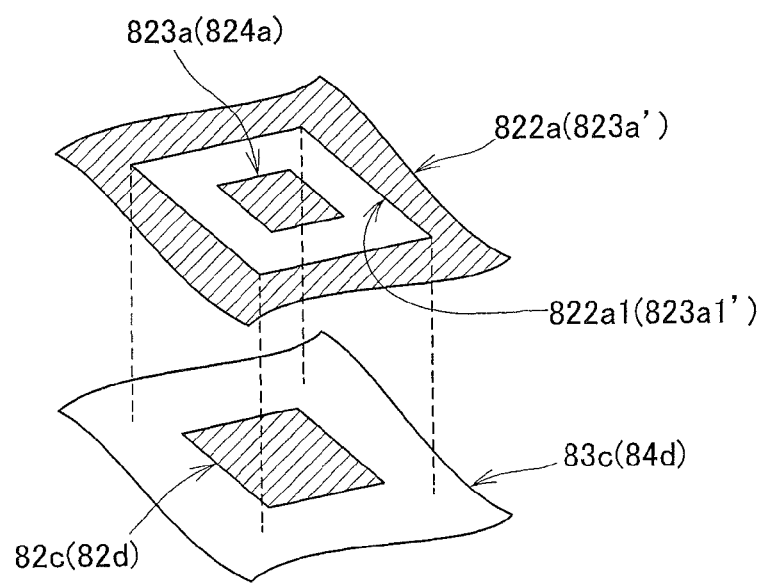
Figure 16A:
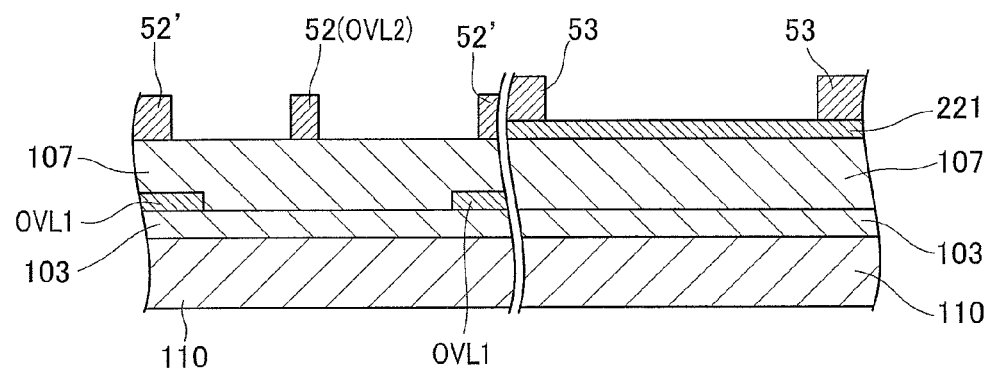
FIG. 16A is a cross-sectional view showing another example of the step to form a second overlay pattern in the manufacturing method for a reproducing head part relating to fourth embodiment of the present invention.
Figure 16B:
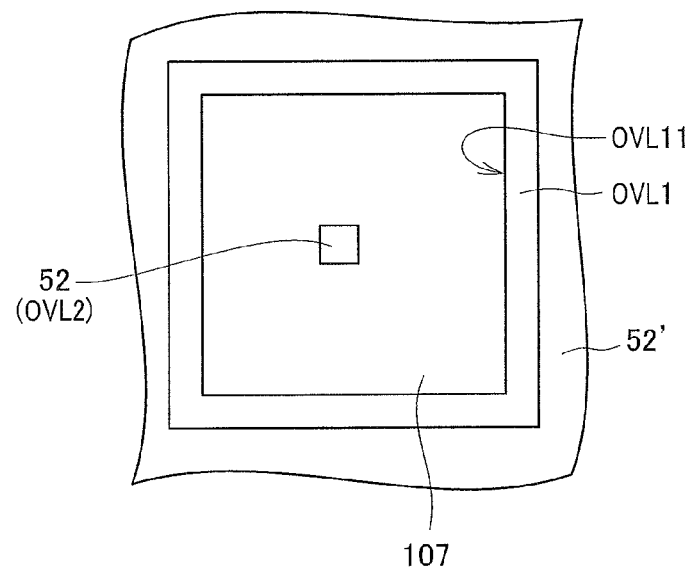
FIG. 16B is a plan view of an overlay pattern formation region shown in FIG. 16A viewed from an upper side in the lamination direction.

As shown in FIG. 15B, in the planar view of the main mask 80*a* and the second sub mask 80*c* within a region that is equivalent to the first region AR1, respectively, the light-shielding part 82*c* of the second sub mask 80*c* has sufficient size so as to shield an exposure light reaching to the unexposed regions 50*a*, 50*b* and 50*c'* due to the element light-shielding part 821*a* and the second main light-shielding parts 823*a* and 823*a'* of the main mask 80*a*. Then, when the second sub mask 80*c* and the main mask 80*a* are overlapped, the opening part 83*c* of the second sub mask 80*c* overlaps at least a region, which includes the entire inner peripheral portion 822*a*1 out of the first main light-shielding part 822*a*, and which is a partial region of the first main light-shielding part 822*a*. In the fourth embodiment, when the overlay measurement is conducted using the first and second overlay patterns OVL1 and OVL2, it becomes necessary that the inner peripheral portion OVL11 of the first overlay pattern OVL1 tha is formed by corresponding to the first main light-shielding part 822*a* of the main mask 80*a* is detectable (see FIG. 16B). When the second overlay pattern OVL2 (the resist pattern 52) is formed in a step(s) to be described later using the second sub mask 80*c* with the configuration above, the resist pattern 52' may be formed as shown in FIG. 16A according to a positional relationship between the first main light-shielding part 822*a* of the main mask 80*a* and the opening part 83*c* of the second sub mask 80*c* (a positional relationship upon exposure using the main mask 80*a* and the second sub mask 80*c* (see FIG. 13F and FIG. 13G), respectively). However, when the second sub mask 80*c* and the main mask 80*a* are overlapped, because the opening part 83*c* of the second sub mask 80*c* overlaps at least a region, which includes the entire inner peripheral portion 822*a*1 out of the first main light-shielding part 822*a*, and which is a partial region of the first main light-shielding part 822*a*, a portion positioned at the upper side in the lamination direction of the inner peripheral portion OVL11 of the first overlay pattern OVL1 out of the unexposed region 50*c* is at least exposed upon exposure using the second sub mask 80*c* (see FIG. 13G). Therefore, even if the resist pattern 52' is formed, the inner peripheral portion OVL11 of the first overlay pattern OVL1 can be detected from the upper side in the lamination direction, and the overlay measurement can be conducted (see FIG. 16B).

Needless to say, in the fourth embodiment, when the main mask 80*a* and the second sub mask 80*c* are overlapped, the opening 83*c* of the second sub mask 80*c* may be configured so as to cover the entire first main light-shielding part 822*a* of the main mask 80*a*.

Also, as shown in FIG. 15A, when an opening area SS3 regulated with an external form of an opening 84 of the second sub mask 80*c* and a light-shielded area SM3 regulated with an external form of the third main light-shielding part 824*a* of the main mask 80*a* in the planar view of the main mask 80*a* and the second sub mask 80*c* within a region that is equivalent to the second region AR2, respectively, are compared, it is preferable to be in a relationship where the opening area SS3 includes the light-shielded area SM3. In other words, when the main mask 80*a* and the second sub mask 80*c* are overlapped, it is preferable that the opening area SS3 and the light-shielded area SM3 have a relationship where the light-shielded area SM3 is completely covered with (included in) the opening area SS3, and an area of the opening area SS3 (an area in the planar view) is greater than that of the light-shielded area SM3 (an area in the planar view).

Figure 13H:
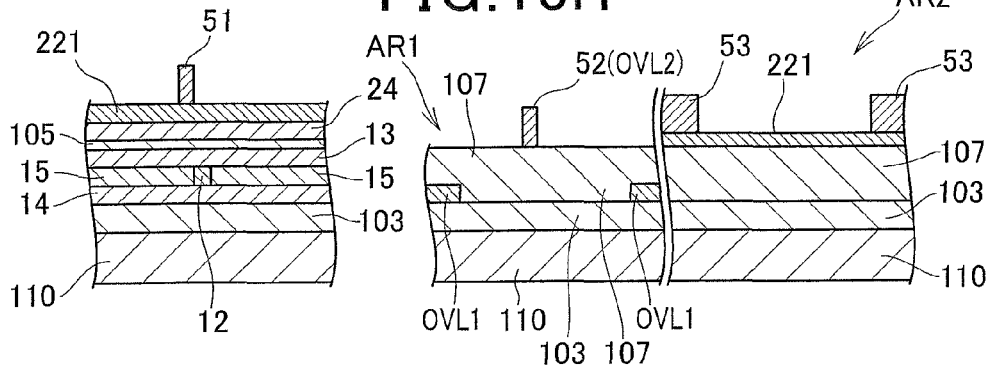

Because the positive type photoresist film 50 is exposed twice via the main mask 80*a* and the second sub mask 80*c* having the configuration above, respectively, the unexposed regions 50*a*, 50*b* and 50*c'* due to the element light-shielding part 821*a* and the second main light-shielding parts 823*a* and 823*a'* of the main mask 80*a* will not be exposed, but the unexposed regions 50*c* and 50*b'* due to the first main light-shielding part 822*a* and the third main light-shielding part 824*a* are exposed. After that, as shown in FIG. 13H, the resist pattern 51 corresponding to the MR part 22 of the second MR element 21, the resist pattern 52 as the second overlay pattern OVL2 in the first region AR1 and the resist pattern 53 corresponding to the overlay pattern OVL2' within the second region AR2 are formed by the development process using a predetermined developing solution and the like.

In this stage (a stage to form the resist patterns 51 to 53), within the first region AR1, the overlay measurement is conducted using the first overlay pattern OVL1 and the second overlay pattern OVL2 (the resist pattern 52). With this measurement, a position gap in a direction that is orthogonal to the lamination direction can be measured.

Figure 13I:
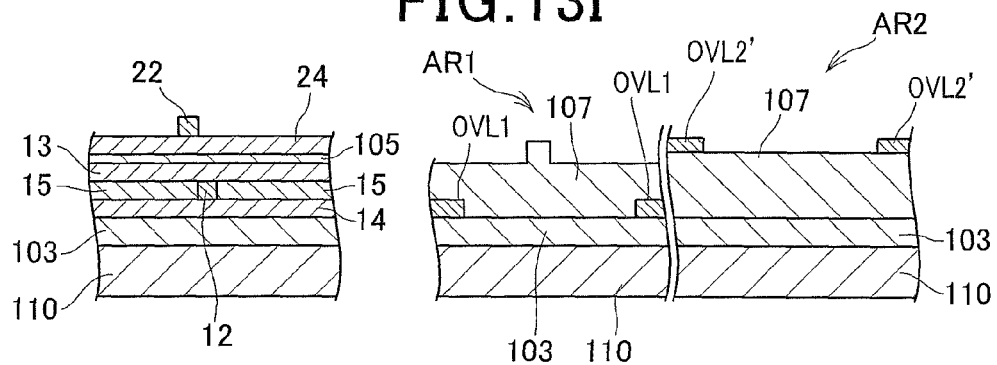

Due to the overlay measurement above, within the first region AR1, when a positional accuracy in a direction that is orthogonal to the lamination direction between the first overlay pattern OVL1 and the second overlay pattern OVL2 is within a tolerance range, processing with a milling treatment to the second MR element layer 221 is performed using resist patterns 51 and 53 as masks, and the MR part 22 is formed within the element region, and, the second overlay pattern OVL2' is formed within the second region AR2 (see FIG. 13I).

Next, after a protective film, such as a resist film, is formed within the first region AR1 and the second region AR2, the side shield layer 25 is formed at both sides of the MR part 22 in the track width direction, and the upper part shield layer 23 and the insulation layer 106 are lamination-formed on the MR part 22 and the side shield layer 25 in respective order. Then, the lower part shield layer 34 is formed on the insulation layer 106, and the third MR element layer 321 (a third pattern layer) is formed (see FIG. 13J).

Figure 13J:
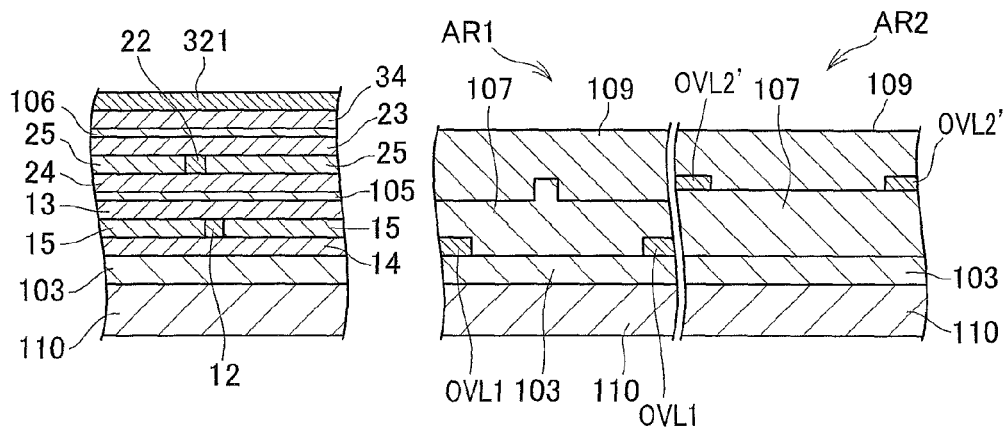

In the meantime, the insulation layer 109, such as $Al_2O_3$ or $SiO_2$, is formed on the insulation layer 107 within the first region AR1 and the second overlay pattern OVL2' within the second region AR2 (see FIG. 13J). The insulation layer 109, in the overlay measurement using the second overlay pattern OVL2' within the second region AR2 and the third overlay pattern OVL3, is required to be clear so as to enable to detect the overlay pattern OVL2'; in other words, so as to enable the permeation of a detection light in the overlay measuring instrument.

Figure 13K:
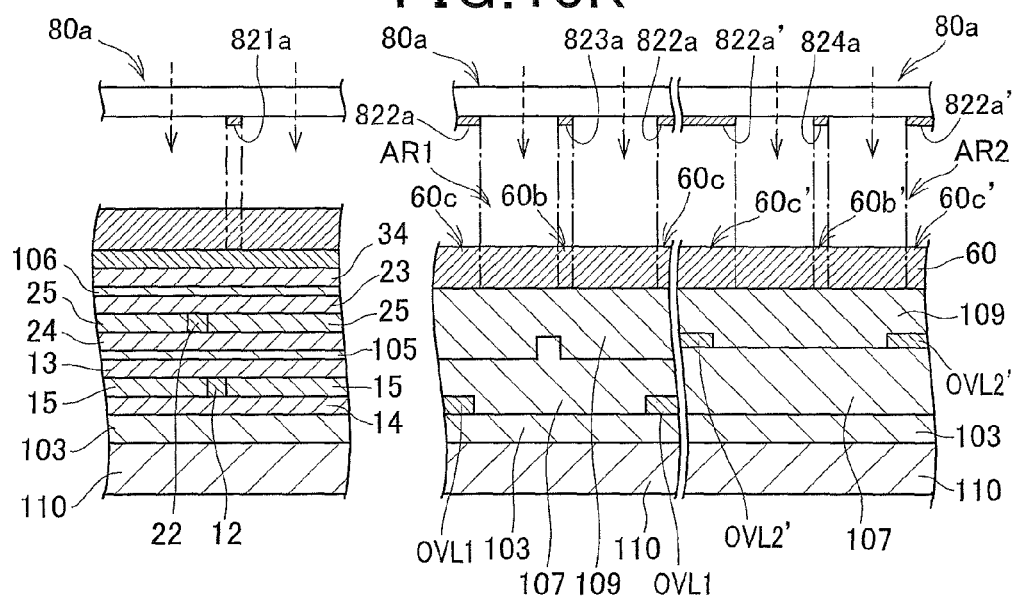

Next, as shown in FIG. 13K, the positive type photoresist film 60 (the third photoresist film) is formed on the third MR element layer 321 and the insulation layer 109, and the positive photoresist film 60 is exposed via the main mask 80a above.

Figure 13L:
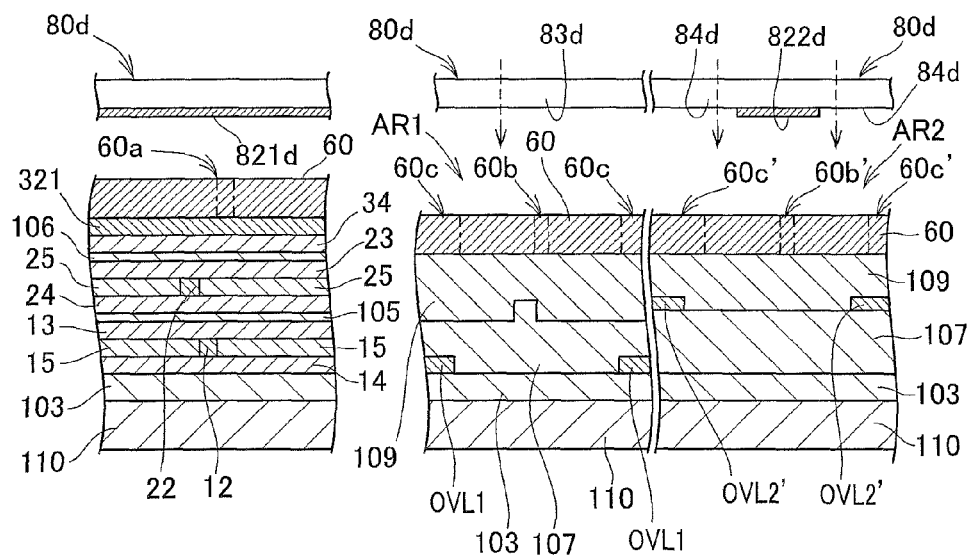

Subsequently, as shown in FIG. 13L, the positive type photoresist film 60 that has been exposed via the main mask 80a is further exposed via a third sub mask 80d.

Figure 14D:
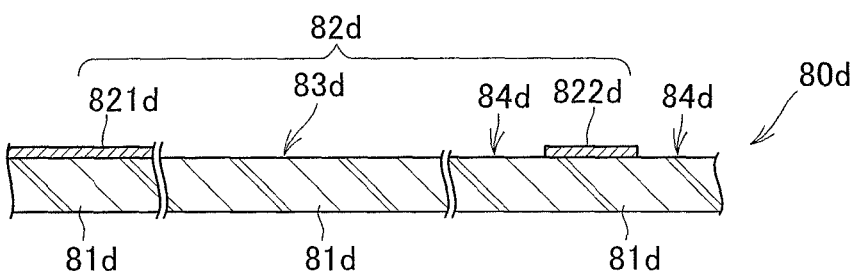

The third sub mask 80d, as shown in FIG. 14D, has a clear substrate 81d where an exposure light is permeable; a light-shielding part 82d where an exposure light is shieldable; and opening parts 83d and 84d where an exposure light reaching to unexposed regions 60b, 60c and 60c' (see FIG. 13K) on the positive type photoresist film 60 (the third photoresist film) within the overlay pattern formation region other than the unexposed region 60b' on the positive type photoresist film 60 (the third photoresist film), which has been light-shielded by the third main light-shielding part 824a of the main mask 80a (the third main light-shielding part 824a out of the first to third main light-shielding parts 822a to 824a), and has not been exposed, is permeable. The light-shielding part 82d includes a light-shielding part 821d (a light-shielding part) where an exposure light reaching to the exposed region 60a (see FIG. 13K) on the positive type photoresist film 60 (the third photoresist film), which has been light-shielded by the element light-shielding part 821a of the main mask 80a, and has not been exposed, is shieldable; and a light-shielding part 822d (a sub light-shielding part) where an exposure light reaching to the unexposed region 60b' (see FIG. 13K) on the positive photoresist film 60 (the third photoresist film), which has been shielded by the third main light-shielding part 824a, and has not been exposed, is shieldable.

Figure 16C:
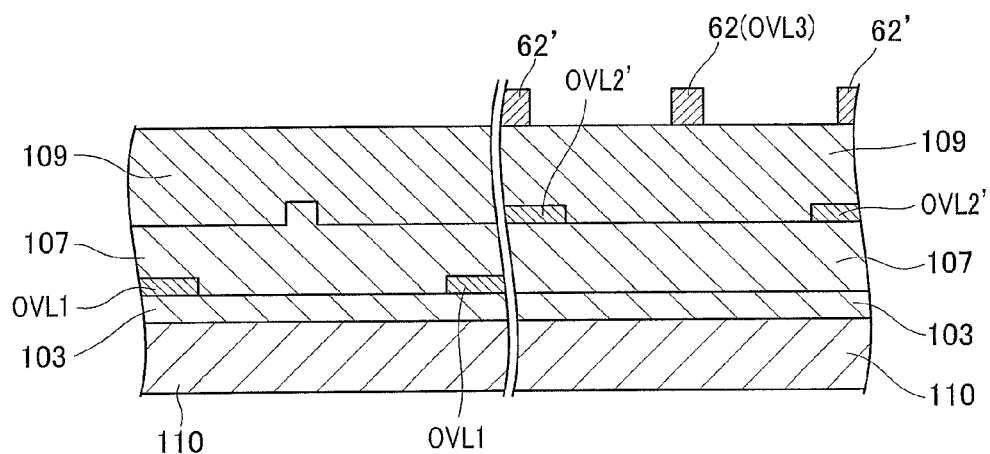
FIG. 16C is a cross-sectional view showing another example of a step to form a third overlay pattern in the manufacturing method for a reproducing head part relating to fourth embodiment of the present invention.
Figure 16D:
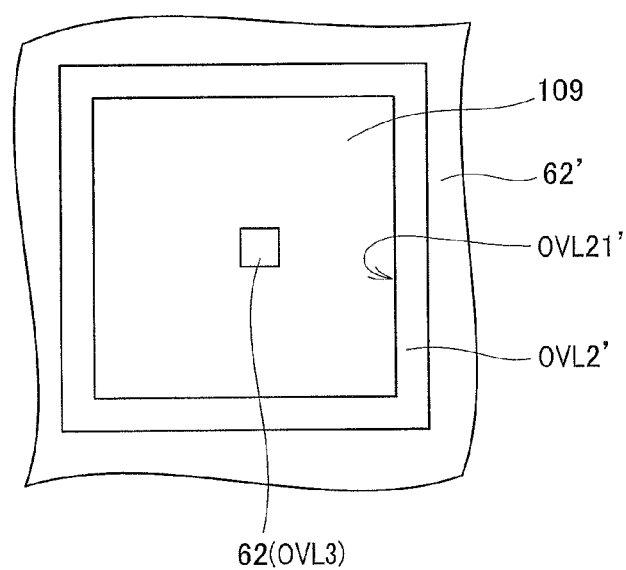
FIG. 16D is a plan view of an overlay pattern formation region shown in FIG. 16C viewed from the upper side in the lamination direction.

As shown in FIG. 15B, in the planar view of a region, which is equivalent to the second region AR2, of the main mask 80a and the third sub mask 80d, respectively, the light-shielding part 82d of the third sub mask 80d has sufficient size so as to enable shielding of an exposure light reaching to the unexposed regions 60a and 60b' due to the element light-shielding part 821a and the third main light-shielding part 824a of the main mask 80a. Then, when the third sub mask 80d and the main mask 80a are overlapped, the opening part 84d of the third sub mask 80d overlaps at least a region, which includes the entire inner peripheral portion 823a1' out of the second main light-shielding part 823a', and which is a partial region of the second main light-shielding part 823a'. When the overlay measurement is conducted using the second and third overlay patterns OVL2' and OVL3 in the fourth embodiment, it becomes necessary that the inner peripheral portion OVL21' of the second overlay pattern OVL2' that is formed by corresponding to the second main light-shielding part 823a' of the main mask 80a is detectable (see FIG. 16D). When the third overlay pattern OVL3 (a resist pattern 62) is formed using the third sub mask 80d having the configuration above in a step(s) to be described later, a resist pattern 62' may be formed according to a positional relationship between the second main light-shielding part 823a' of the main mask 80a and the opening part 84d of the third sub mask 80d (a positional relationship upon exposure using the main mask 80a and the third sub mask 80d (see FIGS. 13K and 13L), respectively), as shown in FIG. 16C. However, when the third sub mask 80d and the main mask 80a are overlapped, because the opening part 84d of the third sub mask 80d overlaps at least a region, which includes the entire inner peripheral portion 823a1' out of the second main light-shielding part 823a', and which is a partial region of the second main light-shielding part 823a', a portion positioned at the upper side of the lamination direction of the inner peripheral portion OVL21' of the second overlay pattern OVL2' out of the unexposed region 60c' is at least exposed upon exposure using the third sub mask 80d (see FIG. 13L). Therefore, even if the resist pattern 62' is formed, the inner peripheral portion OVL21' of the second overlay pattern OVL2' can be detected from the upper side of the lamination direction, and the overlay measurement can be conducted (see FIG. 16D).

Needless to say, in the fourth embodiment, when the main mask 80a and the third sub mask 80d are overlapped, the opening part 84d of the third sub mask 80d may be configured so as to cover the entire second main light-shielding part 823a' of the main mask 80a.

Figure 13M:
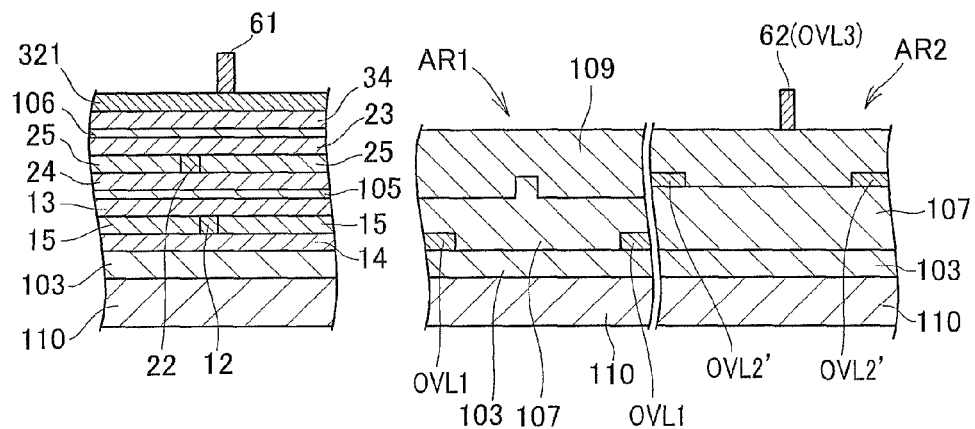

Because the positive type photoresist film 60 is exposed twice via the main mask 80a and the third sub mask 80d having the configurations above, respectively, the unexposed regions 60a and 60b' due to the element light-shielding part 821a of the main mask 80a and the third main light-shielding part 824a will not be exposed, but the unexposed regions 60b, 60c and 60c' due to the first main light-shielding part 822a and the second main light-shielding parts 823a and 823a' are exposed. After that, the resist pattern 61 corresponding to the MR part 32 of the third MR element 31 and the resist pattern 62 as the third overlay pattern OVL3 are formed by a development treatment using a predetermined developing solution and the like, as shown in FIG. 13M.

In this stage (a stage to form the resist patterns 61 and 62), within the second region AR2, the overlay measurement is conducted using the second overlay pattern OVL2' and the third overlay pattern OVL3 (the resist pattern 62).

Due to the overlay measurement above, when a positional accuracy in a direction orthogonal to the lamination direction between the second overlay pattern OVL2' and the third overlay pattern OVL3 is within a position tolerance, processing with a milling treatment to the third MR element layer 321 is conducted using the resist pattern 61 as a mask, and the MR part 32 is formed. After that, the reproducing head part 101A where the first MR element 11, the second MR element 21 and the third MR element 31 are arranged along the lamination direction can be manufactured by forming the side shield layer 35 and the upper part shield layer 33.

Furthermore, in the fourth embodiment above, when the positive type photoresist film 60 (the third photoresist film) is exposed using the third sub mask, the unexposed region 60c due to the first main light-shielding part 822a and the unexposed region 60b due to the second sub light-shielding part 823a within the first region are exposed via the opening 83c of the third sub mask 80d, but the present invention shall not limited to this mode. For example, the unexposed regions 60b and 60c above should not be exposed upon the exposure using the third sub mask. In other words, resist patterns corresponding to the unexposed regions 60b and 60c above may be formed.

As described above, in the manufacturing method for a reproducing head part relating to the fourth embodiment, since the first overlay pattern OVL1, the second overlay patterns OVL2 and OVL2' and the third overlay pattern OVL3 can be formed using one main mask, respectively, a positional accuracy based upon a manufacturing error among masks will not be decreased compared to the case of using three different masks in order to form the first to third overlay patterns OVL1 to OVL3, respectively. Consequently, according to the fourth embodiment, a thin film magnetic head having a reproducing head part that has high positional accuracy in a direction orthogonal to the lamination direction of the first MR element 11, the second MR element 21 and the third MR element 31 can be manufactured.

Also, each overlay pattern that is high in positional accuracy in the direction orthogonal to the lamination direction can be formed by manufacturing a pattern multilayer body using the mask set including the main mask 80a having the element light-shielding part 821a, the first main light-shielding part 822a, the second main light-shielding parts 823a and 823a' and the third main light-shielding part 824a; the first sub mask 80b having the predetermined opening parts 83b and 84b; the second sub mask 80c having the predetermined parts 83c and 84c; and the third sub mask 80d having the predetermined opening parts 83d and 84d.

The embodiments explained above are described in order to facilitate understanding of the present invention, but are not described in order to limit the present invention. Therefore, each element disclosed in the embodiments above is an intended meaning of all design modifications and equivalences belonging to the technical scope of the present invention, as well.

In the first to fourth embodiments above, the manufacturing methods for the thin film magnetic head 100 including the reproducing head part 101A (see FIG. 2B and FIG. 3B) where a plurality of MR elements are arranged by shifting in a direction orthogonal to the lamination direction (the track width direction) were explained as examples, but the present invention shall not be limited to such a mode. For example, the present invention may be a method for a thin film magnetic head part including a reproducing head part (see FIG. 2A and FIG. 3A) where a plurality of MR elements are aligned along the lamination direction. Also, the present invention is not limited to the manufacturing methods for a reproducing head part or a thin film magnetic head, but may be a manufacturing method for a pattern multilayer body including performing a plurality of patterning steps a plurality of times using a plurality of masks having the same light-shielding pattern, such as a semiconductor memory element including a plurality of pattern layers.

In the first to fourth embodiments above, viewed from the upper side of the lamination direction, the example where the inner peripheral configuration of the first overlay patterns OVL1 and OVL1' and the second overlay pattern OVL2' is nearly rectangular, and the configuration of the second overlay pattern OVL2 and the third overlay pattern OVL3 is nearly rectangular positioned deeper inside than their inner peripheral portions was explained, but the present invention shall not be limited to such a mode. For example, the inner peripheral configuration of the second overlay pattern OVL2 and the third overlay pattern OVL3 may be nearly rectangular, and the configuration of the first overlay patterns OVL1 and OVL1' and the second overlay pattern OVL2' may be nearly rectangular.

In the first to fourth embodiments above, on the occasion of forming the second MR element layer 221 and the third MR element layer 321, a protective film, such as a resist film, is formed within the OVL region. This is because it is necessary to laminate a clear layer so as to enable detection of the first overlay patterns OVL1 and OVL1' and the second overlay pattern OVL2' from the upper side of the lamination direction in the OVL region, but the second and third MR element layers 221 and 321 cannot permeate the detection light in the overlay measurement. However, the present invention shall not be limited to such mode, but for example, when a pattern layer, such as the second MR element layer 221, the third MR element layer 321 or the like, is a clear layer so as to enable the permeation of a detection light in the overlay measurement, on the occasion of forming the pattern layer, a protective film does not have to be formed within the OVL region, but a layer that is similar to the pattern layer can be formed even within the OVL region.

Also, in the present invention, at least two modes out of the second to fourth embodiments above can be combined. In other words, three or more regions are set within the overlay pattern formation region, an overlay pattern is formed in a plurality of layers along the lamination direction in each region, and a position gap in the direction orthogonal to the lamination direction (the track width direction) can be measured.

Figure 17:
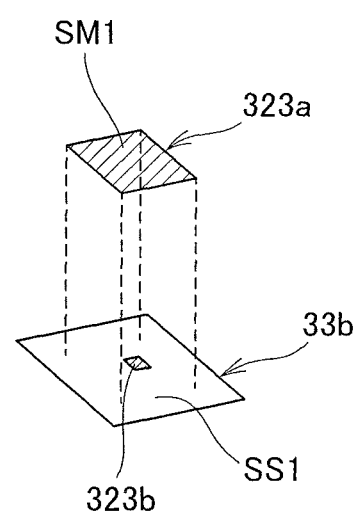
FIG. 17 is a perspective view showing another example of a relationship between a light-shielding part and an opening part of each mask in the mask set that is used in the manufacturing method for a reproducing head part relating to first embodiment of the present invention.
Figure 18A:
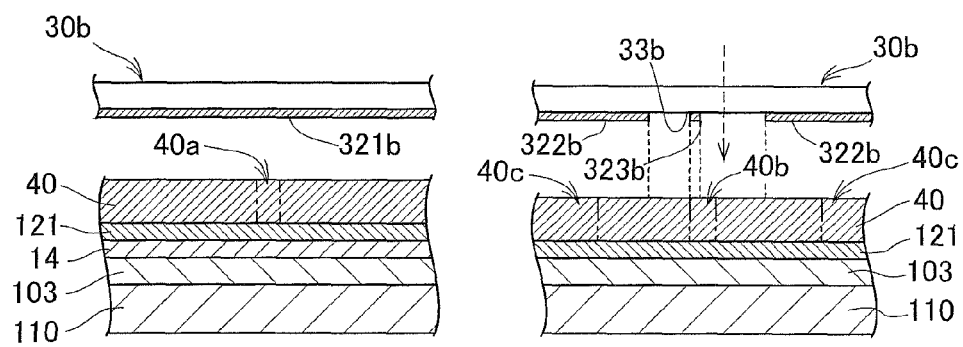
FIGS. 18A to 18G are cross-sectional views showing each step of the manufacturing method for a reproducing head part using the mask set shown in FIG. 17.
Figure 18B:
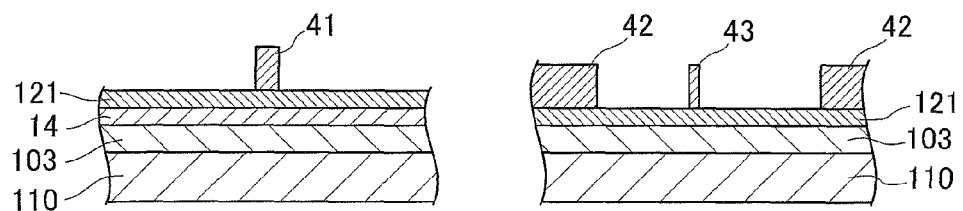
Figure 18C:
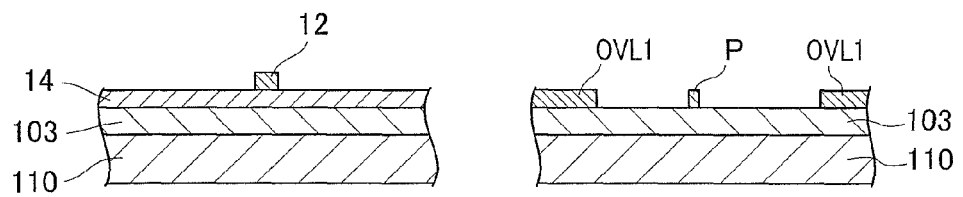
Figure 18D:
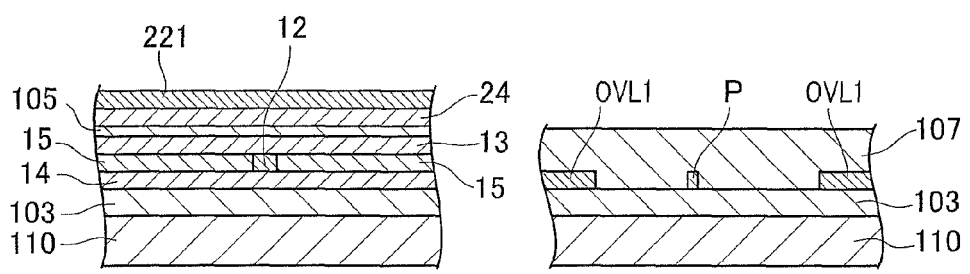
Figure 18E:
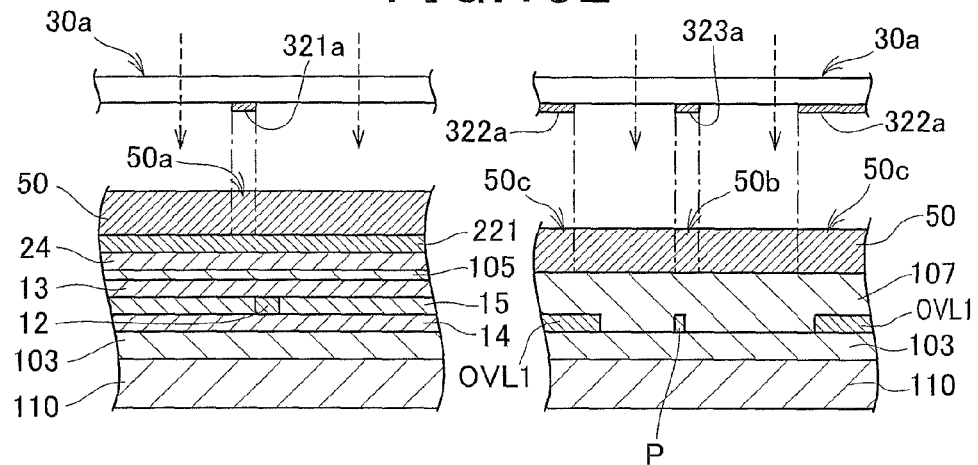
Figure 18F:
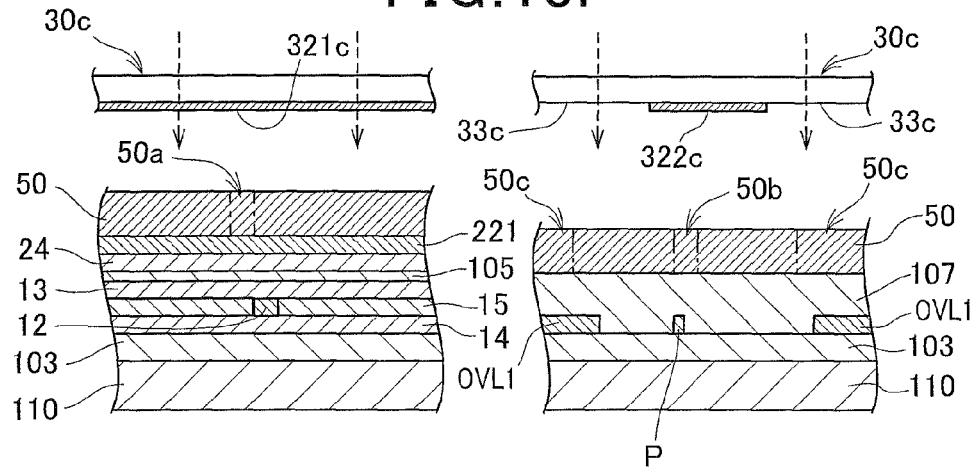
Figure 18G:
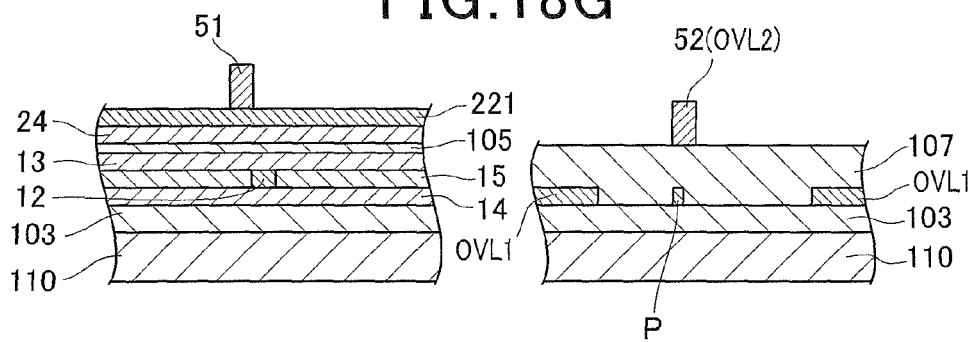
Figure 19A:
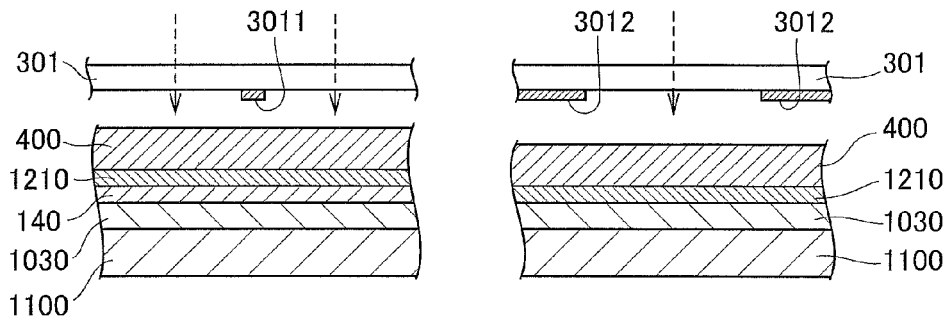
FIGS. 19A to 19C are cross-sectional views showing each step of a conventional manufacturing method for a reproducing head part.
Figure 19B:
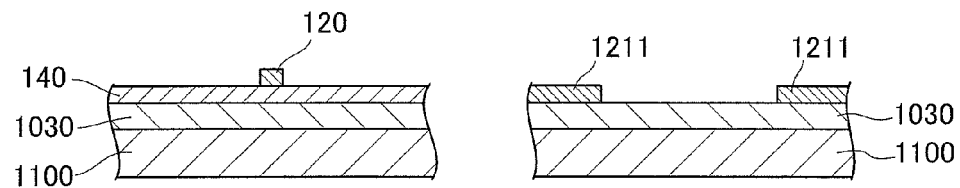
Figure 19C:
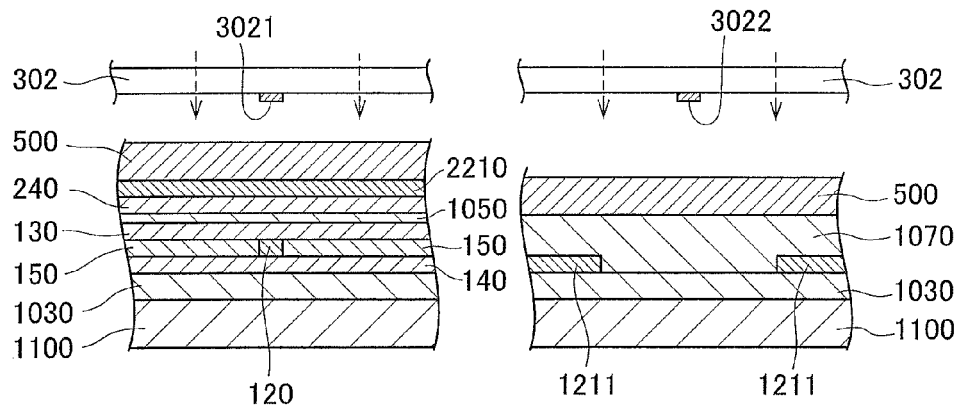

In addition, in the first embodiment above, the first sub mask 30b has the opening part 33b where an exposure light reaching to the unexposed region 40b of the positive type photoresist film 40 (the unexposed region 40b of the positive type photoresist film 40, which has been light-shielded by the second main light-shielding part 323a, so has not been exposed), is permeable, and the entire unexposed region 40b is exposed upon the exposure via the first sub mask 30b (see FIG. 4C), but the present invention shall not be limited to such mode. For example, a mode where a portion of an exposure light reaching to the unexposed region 40b above is light-shielded upon the exposure via the first sub mask 30b is also acceptable. In other words, as shown in FIG. 17, the first sub mask 30b may have the light-shielding part 323b within the opening area SS1 regulated with an external form of its opening part 33b. At this time, because an exposure light reaching to a partial region of the unexposed region 40b is shielded corresponding to the light-shielding part 323b (see FIG. 18A), a resist pattern 43 is formed within a partial region of the unexposed region 40b (a region where an exposure light is shielded by the light-shielding part 323b, so has not been exposed) (see FIG. 18B). Then, when processing with a milling treatment is conducted to the first MR element layer 121 using this resist pattern as a mask, a pattern P corresponding to the resist pattern 43 is formed deeper inside than the inner peripheral portion of the first overlay pattern OVL1 (see FIG. 18C). After that, the second overlay pattern OVL2 (the resist pattern 52) is formed (see FIGS. 18D to 18G), and when the overlay measurement is conducted using the first and second overlay patterns OVL1 and OVL2, it is necessary for the pattern P to be completely hidden due to the second overlay pattern OVL2 viewed from the upper side of the lamination direction (see FIG. 18G). Therefore, according to a relationship between a position of the main mask 30a upon exposure of the positive type photoresist film 50 via the main mask 30a (see FIG. 18E) and a position of the first sub mask 30b upon the exposure of the positive type photoresist film 40 via the first sub mask 30b (see FIG. 18A), when both (the main mask 30a and the first sub mask 30b) are overlapped, it is necessary for the light-shielding part 323b to be completely covered with the light-shielding area SM1 regulated with an external form of the second main light-shielding part 323a (see FIG. 17).

Furthermore, according to the similar point even in the second to fourth embodiments above, a pattern (a pattern that is completely hidden due to the second overlay pattern OVL2 and the third overlay pattern OVL3 when viewed from the upper side of the lamination direction) may be formed deeper inside than the inner peripheral portions of the overlay patterns OVL1 and OVL1' and the second overlay pattern OVL2'.

As in the first to fourth embodiments above, the manufacturing methods for a composite thin film magnetic head having the reproducing head part 101A and the recording head part 101B laminated onto it were explained as examples, but the present invention shall not be limited to such mode. For example, the composite type thin film magnetic head that is manufactured by the present invention may be the one having the recording head part 101B and the reproducing head part 101A laminated onto it; in other words, the lamination order may be opposite. Also, the first to fourth embodiments above are applicable to the manufacturing method for reproducing exclusive thin film head not including a recording head part 101B but including only the reproducing head part 101A.

The invention claimed is:

1. A method for manufacturing a pattern multilayer body where first to $N^{th}$ pattern layers (N is an integer of two or greater) are laminated within a pattern formation region on a substrate in respective order, and where a pattern is formed in the pattern layers, respectively, comprising:
   a step of forming a pattern in the first to $N^{th}$ pattern layers (N is an integer of two or greater) on the substrate, respectively, and of forming first to $N^{th}$ overlay patterns that are used for measuring a position gap in a direction orthogonal to a lamination direction between/among patterns of each pattern layer, within the overlay pattern formation region on the substrate;
   a step of forming a pattern in an $M^{th}$ pattern layer (M is an integer between 1 and N), and of forming an $M^{th}$ overlay pattern within the overlay pattern formation region comprising:
      a resist film formation step of forming an $M^{th}$ photoresist film on the $M^{th}$ pattern layer and within the overlay pattern formation region,
      a first exposure step of exposing the $M^{th}$ photoresist film via a main mask,
      a second exposure step of exposing the exposed $M^{th}$ photoresist film via an $M^{th}$ sub mask, and
      a resist pattern formation step of developing the $M^{th}$ photoresist film, and of forming an $M^{th}$ resist pattern on the $M^{th}$ pattern layer and within the overlay pattern formation region, respectively, wherein
   the main mask comprises:
      a pattern light-shielding part that is commonly used for forming a pattern in the first to $N^{th}$ pattern layers, respectively, and
      first to $N^{th}$ main light-shielding parts for forming the first to $N^{th}$ overlay patterns, respectively; and
   the $M^{th}$ sub mask comprises:
      a light-shielding part to shield an exposure light reaching to an unexposed region(s) on the $M^{th}$ photoresist film, which has been light-shielded by the pattern light-shielding part,
      an opening part where an exposure light reaching to an unexposed region(s) on the $M^{th}$ photoresist film within the overlay pattern formation region other than the unexposed region(s) on the $M^{th}$ photoresist film, which has been light-shielded by the $M^{th}$ main light-shielding part out of the first to $N^{th}$ main light-shielding parts, is permeable and
      a sub light-shielding part that light-shields an exposure light reaching to an unexposed region(s) on the $M^{th}$ photoresist film, which has been light-shielded by the $M^{th}$ main light-shielding part.

2. The manufacturing method for a pattern multilayer body according to claim 1, further comprising:
   forming the first overlay pattern by processing a layer under the first photoresist film within the overlay pattern formation region using the first resist pattern, which is formed in the resist pattern formation step, as a mask; and
   measuring a position gap between the patterns in a direction orthogonal to the lamination direction between the second to $N^{th}$ resist pattern and the first overlay pattern, respectively, using the second to $N^{th}$ resist patterns as the second to the $N^{th}$ overlay patterns, respectively.

3. The manufacturing method for a pattern multilayer body according to claim 1, wherein
   measuring a position gap in a direction orthogonal to the lamination direction between a $K^{th}$ overlay pattern (K is an integer between 1 and N−1) and a $(K+1)^{th}$ overlay pattern.

4. The manufacturing method for a pattern multilayer body according to claim 1, wherein
   the pattern multilayer body comprises the first pattern layer and the second pattern layer;
   a step of forming a pattern in the first pattern layer, and of forming the first overlay pattern within the overlay pattern formation region comprises:
      a resist film formation step of forming the first photoresist film on the first pattern layer and within the overlay pattern formation region,
      a first exposure step of exposing the first photoresist film via the main mask,
      a second exposure step of exposing the exposed first photoresist film via the first sub mask, and
      a resist pattern formation step of developing the first photoresist film, and of forming the first resist pattern on the first pattern layer and within the overlay pattern formation region;
   a step of forming a pattern in the second pattern layer, and of forming the second overlay pattern within the overlay pattern formation region comprises:
      a resist film formation step of forming the second photoresist film on the second pattern layer and within the overlay pattern formation region,
      a first exposure step of exposing the second photoresist film via the main mask,
      a second exposure step of exposing the exposed second photoresist film via the second sub mask, and
      a resist pattern formation step of developing the second photoresist film, and of forming the second resist pattern on the second pattern layer and within the overlay pattern formation region, respectively;
   the main mask comprises:
      the pattern light-shielding part that is commonly used for forming a pattern in the first pattern layer and the second pattern layer, respectively, and
      the first and second main light-shielding parts for forming the first and second overlay patterns, respectively;
   the first sub mask comprises:
      a light-shielding part that shields an exposure light reaching to an unexposed region(s) on the first photoresist film, which has been light-shielded by the pattern light-shielding part,
      an opening part where an exposure light reaching to an unexposed region(s) on the first photoresist film, which has been light-shielded by the second main light-shielding part, is permeable, and
      a sub light-shielding part that shields an exposure light reaching to an unexposed region(s) on the first photoresist film, which has been light-shielded by the first main light-shielding part; and
   the second sub mask comprises:
      a light-shielding part that shields an exposure light reaching to an unexposed region(s) on the second photoresist film, which has been light-shielded by the pattern light-shielding part, an opening part where an exposure light reaching to an unexposed region(s) on the second photoresist film, which has been light-shielded by the first main light-shielding part, is permeable, and a sub light-shielding part that shields an exposure light reaching to an unexposed region(s) on the second photoresist film, which has been light-shielded by the second main light-shielding part.

5. The manufacturing method for a pattern multilayer body according to claim 1, wherein
the pattern multilayer body comprises the first to third pattern layers;
a step of forming a pattern in the first pattern layer, and of forming the first overlay pattern within the overlay pattern formation region comprises:
a resist formation step of forming the first photoresist film on the first pattern layer and within the overlay pattern formation region,
a first exposure step of exposing the first photoresist film via the main mask,
a second exposure step of exposing the exposed first photoresist film via the first sub mask, and
a resist pattern formation step of developing the first photoresist film, and of forming the first resist pattern on the first pattern layer and within the overlay pattern formation region, respectively;
a step of forming a pattern in the second pattern layer, and of forming the second overlay pattern within the overlay pattern formation region comprises:
a resist film formation step of forming the second photoresist film on the second pattern layer and within the overlay pattern formation region,
a first exposure step of exposing the second photoresist film via the main mask,
a second exposure step of exposing the exposed second photoresist film via the second sub mask, and
a resist pattern formation step of developing the second photoresist film, and of forming the second resist pattern on the second pattern layer and within the overlay pattern formation region;
a step of forming a pattern in the third pattern layer, and of forming the third overlay pattern within the overlay pattern formation region comprises:
a resist film formation step of forming the third photoresist film on the third pattern layer and within the overlay pattern formation region,
a first exposure step of exposing the third photoresist film via the main mask,
a second exposure step of exposing the exposed third photoresist film via the third sub mask, and
a resist pattern formation step of developing the third photoresist film, and of forming the third resist pattern on the third pattern layer and within the overlay pattern formation region;
the main mask comprises:
the pattern light-shielding part that is commonly used for forming a pattern in the first to third pattern layers, respectively,
the first main light-shielding part for forming the first overlay pattern,
the second main light-shielding part for forming the second overlay pattern,
the third main light-shielding part for forming the third overlay pattern;
the first sub mask comprises:
a light-shielding part that shields an exposure light reaching to an unexposed region(s) on the first photoresist film, which has been light-shielded by the pattern light-shielding part,
an opening part where an exposure light reaching to an unexposed region(s) on the first photoresist film, which has been light-shielded by the second and third main light-shielding parts, is permeable, and
a sub light-shielding part that shields an exposure light reaching to an unexposed region(s) on the first photoresist film, which has been light-shielded by the first main light-shielding part;
the second sub mask comprises:
a light-shielding part that shields an exposure light reaching to an unexposed region(s) on the second photoresist film, which has been light-shielded by the pattern light-shielding part,
an opening part where an exposure light reaching to an unexposed region(s) on the second photoresist film, which has been light-shielded by the first main light-shielding part, is permeable, and
a sub light-shielding part that shields an exposure light reaching to an unexposed region(s) on the second photoresist film, which has been light-shielded by the second main light-shielding part;
the third sub mask comprises:
a light-shielding part that shields an exposure light reaching to an unexposed region(s) on the third photoresist film, which has been light-shielded by the pattern light-shielding part,
an opening part where an exposure light reaching to an unexposed region(s) on the third photoresist film, which has been light-shielded by the first main light-shielding part, is permeable, and
a sub light-shielding part that shields an exposure light reaching to an unexposed region(s) on the third photoresist film, which has been light-shielded by the third main light-shielding part; and
the second main light-shielding part and the third main light-shielding part of the main mask are the same light-shielding part.

6. The manufacturing method for a pattern multilayer body according to claim 5, wherein
in the second exposure step, in the step of forming a pattern in the third pattern layer, and of forming the third overlay pattern within the overlay pattern formation region, the second sub mask is used as the third sub mask.

7. The manufacturing method for a pattern multilayer body according to claim 1, wherein
the pattern multilayer body comprises the first to third pattern layers;
the overlay pattern formation region includes a first region and a second region;
a step of forming a pattern in the first pattern layer, and of forming the first overlay pattern within the overlay pattern formation region comprises:
a resist film formation step of forming the first photoresist film on the first pattern layer and within the first and second regions, respectively,
a first exposure step of exposing the first photoresist film via the main mask,
a second exposure step of exposing the exposed first photoresist film via the first sub mask, and
a resist pattern formation step of developing the first photoresist film, and of forming the first resist pattern on the first pattern layer and within the first and second regions, respectively;

a step of forming a pattern in the second pattern layer, and of forming the second overlay pattern within the overlay pattern formation region comprises:
  a resist film formation step of forming the second photoresist film on the second pattern layer and within the first and second regions, respectively,
  a first exposure step of exposing the second photoresist film via the main mask,
  a second exposure step of exposing the exposed second photoresist film via the second sub mask, and
  a resist pattern formation step of developing the second photoresist film, and of forming the second resist pattern on the second pattern layer and within the first region, respectively;

a step of forming a pattern in the third pattern layer, and of forming the third overlay pattern within the overlay pattern formation region comprises:
  a resist film formation step of forming the third photoresist film on the third pattern layer and the first and second regions,
  a first exposure step of exposing the third photoresist film via the main mask,
  a second exposure step of exposing the third photoresist film via the third sub mask, and
  a resist pattern formation step of developing the third photoresist film, and of forming the third resist pattern on the third pattern layer and within the second region;

the main mask comprises:
  the pattern light-shielding part that is commonly used for forming a pattern in the first to third pattern layers, respectively,
  the first main light-shielding part for forming the first overlay pattern within the first and second regions,
  the second main light-shielding part for forming the second overlay pattern within the first region; and
  the third main light-shielding part for forming the third overlay pattern within the second region;

the first sub mask comprises:
  a light-shielding part that shields an exposure light reaching to an unexposed region(s) on the first photoresist film, which has been light-shielded by the pattern light-shielding part,
  an opening part where an exposure light reaching to an unexposed region(s) on the first photoresist film, which has been light-shielded by the second and third main light-shielding parts, is permeable, and
  a sub light-shielding part that shields an exposure light reaching to an unexposed region(s) on the first photoresist film, which has been light-shielded by the first main light-shielding part;

the second sub mask comprises:
  a light-shielding part that shields an exposure light reaching to an unexposed region(s) on the second photoresist film, which has been light-shielded by the pattern light-shielding part,
  an opening part where an exposure light reaching to an unexposed region(s) on the second photoresist film, which has been light-shielded by the first main light-shielding part, is permeable, and
  a sub light-shielding part that shields an exposure light reaching to an unexposed region(s) on the second photoresist film, which has been light-shielded by the second main light-shielding part; and the third sub mask comprises:
  a light-shielding part that shields an exposure light reaching to an unexposed region(s) on the third photoresist film, which has been light-shielded by the pattern light-shielding part,
  an opening part where an exposure light reaching to an unexposed region(s) on the third photoresist film, which has been light-shielded by the first main light-shielding part, is permeable, and
  a sub light-shielding part that shields an exposure light reaching to an unexposed region(s) on the third photoresist film, which has been light-shielded by the third main light-shielding part.

8. The manufacturing method for a pattern multilayer body according to claim 1, wherein
the pattern multilayer body comprises the first to third pattern layers;
the overlay pattern formation region includes a first region and a second region;

a step of forming a pattern in the first pattern layer, and of forming the first overlay pattern within the overlay pattern formation region comprises:
  a resist film formation step of forming the first photoresist film on the first pattern layer and within the first and second regions,
  a first exposure step of exposing the first photoresist film via the main mask,
  a second exposure step of exposing the exposed first photoresist film via the first sub mask, and
  a resist pattern formation step of developing the first photoresist film, and of forming the first resist pattern on the first pattern layer and within the first region, respectively, a step of forming a pattern in the second pattern layer, and of froming the second overlay pattern within the overlay pattern formation region comprises:
  a resist film formation step of forming the second photoresist film on the second pattern layer and within the first and second regions,
  a first exposure step of exposing the second photoresist film via the main mask,
  a second exposure step of exposing the exposed second photoresist film via the second sub mask, and
  a resist pattern formation step of developing the second photoresist film, and of forming the second resist pattern on the second pattern layer and within the first and second regions, respectively;

a step of forming a pattern in the third pattern layer, and of forming the third overlay pattern within the overlay pattern formation region comprises:
  a resist film formation step of forming the third photoresist film on the third pattern layer and within the first and second regions,
  a first exposure step of exposing the third photoresist film via the main mask,
  a second exposure step of exposing the exposed third photoresist film via the third sub mask, and
  a resist pattern formation step of developing the third photoresist film, and of forming the third resist pattern on the third pattern layer and within the second region;

the main mask comprises:
  the pattern light-shielding part that is commonly used for forming a pattern in the first to third pattern layers, respectively,
  the first main light-shielding part for forming the first overlay pattern within the first region,
  the second main light-shielding part for forming the second overlay pattern within the first and second regions, and the third main light-shielding part for forming the third overlay pattern within the second region;

the first sub mask comprises:
- a light-shielding part that shields an exposure light reaching to an unexposed region(s) on the first photoresist film, which has been light-shielded by the pattern light-shielding part,
- an opening part where an exposure light reaching to an unexposed region(s) on the first photoresist film, which has been light-shielded by the second and third main light-shielding parts, is permeable, and
- a sub light-shielding part that shields an exposure light reaching to an unexposed region(s) on the first photoresist film, which has been light-shielded by the first main light-shielding part;

the second sub mask comprises:
- a light-shielding part that shields an exposure light reaching to an unexposed region(s) on the second photoresist film, which has been light-shielded by the pattern light-shielding part,
- an opening part where an exposure light reaching to an unexposed region(s) on the second photoresist film, which has been light-shielded by the first and third main light-shielding parts, is permeable, and
- a sub light-shielding part that shields an exposure light reaching to an unexposed region(s) on the second photoresist film, which has been light-shielded by the second main light-shielding part; and the third sub mask comprises:
- a light-shielding part that shields an exposure light reaching to an unexposed region(s) on the third photoresist film, which has been light-shielded by the pattern light-shielding part,
- an opening part where an exposure light reaching to an unexposed region(s) on the third photoresist film, which has been light-shielded by the second main light-shielding part, is permeable, and
- a sub light-shielding part that shields an exposure light reaching to an unexposed region(s) on the third photoresist film, which has been light-shielded by the third main light-shielding part.

9. The method for a pattern multilayer body according to claim 1, wherein
the pattern multilayer body is a thin film magnetic head where first to $N^{th}$ magnetoresistive effect elements (MR elements) are formed in the first to $N^{th}$ pattern layers, respectively, and each of the MR elements is arranged along a lamination direction.

10. A mask set where first to $N^{th}$ patterns (N is an integer of two or greater) are laminated in respective order, and that is used for manufacturing a pattern multilayer body having a pattern in each of pattern layers, comprising:
- a main mask that comprises a pattern light-shielding part that is commonly used for forming the pattern in each of the pattern layers, and first to $N^{th}$ main light-shielding parts that are used for forming first to $N^{th}$ overlay patterns for position gap measurement in a direction orthogonal to the lamination direction between/among patterns of the pattern layers, and
- first to $N^{th}$ sub masks, wherein an $M^{th}$ sub mask (M is an integer between 1 and N) out of the first to $N^{th}$ sub masks comprises:
- a light-shielding part corresponding to the pattern light-shielding part of the main mask,
- an opening part corresponding to a light-shielding part other than the $M^{th}$ main light-shielding part of the main mask, and
- an $M^{th}$ sub light-shielding part corresponding to the $M^{th}$ main light-shielding part.

* * * * *